(12) United States Patent
Tobita

(10) Patent No.: US 8,040,999 B2
(45) Date of Patent: Oct. 18, 2011

(54) SHIFT REGISTER CIRCUIT

(75) Inventor: Youichi Tobita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/606,551

(22) Filed: Oct. 27, 2009

(65) Prior Publication Data

US 2010/0111245 A1 May 6, 2010

(30) Foreign Application Priority Data

Oct. 31, 2008 (JP) ................................ 2008-280837
Oct. 7, 2009 (JP) ................................ 2009-233035

(51) Int. Cl.
*G11C 19/00* (2006.01)

(52) U.S. Cl. ................ 377/64; 377/68; 377/78; 377/79

(58) Field of Classification Search ................ None
See application file for complete search history.

(56) References Cited

U.S. PATENT DOCUMENTS

| | | | |
|---|---|---|---|
| 3,480,796 A | 11/1969 | Polkinghorn et al. | |
| 3,506,851 A | 4/1970 | Polkinghorn et al. | |
| 3,564,290 A | 2/1971 | Sonoda | |
| 3,710,271 A | 1/1973 | Putnam | |
| 3,774,055 A | 11/1973 | Bapat | |
| 3,898,479 A | 8/1975 | Proebsting | |
| 3,937,983 A | 2/1976 | Reed | |
| 4,061,933 A | 12/1977 | Schroeder et al. | |
| 4,122,361 A | 10/1978 | Clemen et al. | |
| 4,239,990 A | 12/1980 | Hong et al. | |
| 4,239,991 A | 12/1980 | Hong et al. | |
| 4,276,487 A | 6/1981 | Arzubi et al. | |
| 4,379,974 A | 4/1983 | Plachno | |
| 4,443,714 A | 4/1984 | Nakano et al. | |
| 4,447,745 A | 5/1984 | Takemae et al. | |
| 4,633,105 A | 12/1986 | Tsujimoto | |
| 5,859,630 A * | 1/1999 | Huq | 345/100 |
| 6,064,713 A * | 5/2000 | Lebrun et al. | 377/67 |
| 7,116,748 B2 | 10/2006 | Nagao et al. | |
| 7,372,300 B2 * | 5/2008 | Tobita | |

(Continued)

FOREIGN PATENT DOCUMENTS

JP    2004-78172    3/2004

(Continued)

OTHER PUBLICATIONS

U.S. Appl. No. 12/647,108, filed Dec. 24, 2009, Tobita.

(Continued)

*Primary Examiner* — Tuan T Lam
(74) *Attorney, Agent, or Firm* — Oblon, Spivak, McClelland, Maier & Neustadt, L.L.P.

(57) ABSTRACT

A shift register circuit is provided that can suppress a decrease in a drive capability when a frequency of a clock signal increases. A unit shift register includes a first transistor for supplying a clock signal to an output terminal, a pull-up driving circuit for driving the first transistor, a second transistor for discharging the output terminal, and a pull-down driving circuit for driving the second transistor. In the pull-up driving circuit, the gate of a third transistor charging the gate of the first transistor is charged in accordance with activation of an output signal of preceding stage, and the potential at the gate of the third transistor is increased with a capacitive element. As a result, the third transistor operates in the non-saturated region.

6 Claims, 24 Drawing Sheets

U.S. PATENT DOCUMENTS

| | | | |
|---|---|---|---|
| 7,436,923 B2 * | 10/2008 | Tobita | |
| 7,443,944 B2 * | 10/2008 | Tobita et al. | |
| 7,492,853 B2 * | 2/2009 | Tobita | |
| 7,627,076 B2 * | 12/2009 | Tobita | |
| 7,672,419 B2 * | 3/2010 | Chen | 377/64 |
| 2003/0231735 A1 | 12/2003 | Moon et al. | |
| 2007/0195053 A1 * | 8/2007 | Tobita et al. | |
| 2007/0195920 A1 * | 8/2007 | Tobita | 377/64 |
| 2008/0101529 A1 * | 5/2008 | Tobita | 377/64 |

FOREIGN PATENT DOCUMENTS

| | | |
|---|---|---|
| WO | WO 2006/013542 A2 | 2/2006 |
| WO | WO 2006/013542 A3 | 2/2006 |
| WO | WO 2006/100636 A2 | 9/2006 |
| WO | WO 2006/100636 A3 | 9/2006 |
| WO | WO 2006/100637 A2 | 9/2006 |
| WO | WO 2006/100637 A3 | 9/2006 |
| WO | WO 2007/013010 A2 | 2/2007 |
| WO | WO 2007/013010 A3 | 2/2007 |

OTHER PUBLICATIONS

U.S. Appl. No. 12/705,235, filed Feb. 12, 2010, Tobita.

U.S. Appl. No. 13/082,128, filed Apr. 7, 2011, Tobita.

* cited by examiner

F I G . 3
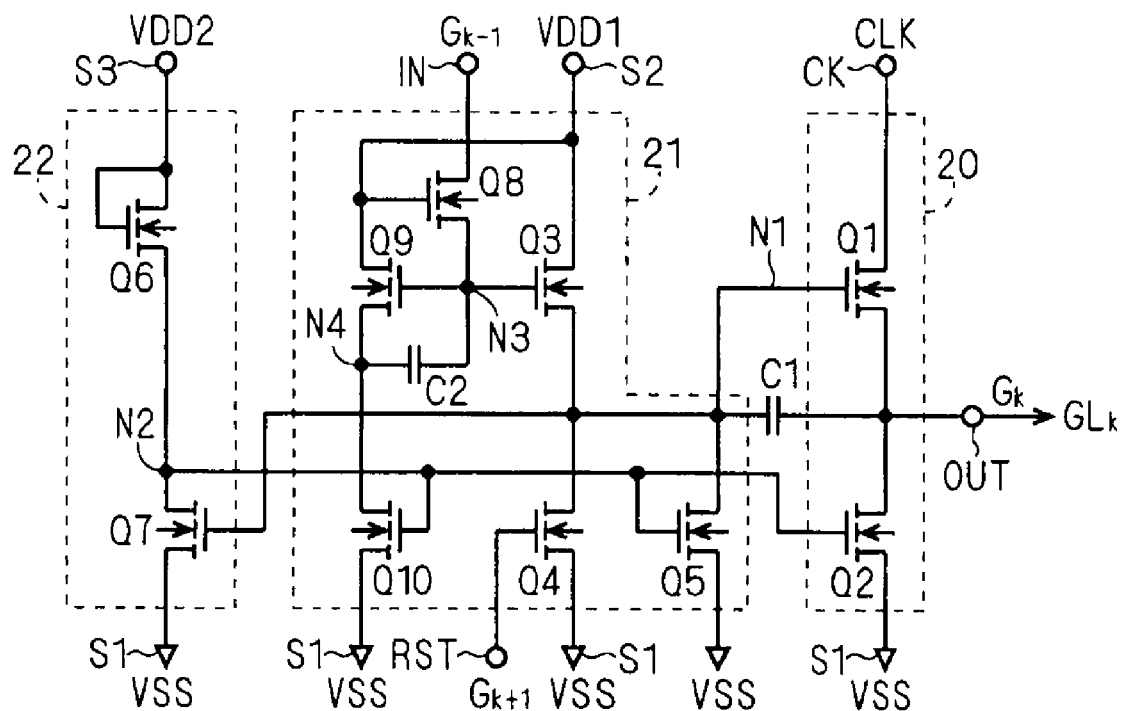

F I G . 2 0
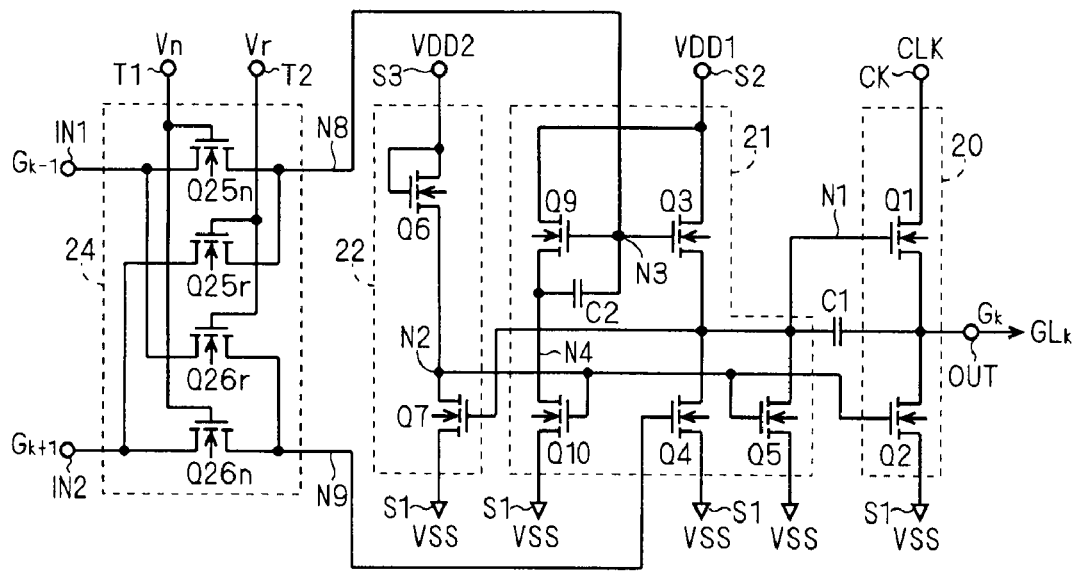
F I G . 2 1
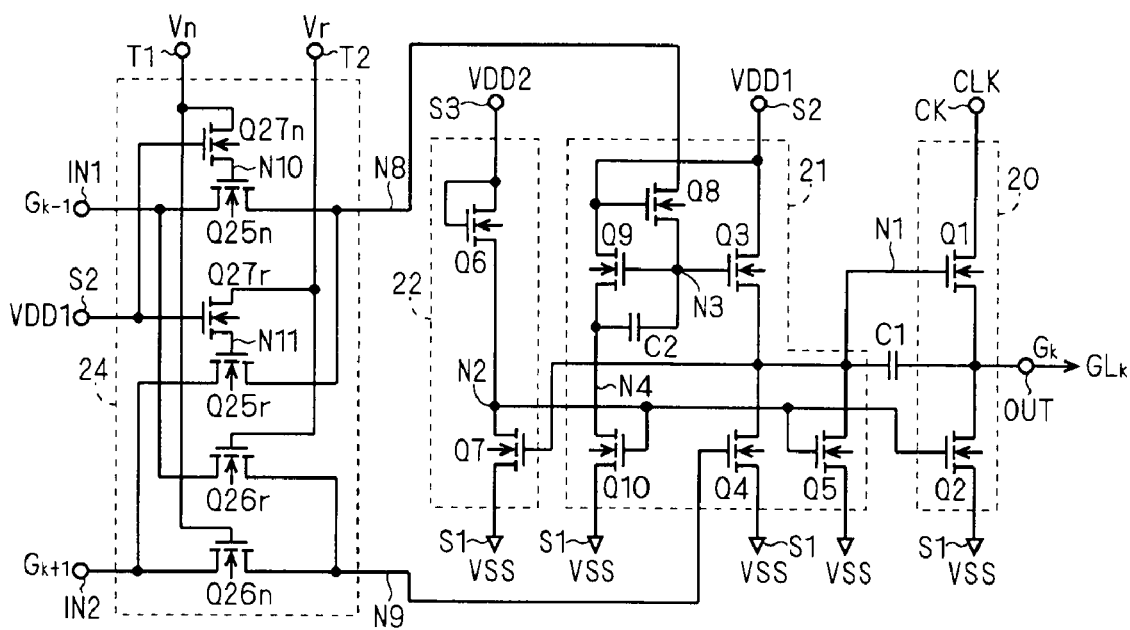

F I G . 2 2
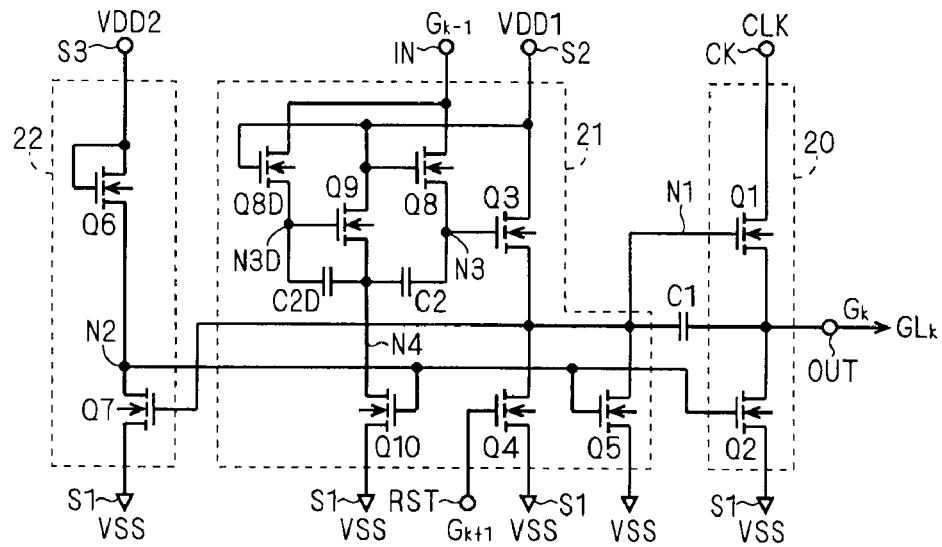
F I G . 2 3
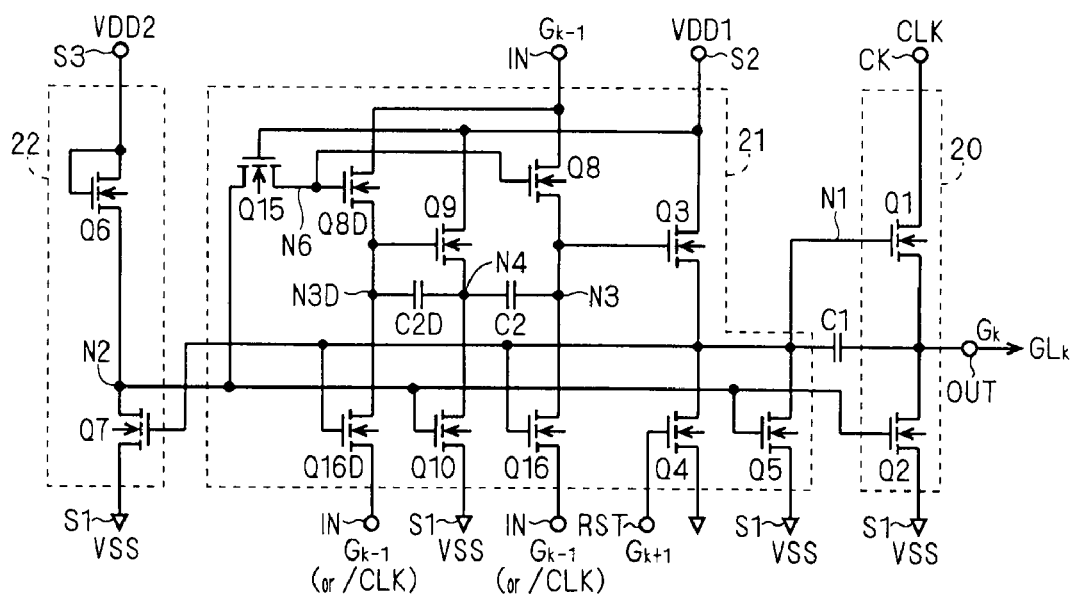

F I G . 2 8
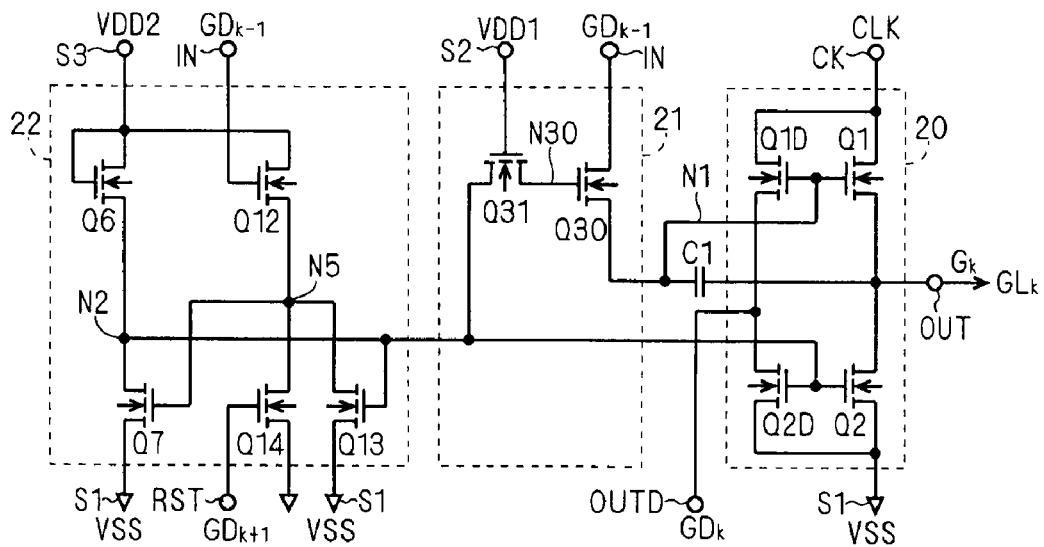
F I G . 2 9
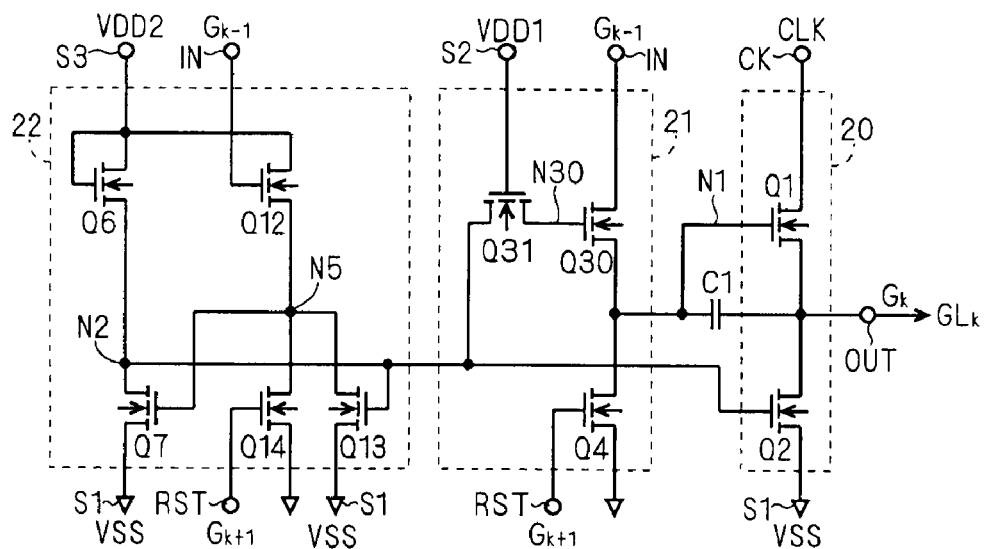

F I G . 3 2
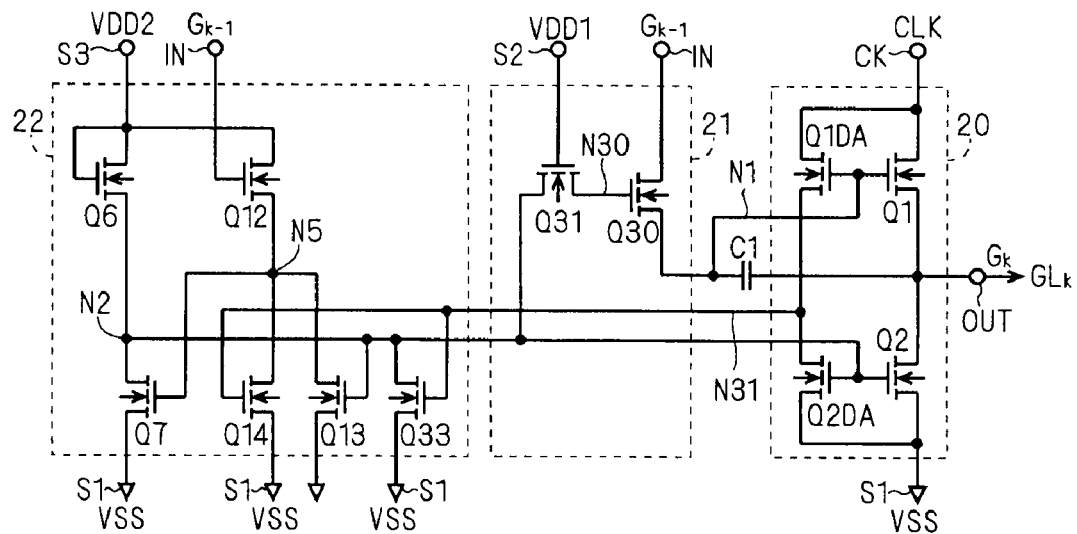
F I G . 3 3
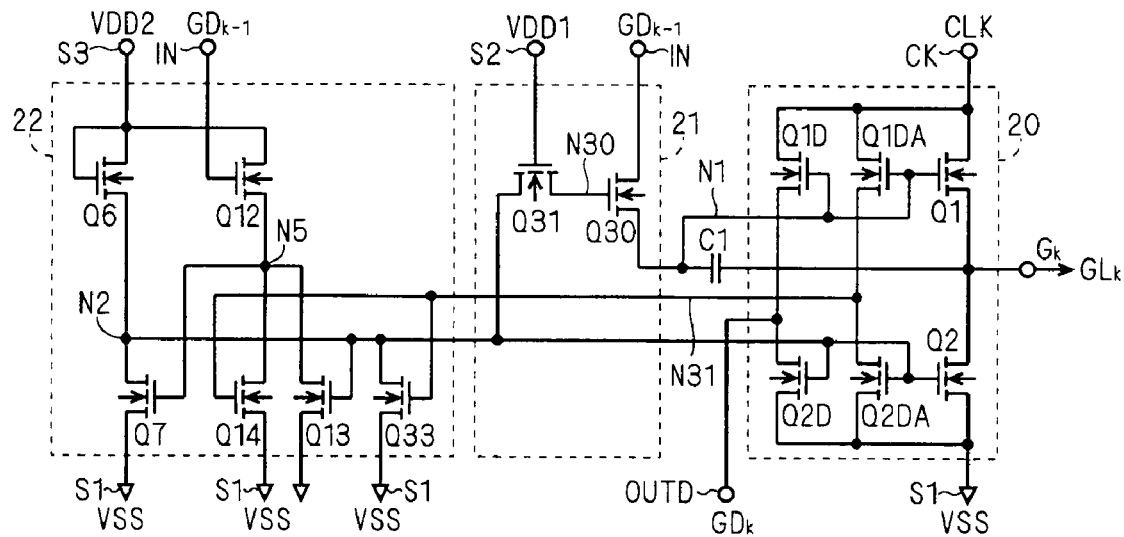

F I G . 3 4
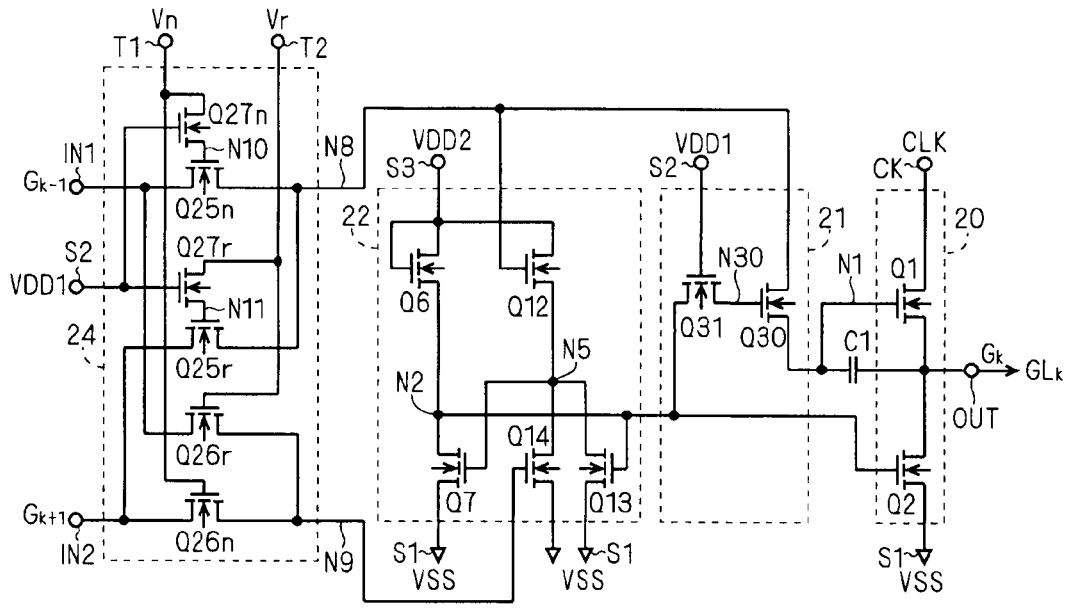
F I G . 3 5
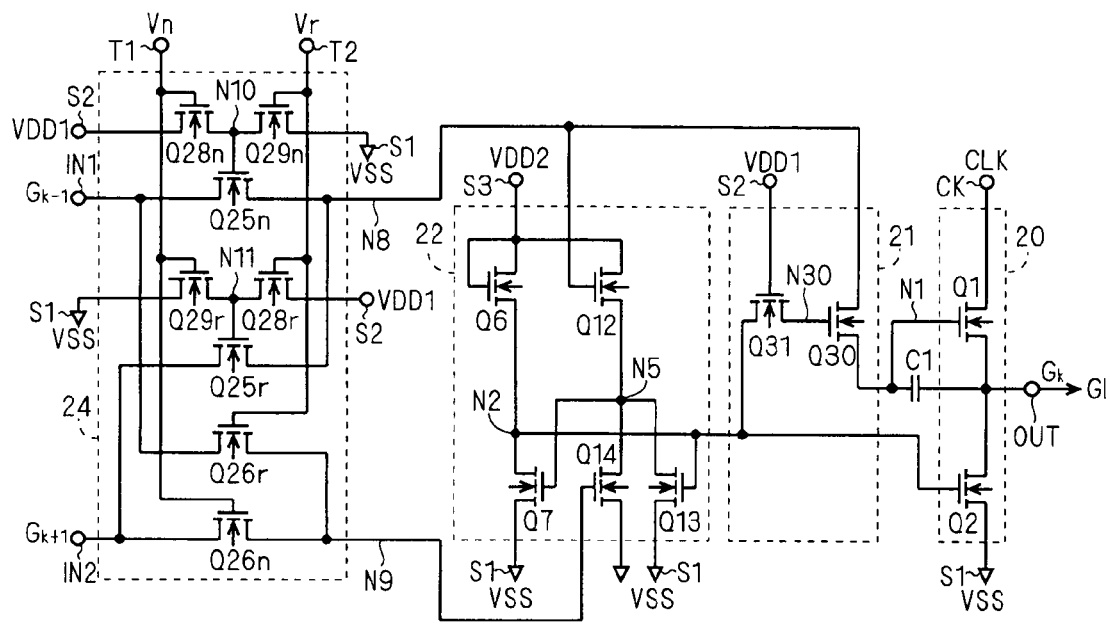

F I G . 4 0
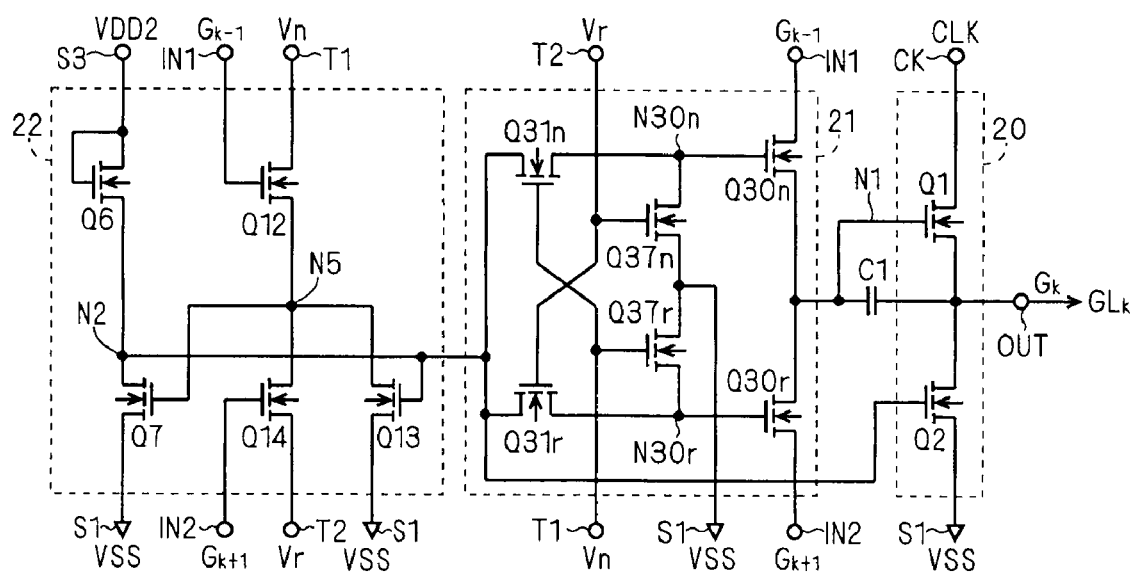

SHIFT REGISTER CIRCUIT

BACKGROUND OF THE INVENTION

1. Field of the Invention

The present invention relates to a scanning line driving circuit, and more particularly to a scanning line driving circuit for use as, e.g., an electro-optic apparatus such as an image display apparatus and an image sensor and constituted by only field-effect transistors of the same conductivity type.

2. Description of the Background Art

In an image display apparatus (hereinafter referred to as a "display apparatus") such as a liquid crystal display apparatus, a plurality of pixels are arranged in a matrix on a display panel, and a gate line (scanning line) is provided for each row of pixels (pixel line) of the display panel. In a cycle of one horizontal period of a display signal, the gate lines are sequentially selected and driven to update a display image. As a gate line driving circuit (scanning line driving circuit) for sequentially selecting and driving pixel lines, i.e., gate lines, a shift register may be used, which performs a round of shift operation in one frame period of a display signal.

In order to reduce the number of steps in the manufacturing process of a display apparatus, a shift register for use as a gate line driving circuit should preferably be constituted by only field-effect transistors of the same conductivity type. Therefore, various types of shift registers constituted by only N- or P-type field-effect transistors, and various display apparatuses containing such shift registers have been proposed (e.g., in Japanese Patent Application Laid-open No. 2004-78172).

A shift register for use as a gate line driving circuit is constituted by a plurality of cascade-connected shift register circuits, each of which is provided for each pixel line, i.e., each gate line. In this specification, for convenience of description, each of a plurality of shift register circuits forming a gate line driving circuit is referred to as a "unit shift register." In other words, an output terminal of each unit shift register constituting a gate line driving circuit is connected to an input terminal of a unit shift register of a subsequent stage or a later stage.

FIG. 7 of Japanese Patent Application Laid-open No. 2004-78172 illustrates a configuration of a conventional unit shift register. As shown in FIG. 7 thereof, the conventional unit shift register includes a first transistor (M1) connected between an output terminal (GOUT[N]) and a clock terminal (CKV) and a second transistor (M2) connected between the output terminal and a first power supply terminal (VOFF). The unit shift register outputs an output signal, when a clock signal input to the clock terminal is transmitted to the output terminal while the first transistor is on and the second transistor is off.

In particular, it is necessary for a gate line driving circuit to activate a gate line by charging it rapidly using the output signal, and accordingly, in each unit shift register constituting the gate line driving circuit, the first transistor is required to have a high drive capability (a capability to pass current). Therefore, while the first transistor is on, it is desirable to keep a voltage between the gate and the source at a high state.

A first node (N1), to which the gate of the first transistor is connected, is connected to a third transistor (M3) for charging the first node. In the conventional unit shift register, the third transistor is connected between the first node and a second power supply terminal (VON), and the gate of the third transistor is connected to an input terminal of the corresponding unit shift register (i.e., an output terminal (GOUT[N−1]) of a unit shift register of a preceding stage). In other words, the third transistor turns on when an output signal of the unit shift register of the preceding stage is activated, and charge is provided to the first node from a power supply connected to the second power supply terminal so as to charge the first node (pre-charge). Thereby, the first transistor turns on, and thereafter, when the clock signal attains a high (H) level, it is transmitted to the output terminal, and an output signal is output.

The shift register circuit of Japanese Patent Application Laid-open No. 2004-78172 is arranged with a capacitor element (C) between the first node and the output terminal, i.e., the source of the first transistor. Therefore, when the pre-charge of the first node causes the first transistor to turn on, and thereafter the output terminal attains the H level in accordance with the clock signal, the potential at the first node increases with the coupling via the capacitor element, so that the voltage between the gate and source of the first transistor is kept high. As a result, the first transistor has a high drive capability.

However, while the potential at the first node is being increased, the voltage between the gate and source of the first transistor does not increase compared with the state before the potential is increased, and it is merely kept about the same. In other words, the drive capability of the first transistor in the unit shift register is determined based on the voltage between the gate and source which is given during the pre-charge performed by the third transistor. Therefore, in order to increase the drive capability of the first transistor, it is necessary to charge the first node to a sufficiently high level during the pre-charge.

Where the H level of the clock signal and the potential at the second power supply terminal are VDD, and a threshold voltage of the third transistor is Vth, the potential at the first node can be theoretically increased to VDD−Vth by the pre-charge. However, when the frequency of the clock signal increases, and a pulse width of the input signal (the output signal of the unit shift register of the preceding stage) becomes narrow, it is difficult for the first node to attain the maximum pre-charge level (VDD−Vth). One of the reasons therefore is that the third transistor (M3) operates in a source-follower mode during the pre-charge of the first node. In other words, this is because, when the level of the first node increases, the voltage between the gate and source of the third transistor decreases, and therefore, the drive capability of the third transistor decreases in accordance with the progress of charging of the first node, so that the rising rate of the level greatly decreases.

In other words, in the conventional unit shift register, the gate of the first transistor (the first node) is pre-charged by the third transistor operating in the source-follower mode, and therefore, it takes a relatively long time to charge the first node to the maximum pre-charge level. Therefore, when the frequency of the clock signal increases, the first node cannot be sufficiently pre-charged, which brings about a decrease in the drive capability of the first transistor. In particular, the gate line driving circuit has a problem in that it is necessary to activate a gate line by charging it rapidly using the output signal of the unit shift register, thus requiring the first transistor to have a high drive capability. In other words, there is a problem in that it is difficult to cause the gate line driving circuit to operate faster by increasing the frequency of the clock signal, which hinders a display apparatus from achieving a high resolution.

SUMMARY OF THE INVENTION

It is the object of the present invention to provide a shift register circuit capable of suppressing a decrease in a drive capability when a frequency of a clock signal increases.

The shift register circuit according to the present invention includes an input terminal, an output terminal, a clock terminal, a first transistor, a second transistor, a pull-up driving circuit, and a pull-down driving circuit. The first transistor supplies to the output terminal a clock signal input to the clock terminal. The second transistor discharges the output terminal. The pull-up driving circuit drives the first transistor by charging and discharging a first node connected to a control electrode of the first transistor. The pull-down driving circuit drives the second transistor by charging and discharging a second node connected to a control electrode of the second transistor. The pull-up driving circuit includes a third transistor for charging the first node in accordance with activation of an input signal input to the input terminal and a boosting unit for boosting, in accordance with the activation of said input signal, a third node being connected to a control electrode of said third transistor so that a voltage of said third node becomes larger than an amplitude of said input signal.

The third transistor of which control electrode (the third node) is boosted operates to charge (pre-charge) the first node, so that the first node can be sufficiently pre-charged even when the frequency of the clock signal increases and a pulse width of a signal input to the input terminal becomes narrow. In other words, it is possible to prevent the decrease of the drive capability of the first transistor. Furthermore, the third transistor operates in the non-saturated region, so that a loss corresponding to the threshold voltage thereof does not occur, and the first node can be pre-charged to a higher level than ever before. Therefore, the drive capability of the first transistor improves.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a circuit diagram showing a unit shift register according to the first embodiment;

FIG. 20 is a circuit diagram showing a unit shift register according to the first modification of the fourth embodiment;

FIG. 21 is a circuit diagram showing a unit shift register according to the second modification of the fourth embodiment;

FIG. 22 is a circuit diagram showing a unit shift register according to the fifth embodiment;

FIG. 23 is a circuit diagram showing a unit shift register according to the modification of the fifth embodiment;

FIG. 28 is a circuit diagram showing a unit shift register according to the fifth modification of the sixth embodiment;

FIG. 29 is a circuit diagram showing a unit shift register according to the sixth modification of the sixth embodiment;

FIG. 32 is a circuit diagram showing a unit shift register according to the ninth modification of the sixth embodiment;

FIG. 33 is a circuit diagram showing a unit shift register according to the tenth modification of the sixth embodiment;

FIG. 34 is a circuit diagram showing a unit shift register according to the seventh embodiment;

FIG. 35 is a circuit diagram showing a unit shift register according to the first modification of the seventh embodiment;

FIG. 40 is a circuit diagram showing a unit shift register according to the modification of the eighth embodiment.

DESCRIPTION OF THE PREFERRED EMBODIMENTS

Figure 1:
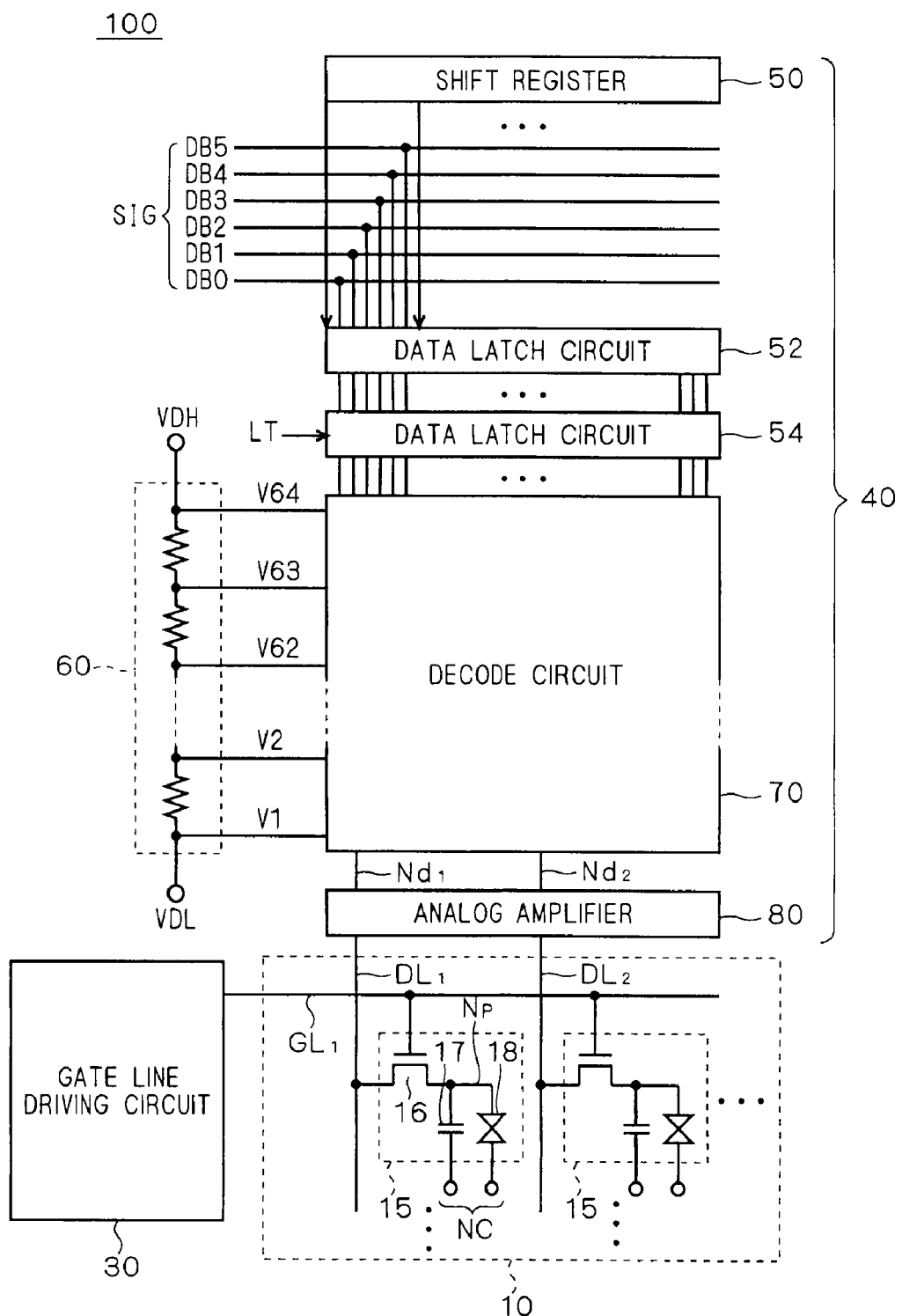
FIG. 1 is block diagram schematically showing a configuration of a liquid crystal display apparatus.

The embodiments of the present invention will be hereinafter described with reference to the drawings. To avoid repetition and redundancy of description, elements having the same or equivalent functions are designated by the same reference numerals or characters in the drawings.

Transistors used in the embodiments are insulated-gate field effect transistors. In the insulated-gate field effect transistor, an electric field in a gate insulator film controls an electrical conductivity between a drain region and a source region in a semiconductor layer. Polysilicon, amorphous silicon, organic semiconductor such as pentacene, monocrystal silicon and oxide semiconductor such as IGZO (In—Ga—Zn—O) can be used as materials of the semiconductor layer formed with the drain region and the source region.

As is well-known, a transistor is a device having at least three electrodes, i.e., a control electrode (in a more limited sense, a gate (electrode)), one current electrode (in a more limited sense, a drain (electrode) or a source (electrode)), and the other current electrode (in a more limited sense, a source (electrode) or a drain (electrode)). A transistor serves as a switching device in which a channel is formed between the drain and the source when a predetermined voltage is applied to the gate. The drain and the source of the transistor have basically the same structure, and their names are switched in accordance with the condition of the applied voltage. For example, in an N-type transistor, an electrode having a relatively high potential (hereinafter also referred to as "level") is called a drain, and an electrode having a relatively low potential is called a source (which are opposite in a P-type transistor).

Unless specifically stated, such transistors may be formed on a semiconductor substrate, and may be a thin-film transistor (TFT) formed on an insulating substrate such as glass. A monocrystal substrate and an insulating substrate such as SOI, glass, and resin may be used as a substrate to be formed with transistors.

A gate line driving circuit according to the present invention is constituted by only transistors of the same conductivity type. For example, an N-type transistor attains an activated state (on state, conducting state) when a voltage between the gate and source attains an H (high) level which is higher than a threshold voltage of the transistor, and the N-type transistor attains a deactivated state (off state, nonconducting state) when the voltage attains an L (low) level which is lower than the threshold voltage. Therefore, in a circuit using the N-type transistor, the H level of a signal is "activated level", and the L level is "deactivated level." Furthermore, when each node of the circuit constituted by the N-type transistors is charged to be the H level, a change from the deactivated level to the activated level occurs. When each node is discharged to be the L level, a change from the activated level to the deactivated level occurs.

In contrast, a P-type transistor attains an activated state (on state, conducting state) when a voltage between the gate and source attains an L level which is lower than the threshold voltage (a negative value with respect to the source) of the transistor, and the P-type transistor attains a deactivated state (off state, nonconducting state) when the voltage attains an H level which is higher than the threshold voltage. Therefore, in a circuit using the P-type transistor, the L level of a signal is "activated level", and the H level is "deactivated level." Furthermore, in each node of the circuit constituted by the P-type transistors, a relationship between charge and discharge is opposite to that of the N-type transistor. When each node is charged to be the L level, a change from the deactivated level to the activated level occurs. When each node is discharged to be the H level, a change from the activated level to the deactivated level occurs.

In this specification, a "connection" between two devices, between two nodes, or between one device and one node includes a connection by way of another element (such as a device and a switch), which is a state equivalent to a substantially direct connection. For example, even when two devices are connected via a switch, the two devices are described as being "connected" as long as the two devices can serve as if they are directly connected.

In the present invention, a clock signal having phases different from each other (multiphase clock signal) is used. In the below, for brevity of explanation, a certain interval ($\Delta t$ of FIG. 37) is arranged between an activated period of a clock signal and an activated period of a signal subsequently activated. However, in the present invention, the above interval may not be arranged, as long as activated periods of clock signals do not substantially overlap with each other. For example, where the activated level is the H level, a fall time of a clock signal may be at the same as a rising time of another clock signal activated subsequent thereto.

First Embodiment

FIG. 1 is a schematic block diagram showing a configuration of a display apparatus according to the first embodiment of the present invention. In FIG. 1, an entire configuration of a liquid crystal display apparatus 100 is shown as a representative example of the display apparatus. It should be noted that a gate line driving circuit according to the present invention is not limited to application to a liquid crystal display apparatus, and can be widely applied to electro-optic apparatuses such as electroluminescence (EL), organic EL, plasma display, electronic paper, and image sensor. The liquid crystal display apparatus 100 includes a liquid crystal array unit 10, a gate line driving circuit (scanning line driving circuit) 30, and a source driver 40. As will be clear from the following description, a shift register according to the embodiments of the present invention is arranged in the gate line driving circuit 30.

The liquid crystal array unit 10 includes a plurality of pixels 15 arranged in a matrix. Gate lines $GL_1$, $GL_2$, ... (hereinafter also generically referred to as "gate lines GL") are respectively provided for rows of pixels (hereinafter also referred to as "pixel lines"). Data lines $DL_1$, $DL_2$, ... (hereinafter also generically referred to as "data lines DL") are respectively provided for columns of pixels (hereinafter also referred to as "pixel columns"). FIG. 1 shows, as a representative example, the pixels 15 in the 1st column and the 2nd column of the 1st row and the corresponding gate line $GL_1$, and the corresponding data lines $DL_1$ and $DL_2$.

Each of the pixels 15 has a pixel switch device 16 arranged between a corresponding data line DL and a pixel node Np, and also has a capacitor 17 and a liquid crystal display device 18 connected in parallel between the pixel node Np and a common electrode node NC. The orientation of the liquid crystal in the liquid crystal display device 18 changes in accordance with the voltage difference between the pixel node Np and the common electrode node NC, and the display brightness of the liquid crystal display device 18 changes in accordance therewith. Therefore, the brightness of each of the pixels can be controlled by the display voltage transmitted to the pixel node Np via the data line DL and the pixel switch device 16. Specifically, an intermediate brightness can be obtained by applying, across the pixel node Np and the common electrode node NC, an intermediate voltage difference between a voltage difference for the maximum brightness and a voltage difference for the minimum brightness. Therefore, multiple levels of gradation can be obtained by setting the above display voltage in multiple levels.

The gate line driving circuit 30 sequentially selects and activates the gate lines GL in a predetermined scanning cycle. The gate electrode of each of the pixel switch devices 16 is connected to a corresponding gate line GL. While a certain gate line GL is selected, the pixel switch device 16 becomes conductive in each pixel connected to the selected gate line GL, so that the pixel node Np is in connection to a corresponding data line DL. Then, a display voltage transmitted to the pixel node Np is stored to the capacitor 17. In general, the pixel switch device 16 is a TFT formed on the same insulating substrate (such as a glass substrate and a resin substrate) as that formed with the liquid crystal display device 18.

The source driver 40 is provided to output, to the data lines DL, display voltages which are set in multiple levels by a display signal SIG that is an N-bit digital signal. For example, the display signal SIG is a 6-bit signal including display signals bits DB0 to DB5. With such a 6-bit display signal SIG, $2^6=64$ levels of gradation can be displayed in each pixel. Furthermore, by forming one color display unit using three pixels of R (Red), G (Green), and B (Blue), a display of approximately 260 thousand colors can be achieved.

As shown in FIG. 1, the source driver 40 includes a shift register 50, data latch circuits 52 and 54, a gradation voltage generating circuit 60, a decoder circuit 70, and an analog amplifier 80.

For the display signal SIG, the display signal bits DB0 to DB5 corresponding to the display brightness of each of the pixels 15 are serially generated. In other words, the display signal bits DB0 to DB5 at each point in time indicate the display brightness of any one pixel 15 in the liquid crystal array unit 10.

The shift register 50 instructs the data latch circuit 52 to fetch the display signal bits DB0 to DB5 with timing synchronized with a cycle in which the setting of the display signal SIG is switched. The data latch circuit 52 sequentially fetches the serially-generated display signals SIG to latch display signals SIG of one pixel line.

A latch signal LT inputted to the data latch circuit 54 is activated at a time at which display signals SIG of one pixel line have been fetched by the data latch circuit 52. In response to this, the data latch circuit 54 fetches display signals SIG of one pixel line latched in the data latch circuit 52 at that time.

The gradation voltage generating circuit 60 is composed of sixty-three dividing resistances which are connected in series between a high voltage VDH and a low voltage VDL and which generate 64 levels of gradation voltages V1 to V64, respectively.

The decoder circuit 70 decodes display signals SIG latched in the data latch circuit 54, and based on the result of decoding, selects voltages from among the gradation voltages V1 to V64 and outputs the voltages to decoder output nodes Nd$_1$, Nd$_2$, . . . (hereinafter also generically referred to as "decoder output nodes Nd").

Consequently, display voltages (any of the gradation voltages V1 to V64) corresponding to display signals SIG of one pixel line latched in the data latch circuit 54 are output to the decoder output nodes Nd simultaneously (in parallel). FIG. 1 shows, as a representative example, the decoder output nodes Nd$_1$ and Nd$_2$ corresponding to the data lines DL$_1$ and DL$_2$ of the first and second columns, respectively.

The analog amplifier 80 current-amplifies of analog voltages which correspond to the display voltages output to the decoder output nodes Nd$_1$, Nd$_2$, . . . from the decoder circuit 70, and outputs the amplified analog voltages to the data lines DL$_1$, DL$_2$, . . . , respectively.

The source driver 40 repeatedly outputs, to the data lines DL, display voltages of one pixel line corresponding to a series of display signals SIG in a predetermined scanning cycle, and the gate line driving circuit 30 sequentially drives the gate lines GL$_1$, GL$_2$, . . . in synchronization with that scanning cycle. Accordingly, image display based on the display signals SIG is provided on the liquid crystal array 10.

While FIG. 1 shows, by way of example, the liquid crystal display apparatus 100 with such a configuration that the gate line driving circuit 30 and the source driver 40 are integrally formed with the liquid crystal array unit 10, the gate line driving circuit 30 and the liquid crystal array unit 10 may be integrally formed, and the source driver 40 may be provided as external circuit of the liquid crystal array unit 10. Alternatively, the gate line driving circuit 30 and the source driver 40 may be provided as external circuits of the liquid crystal array unit 10.

Figure 2:
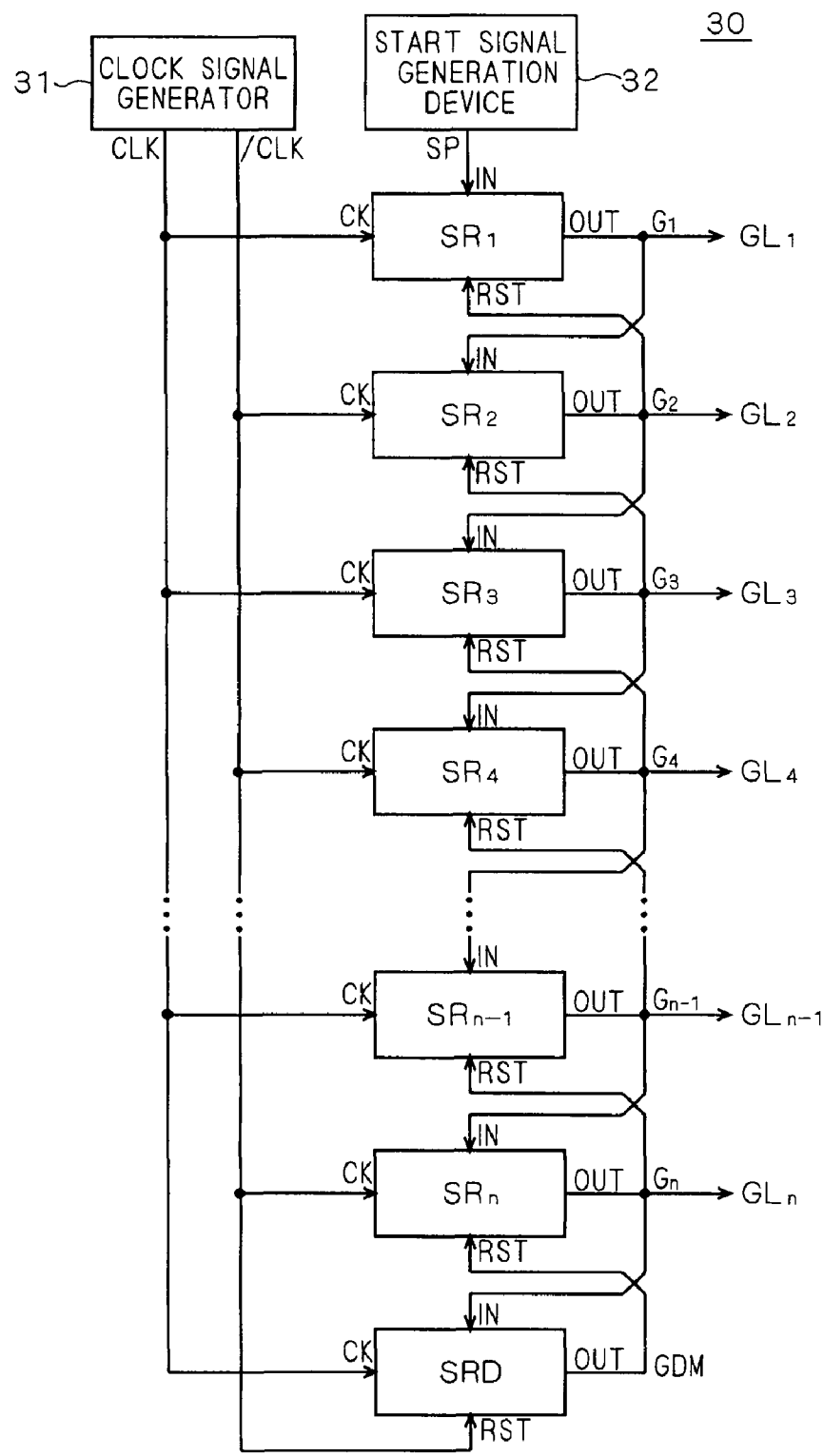
FIG. 2 is a figure showing a configuration of a gate line driving circuit according to the first embodiment.

FIG. 2 shows a configuration of the gate line driving circuit 30. This gate line driving circuit 30 is constituted by a shift register including a plurality of cascade-connected unit shift registers SR$_1$, SR$_0$, SR$_3$, SR$_4$, . . . (hereinafter, the cascade-connected shift register circuits SR$_1$, SR$_0$, . . . are generically referred to as "unit shift registers SR" for convenience of description). Each unit shift register SR is provided for each pixel line, i.e., each gate line GL.

The gate line driving circuit 30 according to the embodiments has a dummy unit shift register SRD (hereinafter referred to as "dummy stage"), which is not connected to any gate line, arranged at a stage subsequent to the unit shift register SRn of the last stage. Basically, the dummy stage SRD has the same configuration as the other unit shift registers SR.

A clock signal generator 31 shown in FIG. 2 is provided to input a two-phase clock including clock signals CLK and /CLK having phases opposite to each other (not causing activated periods to be overlapped) to the unit shift registers SR in the gate line driving circuit 30. These clock signals CLK and /CLK have phases opposite to each other and are controlled to be activated alternately with timing synchronized with a scanning cycle of the display apparatus.

Each unit shift register SR has an input terminal IN, an output terminal OUT, a clock terminal CK, and a reset terminal RST. As shown in FIG. 2, either of the clock signals CLK and /CLK is supplied to the clock terminal CK of each unit shift register SR. Specifically, the clock signal CLK is provided to unit shift registers of odd-number stages SR$_1$, SR$_3$, SR$_5$, . . . , and the clock signal /CLK is provided to unit shift registers of even-number stages SR$_2$, SR$_4$, SR$_6$, . . . .

In the example of FIG. 2, the unit shift register SR$_n$ of the $n^{th}$ stage, i.e., the last stage, is an even-number stage, and the clock signal /CLK is provided to the unit shift register SRn. Therefore, the dummy stage SRD is an odd-number stage, and the clock signal CLK is provided to the clock terminal CK of the dummy stage SRD.

A start pulse SP for causing the gate line driving circuit 30 to start shift operation of a signal is input to the input terminal IN of the unit shift register SR$_1$ of the first stage. The start pulse SP is generated by a start signal generation device 32. In the present embodiment, the start pulse SP is a signal activated (attaining the H level) at a time corresponding to the start of each frame period of an image signal. The input terminal IN of a unit shift register SR of the second or subsequent stage is connected to the output terminal OUT of the unit shift register SR of the preceding stage.

The reset terminal RST of each unit shift register SR is connected to the output terminal OUT of the unit shift register SR of a succeeding stage. The reset terminal RST of the unit shift register SR$_n$ of the last stage is connected to the output terminal OUT of the dummy stage SRD. It should be noted that the clock signal /CLK having a phase different from that of the clock signal CLK input to the clock terminal CK of the dummy stage SRD is input to the reset terminal RST of the dummy stage SRD.

As described above, the output signal G output from the output terminal OUT of each unit shift register SR is provided as a horizontal (or vertical) scanning pulse to the corresponding gate line GL, and is also provided to the input terminal IN of a stage subsequent to the unit shift register SR and the reset terminal RST of a stage preceding the unit shift register SR.

Figure 37:
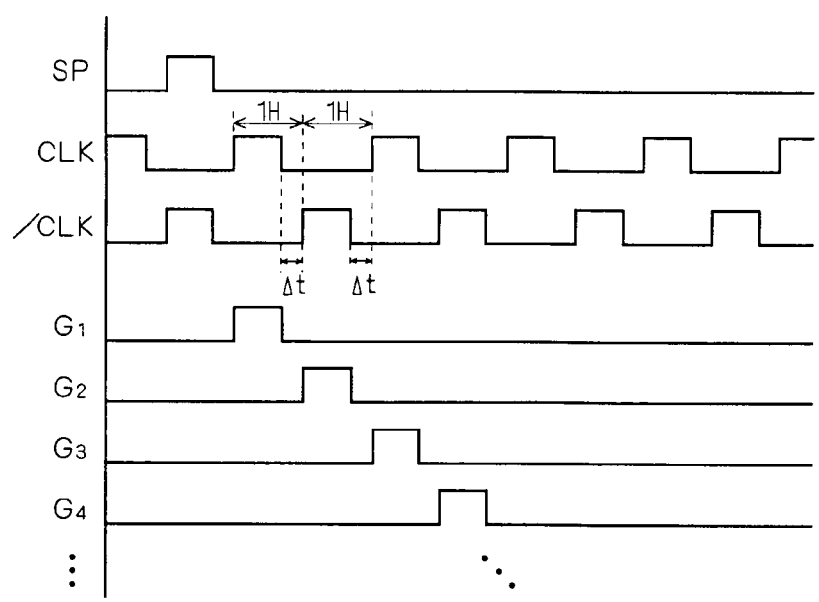
FIG. 37 is a signal waveform diagram showing operation of a gate line driving circuit.

In the gate line driving circuit 30, in synchronization with the clock signal CLK or /CLK, each unit shift register SR transmits a signal input to the input terminal IN (i.e., the start pulse SP or the output signal from a stage preceding the unit shift register SR) to a corresponding gate line GL and to a unit shift register SR of a stage subsequent to the unit shift register SR while time-shifting the input signal. As a result, as shown in FIG. 37, the output signal of each unit shift register is activated in the order of $G_1, G_2, G_3, \ldots$ (the operation of each unit shift register SR will be described later in detail). Therefore, a series of unit shift registers SR serve as a so-called gate line driving unit for sequentially activating the gate lines GL with timing based on the predetermined scanning cycle.

FIG. 3 is a circuit diagram showing a configuration of a unit shift register SR according to the first embodiment of the present invention. In the gate line driving circuit 30, the cascade-connected unit shift registers SR have substantially the same configuration. In this explanation, the unit shift, register $SR_k$ of the $k^{th}$ stage will be explained as a representative example. Furthermore, transistors constituting the unit shift register $SR_k$ according to the present embodiment are all field-effect transistors of the same conductivity type. In the following embodiments and modifications, all of the transistors are assumed to be N-type TFTs.

As shown in FIG. 3, the unit shift register $SR_k$ has a first power supply terminal S1 supplied with a low power supply potential VSS and a second power supply terminal S2 and a third power supply terminal S3 supplied with high power supply potentials VDD1 and VDD2, respectively, in addition to the input terminal IN, the output terminal OUT, the clock terminal CK, and the reset terminal RST which are already shown in FIG. 2. The high power supply potentials VDD1 and VDD2 may have the same level as each other. In the following description, the low power supply potential VSS shall be a reference potential of the circuit; however, in practical use, a reference potential is determined with reference to a voltage of data written into pixels, in which case, for example, the high power supply potentials VDD1 and VDD2 may be set as 17V, and low power supply potentials VSS may be set as −12V.

The unit shift register $SR_k$ has an output circuit 20, a pull-up driving circuit 21, and a pull-down driving circuit 22. The output circuit 20 activates and deactivates an output signal $G_k$, and includes a transistor Q1 (output pull-up transistor) for causing an output signal $G_k$ to be an activated state (H level) during a selection period of a gate line $GL_k$ and a transistor Q2 (output pull-down transistor) for maintaining the output signal $G_k$ at a deactivated state (L level) during a non-selection period of a gate line $GL_k$.

The transistor Q1 is connected between the output terminal OUT and the clock terminal CK, and activates the output signal $G_k$ by supplying to the output terminal OUT the clock signal input to the clock terminal CK. The transistor Q2 is connected between the output terminal OUT and the first power supply terminal S1, and maintains the output signal $G_k$ at the deactivated level by discharging the output terminal OUT so that the output terminal OUT has a potential VSS.

Herein, the node connected to the gate (control electrode) of the transistor Q1 is defined as "node N1."

A capacitive element. C1 is provided between the gate and source of the transistor Q1, i.e., between the output terminal OUT and the node N1. The capacitive element C1 is provided to capacitively couple the output terminal OUT and the node N1, and enhance the effect of increasing the potential at the node N1 with increasing potential level of the output terminal OUT. However, if the capacitance between the gate and channel of the transistor Q1 is sufficiently large, the capacitive element C1 can be replaced with the capacitance of the transistor Q1, and in such case, the capacitive element C1 may be omitted.

Normally, in a semiconductor integrated circuit, a thickness of an insulating film serving as a dielectric layer of a capacitive element is the same as a thickness of a gate insulating film of a transistor. Therefore, when a capacitive element is replaced with a gate capacitance of a transistor, a transistor having the same size as the capacitive element can substitute for the capacitive element. Specifically, when the capacitive element C1 of FIG. 3 is replaced with the capacitance between the gate and channel of the transistor Q1, the gate width of the transistor Q1 should be made wider by a corresponding size.

The pull-up driving circuit 21 is adapted to drive the transistor Q1 (output pull-up transistor), and operates to turn on the transistor Q1 during the selection period of the gate line $GL_k$ and turns off the transistor Q1 during the non-selection period of the gate line $GL_k$. Therefore, the pull-up driving circuit 21 charges the node N1 (the transistor Q1) in accordance with activation of the output signal of preceding stage $G_{k-1}$ (or the start pulse SP) input to the input terminal IN, and discharges the node N1 in accordance with activation of an output signal of subsequent stage $G_{k+1}$ (or the output signal GDM of the dummy stage SRD) serving as a reset signal input to the reset terminal RST.

In the pull-up driving circuit 21, the transistor Q3 (the third transistor) is connected between the node N1 and the second power supply terminal S2, and the transistor Q3 charges the node N1 by supplying the potential VDD1 of the second power supply terminal S2 to the node N1. Furthermore, transistors Q4 and Q5 are connected between the node N1 and the first power supply terminal S1, and the transistors Q4 and Q5 discharge the node N1 by supplying the potential VSS of the first power supply terminal S1 to the node N1. The gate of the transistor Q4 is connected to the reset terminal RST. The gate of the transistor Q5 is connected to an output terminal (defined as "node N2") of the pull-down driving circuit 22, which will be explained later.

Where the gate node of the transistor Q3 is defined as "node N3", a transistor Q8 is connected between the node N3 and the input terminal IN, and the gate of the transistor Q8 is connected to the second power supply terminal S2. When the node N3 is at the L level, the transistor Q8 is on, and therefore, when the output signal $G_{k-1}$ of the preceding stage attains the H level, the node N3 is charged by the transistor Q8. In other words, the transistor Q8 serves as a charging circuit for charging the node N3 in accordance with activation of the output signal $G_{k-1}$ of the preceding stage.

Transistors Q9 and Q10 are connected in series between the second power supply terminal S2 and the first power supply terminal S1. Where a node connecting between the transistors Q9 and Q10 is defined as "node N4", the transistor Q9 is connected between the second power supply terminal S2 and the node N4, and the gate of the transistor Q9 is connected to the node N3. The transistor Q10 is connected between the node N4 and the first power supply terminal S1, and the gate of the transistor Q10 is connected to the output terminal (node N2) of the pull-down driving circuit 22. The on-state resistance of the transistor Q10 is configured to be sufficiently smaller than the on-state resistance of the transistor Q9, i.e., the transistor Q10 is configured to have a higher drive capability than the transistor Q9.

These transistors Q9 and Q10 constitute a ratio-type inverter in which the node N2 is an input terminal and the node N4 is an output terminal. In the inverter, the transistor Q9 serves as a load element, and the transistor Q10 serves as a driving element.

A capacitor element C2 is connected between the gate and source (between the node N3 and the node N4) of the transistor Q9. This capacitor element C2 capacitively couples between the nodes N3 and N4, and increases the potential at the node N3 when the output level of the inverter increases.

On the other hand, the pull-down driving circuit 22 is adapted to drive the transistor Q2 (output pull-down transistor), and the output terminal thereof (node N2) is connected to the gate of the transistor Q2. The pull-down driving circuit 22 according to the present embodiment charges and discharges the node N2 in accordance with change in the level of the node N1. Specifically, when the node N1 attains the H level, the pull-down driving circuit 22 discharges the node N2, and when the node N1 attains L level, the pull-down driving circuit 22 charges the node N2. Accordingly, the transistor Q2 is off during the selection period of the gate line $GL_k$ and the transistor Q2 is on during the non-selection period of the gate line $GL_k$. As described above, the node N2 is also connected to the gates of the transistors Q5 and Q10 of the pull-up driving circuit 21.

The pull-down driving circuit 22 includes the transistors Q6 and Q7 connected in series between the third power supply terminal S3 and the first power supply terminal S1. The transistor Q6 is connected between the node N2 and the third power supply terminal S3, and the gate of the transistor Q6 is connected to the third power supply terminal S3 (i.e., the transistor Q6 is diode-connected). The transistor Q7 is connected between the node N2 and the first power supply terminal S1, and the gate of the transistor Q7 is connected to the node N1.

The on-state resistance of the transistor Q7 is configured to be sufficiently smaller than the on-state resistance of the transistor Q6, i.e., the transistor Q7 is configured to have a higher drive capability than the transistor Q6. Therefore, when the gate of the transistor Q7 (node N1) attains the H level, the transistor Q7 turns on, and accordingly the node N2 attains the L level. On the contrary, when the node N1 is at the L level, the transistor Q7 turns off, and accordingly the node N2 attains the H level. In other words, the pull-down driving circuit 22 constitutes a ratio-type inverter in which the node N1 is an input end and the node N2 is an output end. In the inverter, the transistor Q6 serves as a load element, and the transistor Q7 serves as a driving element.

Hereinafter, specific operation of the unit shift register SR according to the present embodiment will be described. Each of the unit shift registers SR and the dummy stage SRD constituting the gate line driving circuit 30 operate substantially in the same manner. Herein, operation of the unit shift register $SR_k$ of the $k^{th}$ stage will be also explained as a representative example. The unit shift register $SR_k$ is assumed to have the clock signal CLK input to the clock terminal CK (this corresponds to the unit shift registers of odd-number stages $SR_1$, $SR_3$, . . . ).

For brevity of explanation, in the below with the exception of special reference, all of the clock signals CLK and /CLK and the start pulse SP are assumed to have the same potential at the H level, and the level thereof is assumed to be VDD. Furthermore, VDD is assumed to be the same as the levels of the high power supply potentials VDD1 and VDD2 (i.e., VDD=VDD1=VDD2). At the L level, the clock signals CLK and /CLK and the start pulse SP is assumed to have the same potential as the low power supply potential VSS, and the potential thereof is assumed to be 0V (VSS=0). Furthermore, the threshold voltages of the transistors are all assumed to be the same, and the value thereof is assumed to be Vth. It should be noted that, as shown in FIG. 37, the clock signals CLK and /CLK are repeating signals having a phase difference of one horizontal period (1H) from each other.

Figure 4:
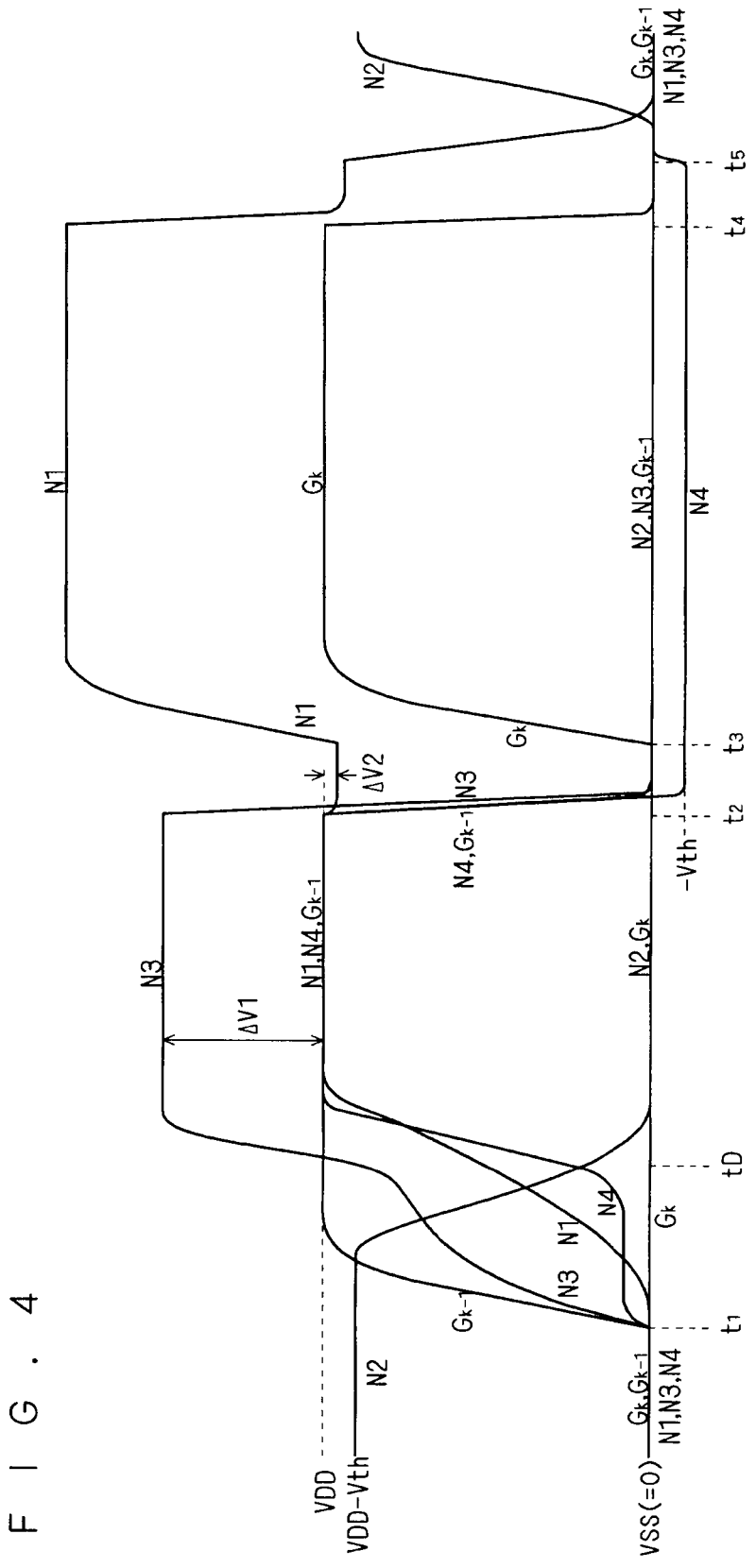
FIG. 4 is a timing chart illustrating operation of the unit shift register according to the first embodiment.

FIG. 4 is a timing chart for illustrating the operation of the unit shift register according to the first embodiment. The operation of the unit shift register $SR_k$ will be explained with reference to FIG. 4.

The initial state of the unit shift register $SR_k$ (the state immediately before a time $t_1$) is assumed to be such that the node N1 is at the L level (VSS) and the node N2 is at the H level (VDD−Vth). In this state, the transistor Q1 is off (non-conductive state), and the transistor Q2 is on (conductive state), and therefore, the output terminal OUT (output signal $G_k$) is maintained at the L level regardless of the level of the clock terminal CK (clock signal CLK) (this state is referred to as a "reset-state"). Therefore, the gate line $GL_k$ corresponding to this unit shift register $SR_k$ is in the non-selection state.

At a time immediately before the time $t_1$, all of the clock terminal CK (the clock signal CLK) of the unit shift register $SR_k$, the input terminal IN (the output signal of preceding stage $G_{k−1}$), and the reset terminal RST (the output signal of subsequent stage $G_{k+1}$) are assumed to be at the L level. Therefore, the node N3 is discharged via the transistor Q8, and is at the L level (VSS). Further the node N4 is at the L level (VSS) since the transistor Q10 is on.

At the time $t_1$, the clock signal /CLK (not shown) is assumed to change from the above state to the H level, and further, the output signal of preceding stage $G_{k−1}$ (the start pulse SP in a case of the unit shift register $SR_1$ of the 1st stage) is assumed to be activated. Accordingly, the level of the input terminal IN of the unit shift register $SR_k$ increases. Since the transistor Q8 whose gate is connected to the second power supply terminal S2 is in the on-state, the level of the node N3 increases in accordance with the increase in the level of the output signal of preceding stage $G_{k−1}$.

Before the level of the output signal of preceding stage $G_{k−1}$ sufficiently increases, the voltage between the gate and source of the transistor Q8 (potential difference between the second power supply terminal S2 and the node N3) is large, and the transistor Q8 operates in a non-saturated region, in which state the on-state resistance value of the transistor Q8 is sufficiently low. Therefore, the level of the node N3 begins to increase without lagging behind the output signal of preceding stage $G_{k−1}$. However, as the level of the output signal of preceding stage $G_{k−1}$ increases, the voltage between the gate and source of the transistor Q8 decreases, and the transistor Q8 begins to operate in a saturated region, which increases the on-state resistance value. Therefore, as shown in FIG. 4, the rising rate of the level of the node N3 slows down as the level of the output signal of preceding stage $G_{k−1}$ increases.

When the node N3 attains the H level, the transistor Q3 turns on. At this moment, since the node N2 is at the H level, the transistor Q5 is also on. But the transistor Q3 is configured to have a sufficiently smaller on-state resistance (a wider gate width) than the transistor Q5, and therefore, the level of the node N1 begins to increase. Then, when the level of the node N1 exceeds the threshold voltage (Vth) of the transistor Q7, the transistor Q7 turns on, and the level of the node N2 begins to decrease.

At this moment, since the on-state resistance value of the transistor Q5 increases in accordance with the decrease in the level of the node N2, the rising rate of the level of the node N1 increases. Accordingly, the on-state resistance of the transistor Q7 decreases, and the falling rate of the level of the node N2 increases. This loop further accelerates the rising rate of the level of the node N1 and the falling rate of the level of the node N2.

Then, when the level of the node N2 decreases to the L level, the transistor Q10 turns off. At this moment, because the node N3 is at the H level, the transistor Q9 is on, and the level of the node N4 increases. In other words, the level of the output end (the node N4) of the inverter constituted by the transistors Q9 and Q10 changes from the L level to the H level (time tD).

The increase in the level of the node N4 causes the level of the node N3 to increase with the coupling via the capacitive element C2. When the level of the node N3 increases, the on-state resistance of the transistor Q9 decreases, and accordingly, the rising rate of the level of the node N4 increases. This positive feedback loop rapidly increases the levels at the nodes N3 and N4.

As described above, when the potential at the node N3 is increased, the current electrodes of the transistor Q8 are such that the electrode on the node N3 side is a drain and the electrode on the input terminal IN side is a source. Since the gate potential of the transistor Q8 is VDD (=VDD1), the voltage between the gate and source is zero, and the transistor Q8 turns off. Therefore, the node N3 is in high impedance state (floating state), and the potential at the node N3 can be increased to a level higher than the potential VDD.

A time tD when the level of the node N4 increases (i.e., a time at which the output of the inverter constituted by the transistors Q9 and Q10 changes from the L level to the H level) is determined based on, e.g., the ratio between the on-state resistances of the transistors Q3 and Q5 and a discharge time constant of the node N2. In the present embodiment, the time tD is configured to be after the level of the node N3 has sufficiently increased as shown in FIG. 4. Therefore, as a result of the potential at the node N3 increased in accordance with the increase in the level of the node N4, the node N3 attains a potential high enough (VDD+$\Delta$V1 of FIG. 4) to cause the transistor Q3 to operate in the non-saturated region. More specifically, the voltage of the node N3 becomes larger than the amplitude (VDD) of the output signal of preceding stage $G_{k-1}$. At this time, if VDD+$\Delta$V1$\geq$VDD+Vth, i.e., $\Delta$V1$\geq$Vth, the transistor Q3 operates in the non-saturated region. Even if such condition is not satisfied, when the voltage of the node N3 becomes larger than the amplitude (VDD) of the output signal of preceding stage $G_{k-1}$), driving capability of the transistor Q3 becomes at least more than the conventional unit shift register (FIG. 7 of Japanese Patent Application Laid-open No. 2004-78172).

Therefore, the node N1 is rapidly charged (pre-charged) via the transistor Q3, and increases to the same potential VDD as the second power supply terminal S2, so that the node N1 attains the H level. Similarly, the transistor Q9 operates in the non-saturated region, and therefore, the potential at the node N4 attains VDD.

As described above, the inverter constituted by the transistors Q9 and Q10 and the capacitive element C2 serves as a boosting circuit for increasing the potential at the node N3 (boosting the node N3) after a predetermined period of time (approximately equal to tD−t1) passes since the transistor Q8 (charging circuit) begins to charge the node N3.

As described above, the unit shift register $SR_k$ attains such a state that the node N1 is at the H level, the node N2 is at the L level, the transistor Q1 turns on, and the transistor Q2 turns off (hereinafter, this state is referred to as "set-state"). However, at this moment, since the clock signal CLK is at the L level, the output signal $G_k$ output from the output terminal OUT is still at the L level.

In the conventional unit shift register (FIG. 7 of Japanese Patent Application Laid-open No. 2004-78172), a transistor corresponding to the transistor Q3 operates in a source follower mode. Therefore, a gate of an output pull-up transistor (corresponding to the transistor Q1) cannot be charged (pre-charged) to a potential equal to or more than VDD−Vth, and further, the rate of the charging decreases as it is charged. In contrast, in the unit shift register $SR_k$ of FIG. 3, the transistor Q3 operates in the non-saturated region and pre-charges the node N1. Therefore, the potential at the node N1 can be increased to the level of VDD, and further, the rate of the charging is fast.

Herein, attention is given to the operation of the transistor Q8 during the pre-charge of the node N1. While the level of the output signal of preceding stage $G_{k-1}$ is rising (time $t_1$ to time tD), the transistor Q8 serves as a resistor element for charging the node N3 by transmitting the output signal of preceding stage $G_{k-1}$ to the node N3. However, while the potential at the node N3 is thereafter increased with the capacitive element C2 (time tD to time $t_2$), the transistor Q8 serves as a blocking element for blocking the flow of charges from the node N3 to the input terminal IN. Furthermore, as explained later, when the output signal of preceding stage $G_{k-1}$ is falling (time $t_2$), the transistor Q8 serves as a resistive element for discharging charges in the node N3 to the input terminal IN.

Herein, the potential VDD1 supplied to the gate of the transistor Q8 has been described as being VDD which is the same as the potential of the output signal of preceding stage $G_{k-1}$ at the H level, but the potential VDD1 may be any potential as long as the transistor Q8 can operate as described above. For example, the higher the potential VDD1 is, the faster the transistor Q8 can charge the node N3. Therefore, when the potential VDD1 is higher, the node N3 can be increased to a sufficiently high level by the time tD, and the potential at the node N3 (VDD+$\Delta$V1 in FIG. 4) can be increased to a higher level when the potential has been increased. However, if the potential VDD1 exceeds VDD+Vth, the transistor Q8 does not turn off while the potential at the node N3 is increased (i.e., the transistor Q8 does not serve as a blocking element). In other words, the potential VDD1 (the gate potential of the transistor Q8) should not exceed VDD+Vth, but is preferably a value near VDD+Vth.

When the clock signal /CLK falls at the time $t_2$, the output signal of preceding stage $G_{k-1}$ changes to the L level. Then, the node N3 of the unit shift register $SR_k$ is discharged via the transistor Q8, and the node N3 attains the L level. Accordingly, the transistors Q3 and Q9 turn off.

As described above, when the node N3 changes from the H level (VDD+$\Delta$V1) to the L level (VSS), the level of the node N4 also tries to decrease with the coupling via the capacitive element C2. When the transistor Q9 turns off while the level of the node N3 decreases, the node N4 attains a floating state because the transistor Q10 is also off at this moment. Therefore, the level of the node N4 decreases to less than VSS, and becomes a negative voltage. However, the gate potentials of the transistors Q9 and Q10 are VSS, and when the node N4 decreases to less than −Vth, the transistors Q9 and Q10 turn on, so that the level of the node N4 is clamped to −Vth.

When the transistor Q3 turns off while the node N3 falls, the level of the node N1 slightly decreases (ΔV2 of FIG. 4) with the coupling via the gate capacitance of the transistor Q3. This decrease in the level of the node N1 also occurs with a conventional unit shift register. Since the gate potential of the transistor Q3 is increased to a higher potential (VDD+ ΔV1), the gate potential of the transistor Q3 changes more greatly. Therefore, ΔV2 is larger than that of the conventional unit shift register, but the level of the node N1 is higher than that of the conventional unit shift register even after the gate potential drops by ΔV2.

Then, when the clock signal CLK rises at a time $t_3$, the change in the level thereof is transmitted to the output terminal OUT via the transistor Q1 in on-state, so that the level of the output signal $G_k$ increases. At this moment, the potential at the node N1 is increased with the coupling via the capacitive element C1, and the transistor Q1 operates in the non-saturated region. Therefore, the output signal $G_k$ attains the H level to have the potential VDD, which is the same as the potential of the clock signal CLK at the H level.

Herein, where a parasitic capacity of the node N1 is assumed to be sufficiently small, the potential at the node N1 is increased to about the same extent as the amplitude of the output signal $G_k$. Therefore, the following expression (1) represents the level Va [N1] at the node N1 after the level has been increased.

$$Va[N1]=2*VDD-\Delta V2 \quad (1)$$

When the clock signal CLK falls at a time $t_4$, a current flows from the output terminal OUT to the clock terminal CK via the transistor Q1 in on-state, so that the output terminal OUT is discharged. As a result, the output signal $G_k$ attains the L level. At this moment, the node N1 returns back to a level before the potential is increased (VDD−ΔV2) with the coupling via the capacitive element C1.

Herein, since the output signal $G_k$ is also input to the input terminal IN of the unit shift register of subsequent stage $SR_{k+1}$, the unit shift register of subsequent stage $SR_{k+1}$ transits to the set-state before the output signal $G_k$ attains the H level at the above time $t_3$.

Therefore, when the level of the clock signal /CLK rises at a time $t_5$, the output signal of subsequent stage $G_{k+1}$ (not shown) attains the high level. The output signal of subsequent stage $G_{k+1}$ is input to the reset terminal RST of the unit shift register $SR_k$, and therefore, in the unit shift register $SR_k$, the transistor Q4 turns on, and the node N1 is discharged to the L level. Accordingly, the transistor Q7 turns off, and the node N2 is charged by the transistor Q6, so that the node N2 attains the H level. In other words, the unit shift register $SR_k$ returns back to the reset-state in which the transistor Q1 is off and the transistor Q2 is on.

Furthermore, since the node N2 attains the H level, the transistor Q5 and the transistor Q10 turn on. At this moment, the potential at the node N4 changes from −Vth to VSS due to the charges flowing in through the transistor Q10.

Thereafter, the output signal of subsequent stage $G_{k+1}$ returns back to the L level, the unit shift register $SR_k$ is maintained at the reset-state until the output signal of preceding stage $G_{k-1}$ is activated in the next frame period. This is because a half latch circuit constituted by the transistors Q5, Q6 and Q7 maintains the levels of the nodes N1 and N2. During that period, the transistor Q2 is on, and therefore, the output terminal OUT is maintained at the L level in low impedance.

As described above, the unit shift register $SR_k$ attains the set-state in accordance with activation of the output signal of preceding stage $G_{k-1}$ (or the start pulse SP), and activates the output signal $G_k$ of the unit shift register $SR_k$ in accordance with activate of the clock signal input to the clock terminal CK at that moment. Thereafter, the unit shift register $SR_k$ returns back to the reset-state and maintains the output signal $G_k$ at the L level, in accordance with activation of the output signal of subsequent stage $G_{k+1}$ (or the output signal GDM of the dummy stage SRD).

Therefore, as shown in FIG. 37, in response to activation of the start pulse SP input to the unit shift register $SR_1$, the gate line driving circuit 30 activates the output signals G1, G2, G3, . . . in order with timing synchronized with the clock signals CLK and /CLK. Therefore, the gate line driving circuit 30 can drive the gate lines $GL_1$, $GL_2$, $GL_3$, . . . in order in a predetermined scanning cycle.

As described above, in the unit shift register SR according to the present embodiment, the potential at the gate of the transistor Q3 (node N3) is increased by boosting unit constituted by the transistors Q8 and Q9 and the capacitive element C2 during pre-charge of the node N1. Therefore, since the transistor Q3 operates in the non-saturated region, the rising rate of the level of the node N1 is faster than ever before. Even when the frequency of the clock becomes higher, and the pulse width of the signal input to the input terminal IN becomes narrower, the node N1 can be sufficiently pre-charged. In other words, it is possible to prevent the decrease of the drive capability of the transistor Q1.

Furthermore, since the transistor Q3 operates in the non-saturated region, a loss corresponding to the threshold voltage does not occur during pre-charge of the node N1, and the node N1 can be pre-charged to a higher level (VDD) than the conventional unit shift register. Therefore, the drive capability of the transistor Q1 is higher than that of the conventional unit shift register.

[First Modification]

In the unit shift register $SR_k$ of FIG. 3, the transistor Q6 of the pull-down driving circuit 22 serves as the load element for the inverter. The load element of the inverter of the pull-down driving circuit 22 may be any element as long as the load element can maintain the node N2 at the H level during the non-selection period of the gate line $GL_k$. Therefore, for example, a current-driving element such as a constant-current element and a resistive element may be used instead of the transistor Q6.

Furthermore, in FIG. 3, the constant high power supply potential VDD2 is supplied to the gate of the transistor Q6, but instead of VDD2, the clock signal /CLK having the same phase as the output signal of subsequent stage $G_{k+1}$ may be supplied thereto. When the unit shift register $SR_k$ activates the output signal $G_k$, the transistor Q7 turns on for two horizontal periods (the time $t_1$ to the time $t_5$ in FIG. 4). In the circuit of FIG. 3, a flow-through current flows through the transistors Q6 and Q7 throughout the two horizontal period, but when the clock signal /CLK having the same phase as the output signal of subsequent stage $G_{k+1}$ is supplied to the gate of the transistor Q7, the transistor Q6 is off during half of the period, so that the flow-through current can be made half. Alternatively, the clock signal /CLK having the same phase as the output signal of subsequent stage $G_{k+1}$ may be supplied to both of the gate and drain of the transistor Q6.

This modification can also be applied to any of the following embodiments and modifications thereof.

[Second Modification]

Figure 5:
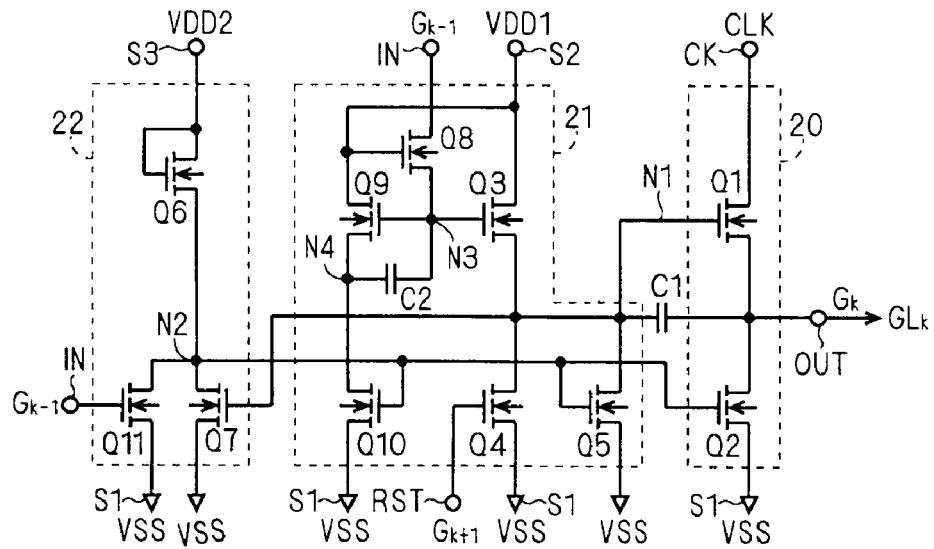
FIG. 5 is a circuit diagram showing a unit shift register according to the second modification of the first embodiment.

FIG. 5 is a circuit diagram showing the unit shift register $SR_k$ according to the second modification of the first embodiment. This unit shift register $SR_k$ has a transistor Q11 in the pull-down driving circuit 22 in addition to the circuit of FIG. 3. The transistor Q11 has a gate connected to the input terminal IN, and is connected between the node N2 and the first power supply terminal S1. Furthermore, the transistor Q11 is configured to have a sufficiently smaller on-state resistance than the transistor Q6.

In the circuit of FIG. 3, the transistor Q5 is in the on-state when the transistor Q3 begins to charge the node N1 in response to activation of the output signal of preceding stage $G_{k-1}$. Then, the node N1 is further charged, so that the transistor Q7 turns on, and when the node N2 attains the L level, the transistor Q5 accordingly turns off. Therefore, the transistor Q3 needs to have a sufficiently small on-state resistance than the transistor Q5.

In contrast, in the unit shift register $SR_k$ of FIG. 5, when the output signal of preceding stage $G_{k-1}$ is activated, the transistor Q11 turns on, which causes the node N2 to go to the L level. Therefore, the transistor Q5 turns off substantially at the same time as the transistor Q3 turns on, in which state the node N1 is charged. Therefore, the node N1 can be precharged regardless of the on-state resistance values of the transistors Q3 and Q5. However, it is necessary to configure the discharge time of the node N2 such that the node N3 increases to a sufficiently high level before the time (the time tD) when the potential at the node N3 is increased by the output (the signal of the node N4) of the inverter constituted by the transistors Q9 and Q10.

[Third Modification]

Figure 6:
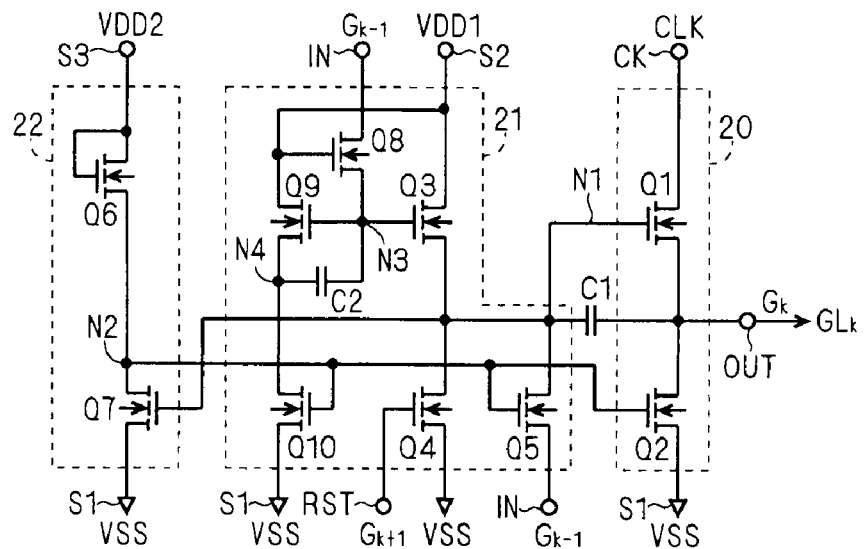
FIG. 6 is a circuit diagram showing a unit shift register according to the third modification of the first embodiment.

FIG. 6 is a circuit diagram showing the unit shift register $SR_k$ according to the third modification of the first embodiment. This unit shift register $SR_k$ is based on the circuit of FIG. 3 and is configured such that the source of the transistor Q5 in the pull-up driving circuit 21 is connected to the input terminal IN. In other words, the output signal of preceding stage $G_{k-1}$ is input to the source of the transistor Q5.

In the unit shift register $SR_k$ of FIG. 6, when the output signal of preceding stage $G_{k-1}$ is activated, the source potential of the transistor Q5 increases, and the transistor Q5 turns off. In other words, the transistor Q5 turns off at the same time as the transistor Q3 turns on, in which state the node N1 is charged. Therefore, the node N1 can be pre-charged regardless of the on-state resistance values of the transistors Q3 and Q5. As a result, the circuit can be easily designed. Furthermore, it is possible to eliminate the flow-through current flowing from the second power supply terminal S2 to the first power supply terminal S1 through the transistors Q3 and Q5, and the effect of reducing the power consumption can be obtained.

[Fourth Modification]

In the above unit shift register $SR_k$ (FIG. 6) according to the third modification, the transistor Q5 is already off when the transistor Q3 begins to charge the node N1, and therefore, the rising rate of the level of the node N1 is faster than that in the case of FIG. 3. Accordingly, a time at which the node N4 changes to the H level, i.e., the time tD of FIG. 4, becomes earlier.

As described above, the time tD is preferably after the level of the node N3 has sufficiently increased. If the time tD becomes earlier, the level of the node N3 is not sufficiently high when the level of the node N3 begins to be increased by the capacitive element C2, and therefore, the level of the node N3 (VDD+ΔV1 of FIG. 4) having been increased becomes lower. Accordingly, the on-state resistance of the transistor Q3 increases, which reduces the effect of the present invention. Hereinafter, another modification for coping with this issue will be suggested.

Figure 7:
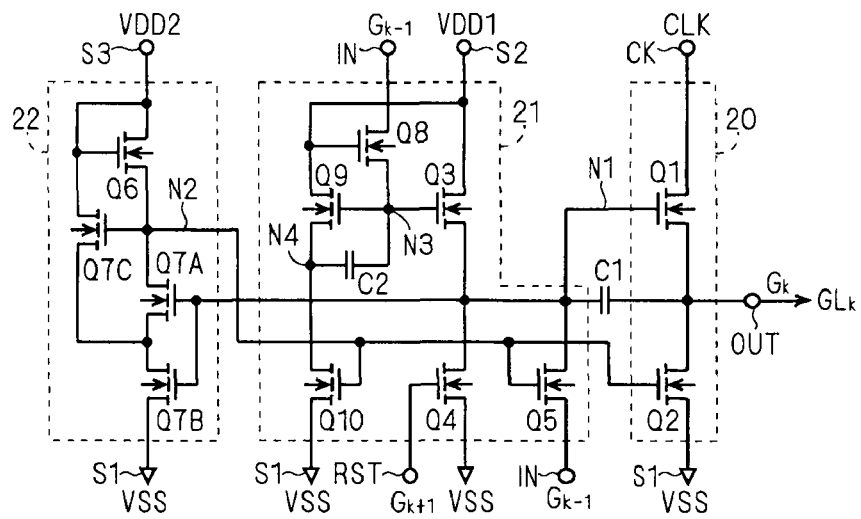
FIG. 7 is a circuit diagram showing a unit shift register according to the fourth modification of the first embodiment.

FIG. 7 is a circuit diagram showing the unit shift register $SR_k$ according to the fourth modification of the first embodiment. This unit shift register $SR_k$ is based on the circuit of FIG. 6, and is configured such that a Schmitt trigger inverter constituted by transistors Q6, Q7A, Q7B and Q7C is used as the pull-down driving circuit 22.

As shown in FIG. 7, the transistor Q6 is connected between the node N2 and the second power supply terminal S2, and the gate of the transistor Q6 is connected to the second power supply terminal S2 (i.e., the transistor Q6 is diode-connected). The transistors Q7A and Q7B are connected in series between the node N2 and the first power supply terminal S1, and both of the gates thereof are connected to the node N1. The transistor Q7C is connected between the second power supply terminal S2 and a connection node between the transistors Q7A and Q7B, and the gate of the transistor Q7C is connected to the node N2.

In this Schmitt trigger inverter, the transistor Q6 serves as a load element, and the series-connected transistors Q7A and Q7B serve as a driving element. The transistor Q7C serves as a current-driving element for flowing a feedback current to the connection node between the transistors Q7A and Q7B in accordance with the output signal of the inverter (the signal of the node N2).

The Schmitt trigger inverter has a higher threshold voltage than an ordinary ratio-type inverter (the pull-down driving circuit 22 of FIG. 6). Therefore, according to this pull-down driving circuit 22, the level of the node N2 decreases at a time delayed by the increase in the level of the node N1. Accordingly, the transistor Q10 turns off at a later time, and therefore, the level of the node N4 increases at a time later (the time tD) than that in the case of FIG. 6. Therefore, even when the rising rate of the level of the node N1 is fast, it is possible to prevent the node N4 from changing to the H level before the level of the node N3 sufficiently increases.

[Fifth Modification]

Figure 8:
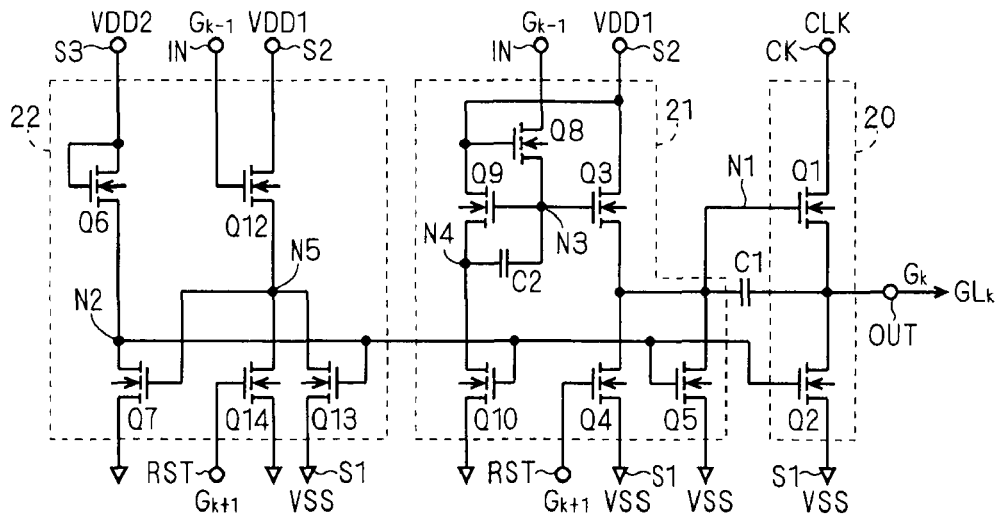
FIG. 8 is a circuit diagram showing a unit shift register according to the fifth modification of the first embodiment.

FIG. 8 is a circuit diagram showing the unit shift register $SR_k$ according to the fifth modification of the first embodiment. This unit shift register $SR_k$ is based on the circuit of FIG. 3, and is configured such that the pull-down driving circuit 22 (the inverter constituted by the transistors Q6 and Q7) is structured separately from the gate of the transistor Q1 (the node N1). Herein, an input end of the inverter constituted by the transistors Q6 and Q7 (the gate of the transistor Q7) is defined as "node N5."

The pull-down driving circuit 22 is arranged with an input circuit for providing an appropriate signal to the input end of the inverter (the node N5) separated from the node N1. The input terminal includes the transistors Q12, Q13 and Q14.

The transistor Q12 has a gate connected to the input terminal IN, and is connected between the second power supply terminal S2 and the node N5. Both of the transistors Q13 and Q14 are connected between the node N5 and the first power supply terminal S1, but the gate of the transistor Q13 is connected to the node N2, and the gate of the transistor Q14 is connected to the reset terminal RST. The transistor 12 is configured to have a sufficiently small on-state resistance than the transistor 13.

Operation of the pull-down driving circuit 22 in the unit shift register $SR_k$ of FIG. 8 will be hereinafter described. In the initial state, all of the output signal $G_k$ of the unit shift register $SR_k$, the output signal $G_{k-1}$ of the preceding stage, and the output signal $G_{k+1}$ of the subsequent stage are assumed to be at the L level, and the node N5 of the unit shift register $SR_k$ is assumed to be at the L level. At this moment, the transistor Q7 is in the off-state, and therefore, the node N2 is at the H level, and the transistor Q13 is in the on-state.

When the output signal of preceding stage $G_{k-1}$ attains the H level in the selection period of the gate line $GL_{k-1}$ after the above state, the transistor Q12 turns on. At this moment, the transistor Q13 is also on, but the transistor Q12 has a sufficiently smaller on-state resistance than the transistor Q13, and therefore, the node N5 attains the H level. Accordingly, the transistor Q7 turns on, the node N2 attains the L level, and the transistor Q13 turns off.

When the output signal of preceding stage $G_{k-1}$ returns back to the L level, the transistor Q12 turns off. However, since the transistors Q13 and Q14 are also off, the node N5 is maintained at the H level in high impedance state (floating state). Therefore, the transistor Q7 is maintained at on-state.

Thereafter, when the output signal of subsequent stage $G_{k+1}$ attains the H level, the transistor Q14 turns on, and the node N5 attains the L level. Accordingly, the transistor Q7 turns off, and the node N2 is charged via the transistor Q6, so that the node N2 attains the H level. Accordingly, the transistor Q13 turns on.

Even when the output signal of subsequent stage $G_{k+1}$ returns back to the L level, the transistor Q13 is maintained at on-state, and therefore, the node N5 is maintained at the L level in low impedance.

As described above, in the input circuit in the pull-down driving circuit 22 of FIG. 8, the node N5, i.e., the input end of the inverter, is changed to the H level in response to activation of the output signal of preceding stage $G_{k-1}$ (input signal), and is changed to the L level in response to activation of the output signal of subsequent stage $G_{k+1}$ (reset signal). Therefore, the node N2, i.e., the output end of the inverter, attains the L level in accordance with activation of the output signal of preceding stage $G_{k-1}$, and attains the H level in accordance with activation of the output signal of subsequent stage $G_{k+1}$. In other words, the level of the node N2 changes in substantially the same manner as that in the circuit of FIG. 3. Therefore, the unit shift register $SR_k$ of FIG. 8 can perform shift operation of the signal in the same manner as the circuit of FIG. 3.

According to this modification, the node N1 and the pull-down driving circuit 22 are electrically separated from each other, and therefore, the parasitic capacity of the node N1 is less than that of the circuit of FIG. 3. Therefore, the node N1 is increased to a higher potential in a shorter time at which the output signal $G_k$ is activated. Therefore, when the output signal $G_k$ is activated, the transistor Q1 has a smaller on-state resistance, and the rising rate of the output signal $G_k$ can be made faster.

Figure 9:
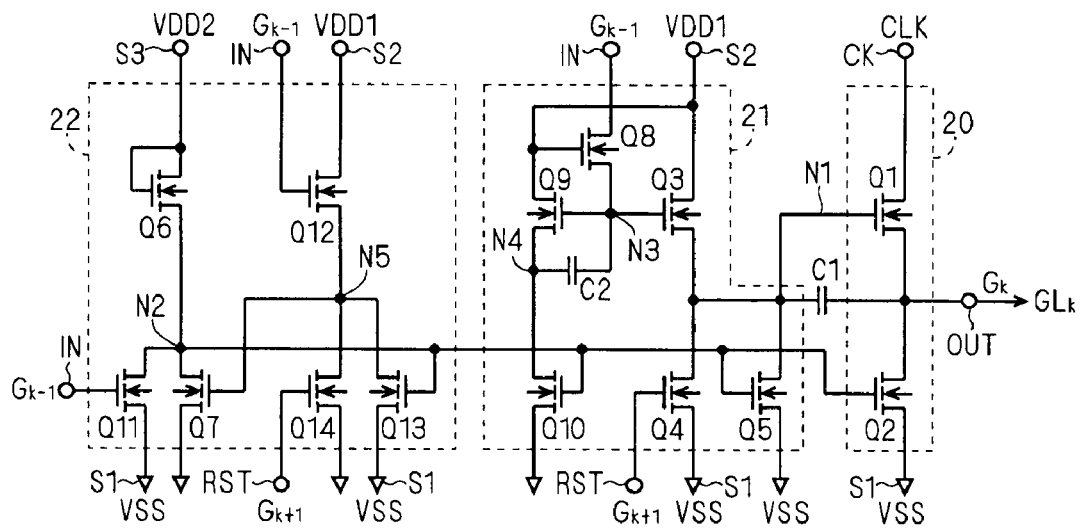
FIG. 9 is a circuit diagram showing the unit shift register according to the fifth modification of the first embodiment.

FIG. 9 shows an example in which the above second modification is applied to the pull-down driving circuit 22 of FIG. 8. Specifically, the transistor Q11 whose gate is connected to the input terminal IN is arranged between the node N2 and the first power supply terminal S1.

In the unit shift register $SR_k$ of FIG. 9, when the output signal of preceding stage $G_{k-1}$ is activated, the transistor Q11 turns on to cause the node N2 to be at the L level. Therefore, the transistor Q13 turns off at substantially the same time as the transistor Q3 turns on, in which state the node N5 is charged. Therefore, the node N5 can be charged regardless of the on-state resistance values of the transistors Q12 and Q13. However, it is necessary to configure the discharge time of the node N2 such that the node N3 increases to a sufficiently high level before the time (the time tD) when the potential at the node N3 is increased by the output (the signal of the node N4) of the inverter constituted by the transistors Q9 and Q10. It should be understood that in FIG. 9, the ratio between the on-state resistance values of the transistors Q3 and Q5 may also be arbitrary.

Figure 10:
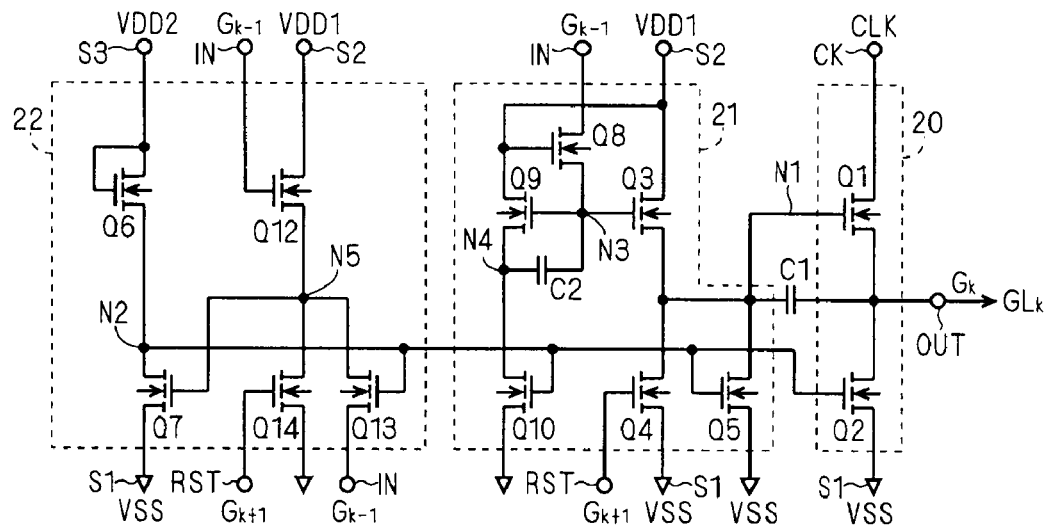
FIG. 10 is a circuit diagram showing the unit shift register according to the fifth modification of the first embodiment.

FIG. 10 shows an example in which the above technique of the third modification is applied to the pull-down driving circuit 22 of FIG. 8 Specifically, the source of the transistor Q13 in the pull-down driving circuit 22 is connected to the input terminal IN.

In the unit shift register $SR_k$ of FIG. 6, when the output signal of preceding stage $G_{k-1}$ is activated, the transistor Q13 turns off because the source potential thereof increases. Therefore, the transistor Q13 turns off at substantially the same time as the transistor Q3 turns on, in which state the node N5 is charged. Therefore, the node N5 can be charged regardless of the on-state resistance values of the transistors Q12 and Q13, and the circuit can be easily designed.

[Sixth Modification]

In order to make a resolution higher in a display apparatus using a shift register as a gate line driving circuit, it is necessary to make operation rate of the shift register faster by increasing a frequency of a clock signal used to drive the shift register. However, when the clock signal is a high frequency, the pulse width thereof becomes narrower, which reduces a margin for operation of the shift register. Therefore, in order to prevent the margin from decreasing, the pulse width of the clock signal is set as wide as possible. In other words, an interval between activated periods of each clock signal (Δt of FIG. 37) is set extremely small.

When the interval between the activated periods of each clock signal is set extremely small, the level of the output signal of subsequent stage $G_{k+1}$ may begin to increase when the level of the output signal $G_k$ of the unit shift register $SR_k$ has not sufficiently decreased, because it takes a certain period of time to discharge the output terminal OUT. In such case, for example, in the unit shift register $SR_k$ of FIG. 3, before the output terminal OUT is sufficiently discharged, the transistor Q4 turns on and the level of the node N1 decreases, so that the resistance value of the transistor Q1 increases. Accordingly, there arises a problem in that the falling rate of the output signal $G_k$ (discharge rate of the output terminal OUT) decreases.

One of the measures for this problem is to configure the transistor Q2 to have a low on-state resistance so that the output terminal OUT is swiftly discharged in accordance with the rise of the output signal of subsequent stage $G_{k+1}$. However, in order to decrease the on-state resistance of the transistor Q2, it is necessary to widen the gate width thereof, which increases the circuit area. A modification capable of solving the above problem while suppressing the increase of the circuit area will be hereinafter shown.

Figure 11:
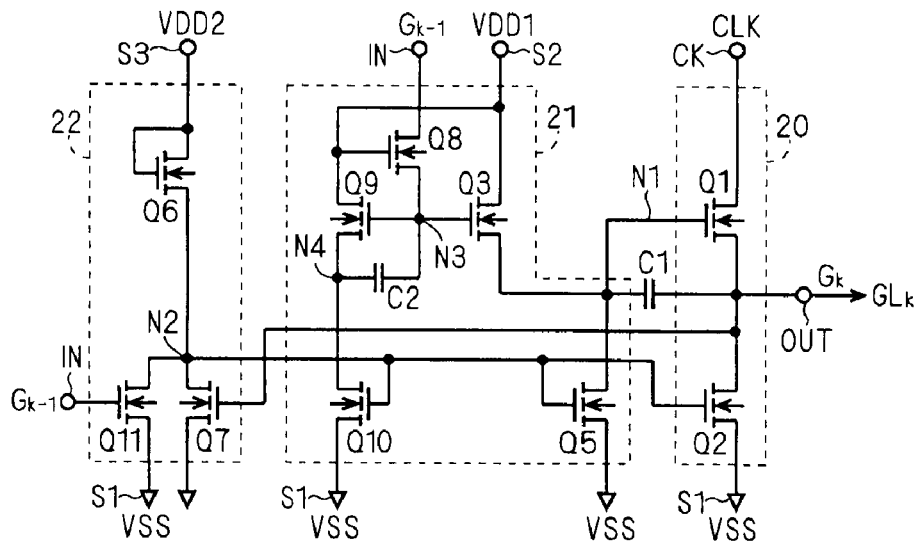
FIG. 11 is a circuit diagram showing the unit shift register according to the sixth modification of the first embodiment.

FIG. 11 is a circuit diagram showing the unit shift register $SR_k$ according to the sixth modification of the first embodiment. This unit shift register $SR_k$ is based on the circuit of FIG. 3, and is configured such that the input end of the pull-down driving circuit 22 (the gate of the transistor Q7) is connected to the output terminal OUT and that the transistor Q11 whose gate is connected to the input terminal IN is arranged between the node N2 and the first power supply terminal S1. Furthermore, when the unit shift register $SR_k$ transits from the set-state to the reset-state, the unit shift register $SR_k$ can use the transistor Q5 to discharge the node N1 without being affected by the output signal of subsequent stage $G_{k+1}$ (which will be later explained in detail), and therefore the transistor Q4 is omitted.

Operation of the pull-down driving circuit 22 in the unit shift register $SR_k$ of FIG. 11 will be hereinafter described. Herein, it is assumed that no interval is arranged between activated periods of the clock signals CLK and /CLK (Δt=0). Specifically, the rise of the clock signal CLK and the fall of the clock signal /CLK are assumed to occur at a time, and the fall of the clock signal CLK and the rise of the clock signal /CLK are assumed to occur at a time.

In the initial state of the pull-down driving circuit 22, both of the output signal $G_k$ of the unit shift register $SR_k$ and the output signal $G_{k-1}$ of the preceding stage are assumed to be at the L level. At this moment, the transistors Q7 and Q11 are off-state, and therefore, the node N2 is at the H level. In this state, the transistor Q5 is on, the transistor Q3 is off, and the node N1 is at the L level. Therefore, the unit shift register $SR_k$ is in the reset-state.

In the selection period of the gate line $GL_{k-1}$ after the above state, the output signal of preceding stage $G_{k-1}$ attains the H level, and then, the transistor Q11 turns on. The transistor Q11 has a sufficiently smaller on-state resistance than the transistor Q6, and therefore, the node N2 attains the L level. Accordingly, the transistor Q2 turns off.

At this moment, in the pull-up driving circuit 21, the transistor Q5 turns off, and the transistor Q3 turns on, and therefore, the node N1 is charged (pre-charged) to the H level. Therefore, the transistor Q1 turns on. In other words, the unit shift register $SR_k$ attains the set-state.

When the output signal of preceding stage $G_{k-1}$ returns back to the L level, and the clock signal CLK changes to the H level, the output signal $G_k$ accordingly changes to the H level. At this moment, the transistor Q11 turns off, but instead, the transistor Q7 turns on. Therefore, the node N2 is maintained at the L level, and the transistor Q2 is maintained in the off-state.

Thereafter, when the clock signal CLK returns back to the L level, the output terminal OUT is discharged via the transistor Q1 in the on-state, and the level of the output signal $G_k$ decreases. The level of the output signal $G_k$ sufficiently decreases and becomes less than the threshold voltage Vth of the transistor Q7, the transistor Q7 turns off, and the node N2 attains the H level. Accordingly, the transistor Q2 turns on.

At this moment, in the pull-up driving circuit 21, the transistor Q5 turns on, and the node N1 is discharged to the L level. Accordingly, the transistor Q1 turns off. In other words, the unit shift register $SR_k$ returns back to the reset-state.

As described above, in the pull-down driving circuit 22 of FIG. 11, the node N2 is at the L level from the rise of the output signal of preceding stage $G_{k-1}$ to the fall of the output signal $G_k$ of the unit shift register $SR_k$ (which occurs substantially at the same time as the rise of the output signal of subsequent stage $G_{k+1}$). In other words, the level of the node N2 changes in substantially the same manner as that in the circuit of FIG. 3. Therefore, the unit shift register $SR_k$ of FIG. 11 can perform shift operation of the signal in the same manner as the circuit of FIG. 3.

As can be understood from the above operation, when the output signal $G_k$ falls in the unit shift register SR of FIG. 11, the node N2 changes to the H level in accordance with the level of the output signal $G_k$ having sufficiently decreased. Furthermore, when the node N2 attains the H level, and the transistor Q5 turns on, the node N1 is discharged. Therefore, a time at which the transistor Q1 turns off is always after the level of the output signal $G_k$ has sufficiently decreased. Therefore, even when the interval between activated periods of the clock signals CLK and /CLK ($\Delta t$) is small, the falling rate of the output signal $G_k$ does not decrease at all Furthermore, since the node N1 and the pull-down driving circuit 22 are electrically separated from each other, and the transistor Q4 is not arranged, the parasitic capacity of the node N1 is less than that of the circuit of FIG. 3. Therefore, the effect of increasing the rising rate of the output signal $G_k$ can be obtained in the same manner as the fifth modification (FIG. 8).

Second Embodiment

Figure 12:
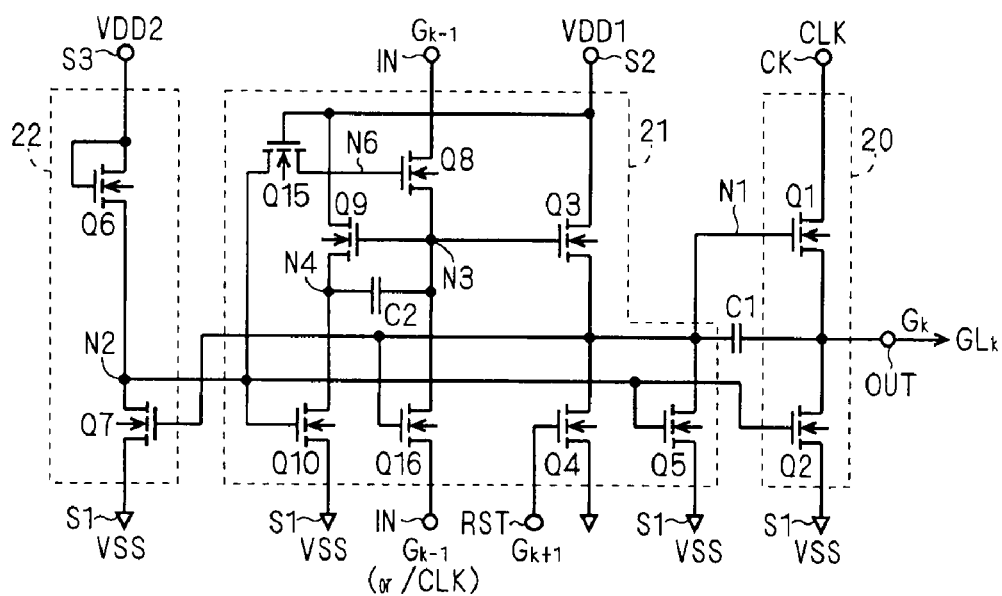
FIG. 12 is a circuit diagram showing a unit shift register according to the second embodiment.

FIG. 12 is a circuit diagram showing a unit shift register $SR_k$ according to the second embodiment. This unit shift register $SR_k$ has, in addition to the circuit of FIG. 3, a transistor Q15 connected between the gate of the transistor Q8 and the node N2 (the gate of the transistor Q8 is separated from the second power supply terminal S2) and a transistor Q16 connected between the node N3 and the input terminal IN. The gate of the transistor Q15 is connected to the second power supply terminal S2, and the gate of the transistor Q16 is connected to the node N1. A node connected to the gate of the transistor Q8 is defined as "node N6."

In the circuit of FIG. 12, the input terminal IN is connected to the source of the transistor Q16, which means that the output signal of preceding stage $G_{k-1}$ is supplied thereto, but the clock signal /CLK having the same phase as the output signal of preceding stage $G_{k-1}$ may be supplied instead.

Figure 13:
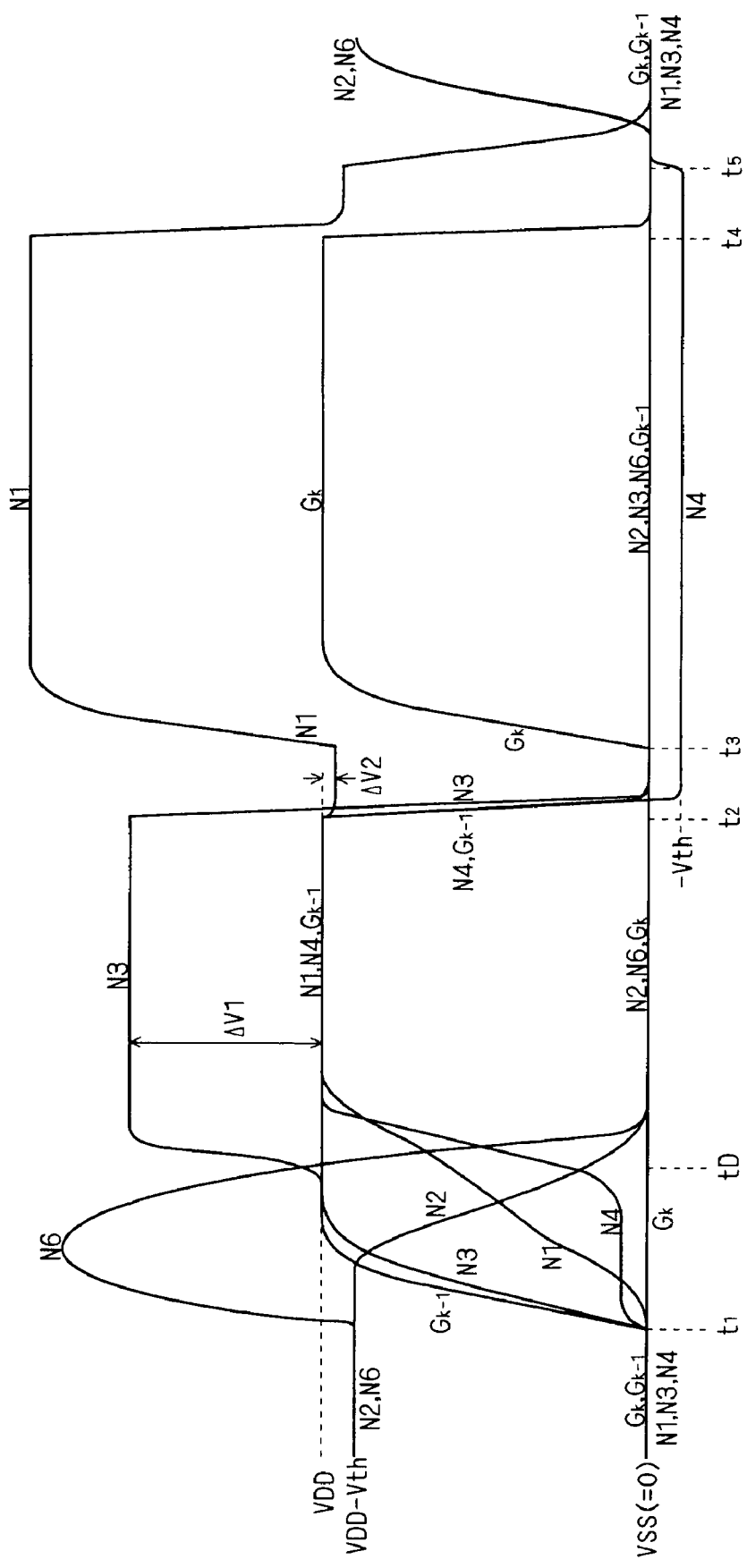
FIG. 13 is a timing chart illustrating operation of the unit shift register according to the second embodiment.

FIG. 13 is a timing chart for illustrating operation of the unit shift register according to the second embodiment. The operation of the unit shift register $SR_k$ will be explained with reference to FIG. 13. Herein, the clock signal CLK is assumed to be input to the clock terminal CK of the unit shift register $SR_k$.

The initial state of the unit shift register $SR_k$ (the state immediately before the time $t_1$) is assumed to be such that the node N1 is at the L level (VSS) and the node N2 is at the H level (VDD−Vth) (the reset-state). In this state, the transistor Q1 is off, and the transistor Q2 is on, and therefore, the output signal $G_k$ is maintained at the L level regardless of the level of the clock signal CLK.

At the time immediately before the time $t_1$, all of the clock terminal CK (the clock signal CLK) of the unit shift register $SR_k$, the reset terminal RST (the output signal of subsequent stage $G_{k+1}$), and the input terminal IN (the output signal of preceding stage $G_{k-1}$) are assumed to be at the L level. In this case, the node N2 is at the high level, and therefore, the node N6 is charged via the transistor Q15, so that the node N6 is at the H level (VDD−Vth). Accordingly, the transistor Q8 is in the on-state, and the node N3 is at the L level (VSS). Furthermore, since the transistor Q10 is on, the node N4 is also at the L level (VSS).

At the time $t_1$, the clock signal /CLK (not shown) is assumed to change from the above state to the H level, and further, the output signal of preceding stage $G_{k-1}$ (the start pulse SP in a case of the unit shift register $SR_1$ of the 1st stage) is assumed to be activated. Accordingly, the source potential of the transistor Q16 increases, and the transistor Q16 attains the off-state. Since the transistor Q8 is in the on-state, the level of the node N3 increases in accordance with the increase in the level of the output signal of preceding stage $G_{k-1}$.

When the levels of the node N3 and the output signal of preceding stage $G_{k-1}$ increase as described above, the level of the node N6 is increased with the coupling via the capacitance between the gate and channel of the transistor Q8 in on-state. The level at the node N6 increases to a level high enough to allow the transistor Q8 to operate in the non-saturated region, and therefore, the level of the node N3 rapidly attains the potential VDD to follow the output signal of preceding stage $G_{k-1}$.

When the node N3 attains the H level, the transistor Q3 turns on. At this moment, since the node N2 is at the H level, the transistor Q5 is also on. But the transistor Q3 is configured to have a sufficiently smaller on-state resistance (a wider gate width) than the transistor Q5, and therefore, the level of the node N1 begins to increase. Then, when the level of the node N1 exceeds the threshold voltage (Vth) of the transistor Q7, the transistor Q7 turns on, and the level of the node N2 begins to decrease.

At this moment, since the on-state resistance value of the transistor Q5 increases in accordance with the decrease in the level of the node N2, the rising rate of the level of the node N1 increases. Accordingly, since the on-state resistance of the transistor Q7 decreases, the falling rate of the level of the node N2 increases. This loop further accelerates the rising rate of the level of the node N1 and the falling rate of the level of the node N2.

When the level of the node N2 decreases, a current flows from the node N6 to the node N2 via the transistor Q15, so that the node N6 is discharged. The node N6 attains the L level of the potential VSS, which is the same level as the node N2. Therefore, the transistor Q8 turns off.

When the level of the node N2 attains the L level, the level of the node N4. i.e., the output end of the inverter constituted by the transistors Q9 and Q10, changes from the L level to the H level (time tD). Since the transistor Q8 is in the off-state at this moment, the node N3 is in high impedance state (floating state).

The increase in the level of the node N4 causes the level of the node N3 to further increase from the potential VDD with the coupling via the capacitive element C2. Therefore, the on-state resistance of the transistor Q9 decreases, and accordingly, the rising rate of the level of the node N4 increases. This positive feedback loop rapidly increases the levels of the nodes N3 and N4.

The time tD at which the level of the node N4 increases (i.e., the time at which the output level of the inverter constituted by the transistors Q9 and Q10 changes from the L level to the H level) is configured to be after the level of the node N3 has sufficiently increased as shown in FIG. 13 (the time tD is determined based on, e.g., the ratio between the on-state resistances of the transistors Q3 and Q5 and the discharge time constant of the node N2). Therefore, as a result of the potential at the node N3 increased in accordance with the increase in the level of the node N4, the node N3 attains a potential high enough (VDD+$\Delta$V1) to cause the transistor Q3 to operate in the non-saturated region. More specifically, the voltage of the node N3 becomes larger than the amplitude (VDD) of the output signal of preceding stage $G_{k-1}$. At this time, if VDD+$\Delta$V1$\geq$VDD+Vth, i.e., $\Delta$V1$\geq$Vth, the transistor Q3 operates in the non-saturated region.

Therefore, the node N1 is rapidly charged (pre-charged) via the transistor Q3, and increases to the same potential VDD as the second power supply terminal S2, so that the node N1 attains the H level. Similarly, the transistor Q9 operates in the non-saturated region, and therefore, the potential at the node N4 attains VDD.

When the node N1 attains the H level, the transistor Q7 of the pull-down driving circuit 22 turns on, and the node N2 is discharged to the L level. As a result, the transistor Q1 turns on, and the transistor Q2 turns off (set-state). However, at this moment, since the clock signal CLK is at the L level, the output signal $G_k$ is still at the L level.

Herein, attention is given to the operation of the transistor Q15 during the pre-charge of the node N1. Before the node N1 is pre-charged, the node N2 is at the H level (VDD−Vth), and the gate voltage of the transistor Q15 is fixed to VDD (=VDD1). Therefore, the transistor Q15 allows a current to flow from the node N2 to the node N6, so that the node N6 is charged to the H level (VDD−Vth).

Then, when the output signal of preceding stage $G_{k-1}$ rises, and the transistor Q3 begins to pre-charge the node N1, the potential at the node N6 is increased. Therefore, a terminal of the transistor Q15 connected to the node N2 becomes the source due to the relationship between potentials. Therefore, a voltage between the gate (the second power supply terminal S2) and the source (the node N2) of the transistor Q15 is Vth, and the transistor 15 is in a boundary state between on and off. At this moment, a sub-threshold current flows in the transistor Q15 from the node N6 to the node N2. But this is a minute current, and therefore, the charge released from the node N6, in a short period of time in which the potential at node N6 is being increased (approximately equal to tD−$t_1$), is so little that it can almost be ignored.

Then, as the node N1 is further pre-charged, the transistor Q7 turns on, and the level of the node N2 decreases. Therefore, a current flows in the transistor Q15 from the node N6 to the node N2, so that the node N6 is discharged to the L level (VSS). Thereafter, while the node N2 is at the L level, the transistor Q15 is in the on-state, and the node N6 is maintained at the L level.

As described above, before the pre-charge of the node N1, the transistor Q15 serves as a resistive element for transmitting the potential in the node N2 to the node N6. When the potential at the node N6 is being increased at the start of the pre-charge of the node N1, the transistor Q15 serves as a blocking element for insulating between the node N6 and the node N2. When the node N1 is further pre-charged, and the level of the node N2 decreases and is thereafter maintained at the L level, the transistor Q15 serves as a resistive element for discharging the charges from the node N6 to the node N2.

When the clock signal /CLK falls at the time $t_2$, the output signal of preceding stage $G_{k-1}$ changes to the L level. Then, the node N3 of the unit shift register $SR_k$ is discharged via the transistor Q16, so that the node N3 attains the L level. Therefore, the transistors Q3 and Q9 turn off.

At this moment, as the node N3 changes from the H level (VDD+$\Delta$V1) to the L level (VSS), the level of the node N4 also decreases with the coupling via the capacitive element C2. While the level of the node N3 decreases, the transistor Q9 turns off, and the transistor Q10 also turns off, so that the node N4 attains the floating state. Therefore, the level of the node N4 decreases to less than VSS, and becomes a negative voltage. However, the gate potentials of the transistors Q9 and Q10 are VSS, and when the node N4 decreases to less than −Vth, the transistors Q9 and Q10 turn on, so that the level of the node N4 is clamped to −Vth.

When the transistor Q3 turns off while the node N3 falls, the level of the node N1 slightly decreases ($\Delta$V2 of FIG. 13) with the coupling via the gate capacitance of the transistor Q3. This decrease in the level of the node N1 also occurs with a conventional unit shift register. Since the gate potential of the transistor Q3 is increased to a higher potential (VDD+$\Delta$V1), the gate potential of the transistor Q3 changes more greatly. Therefore, $\Delta$V2 is larger than that of the conventional unit shift register, but the level of the node N1 is higher than the conventional unit shift register even after the gate potential drops by $\Delta$V2.

The operation after the time $t_3$ is the same as the operation (FIG. 4) of the unit shift register $SR_k$ of FIG. 3, and therefore, the explanation thereabout is omitted.

In the unit shift register $SR_k$ according to the present embodiment, the transistor Q8 operates in the non-saturated region to charge the node N3, and therefore, the rising rate of the level of the node N3 is extremely fast. Therefore, the node N3 can be easily increased to a sufficiently high level before the time tD. (In other words, the time tD can be easily configured to be after the time at which the node N3 has increased to a sufficiently high level.) Furthermore, a loss corresponding to the threshold voltage of the transistor Q8 does not occur when the node N3 is charged, and therefore, the transistor Q8 can charge the node N3 to the potential VDD.

Therefore, according to the present embodiment, the potential at the node N3 (VDD+ΔV1) having been increased with the capacitive element C2 can be easily made higher than that of the first embodiment. As a result, the on-state resistance of the transistor Q3 decreases, and the node N1 can be charged (pre-charged) in a shorter time, so that the unit shift register $SR_k$ can operate faster.

[Modification]

The first to the sixth modifications described in the first embodiment can also be applied to the present embodiment.

Third Embodiment

Figure 14:
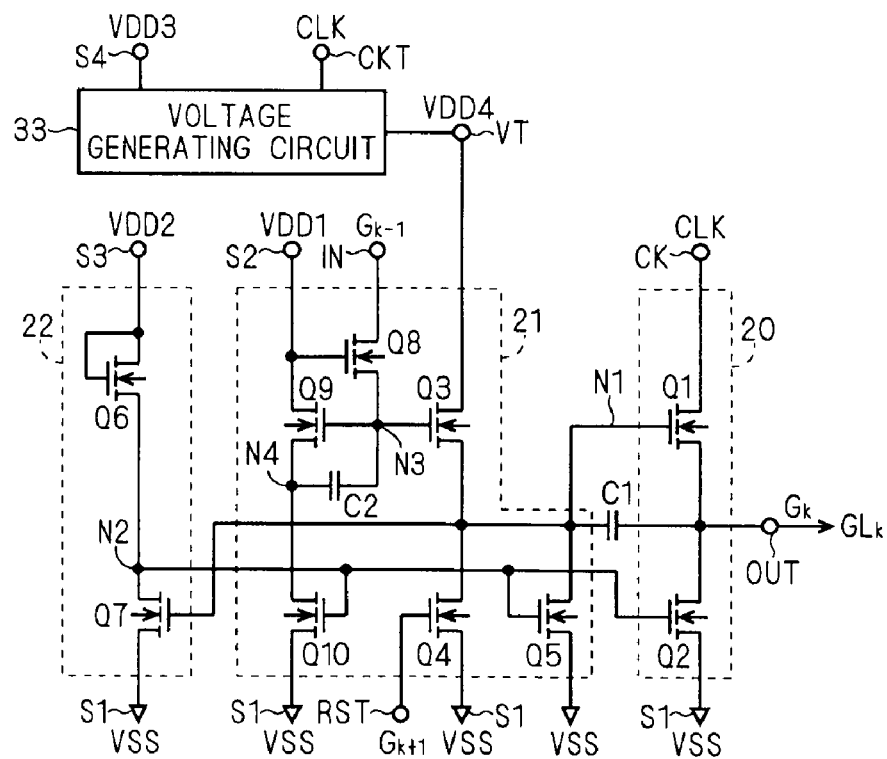
FIG. 14 is a circuit diagram showing a unit shift register according to the third embodiment.

FIG. 14 is a circuit diagram showing a configuration of a unit shift register according to the third embodiment of the present invention. As shown in FIG. 14, in the present embodiment, a voltage generating circuit 33 for providing a predetermined potential VDD4 to the drain of the transistor Q3 is connected to the unit shift register SR according to the first embodiment (FIG. 3).

The voltage generating circuit 33 has a fourth power supply terminal S4 that is supplied with a high power supply potential VDD3, a voltage output terminal VT that outputs the potential VDD4, and at least one clock input terminal with which a predetermined clock signal is input (FIG. 14 shows the clock terminal CKT as a representative example). In the present embodiment, one of the multi-phase clock signals that drive the cascade-connected unit shift register circuits SR (i.e., the gate line driving circuit 30) is used as the clock signal input to the clock input terminal (FIG. 14 shows the clock signal CLK as a representative example).

The voltage generating circuit 33 generates the output potential VDD4 that is higher than the power-supply potential VDD3, on the basis of the potential VDD3 supplied to the fourth power-supply terminal S4 and the clock signal input to the clock input terminal CKT. The potential VDD4 is higher than the amplitude of the clock signals (H level potential), with respect to the low power-supply potential VSS.

Figure 15:
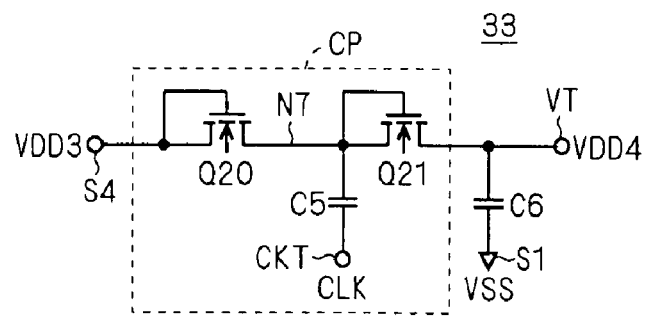
FIG. 15 is a circuit diagram showing a voltage generation circuit according to the third embodiment.

FIG. 15 shows an example of a specific circuit configuration of the voltage generating circuit 33. The voltage generating circuit 33 uses a charge pump circuit CP in order to obtain the high potential output. The charge pump circuit CP includes transistors Q20 and Q21 and a capacitive element C5. The output end of the charge pump circuit CP, i.e., the voltage output terminal VT, is provided with a capacitive element C6.

In the present embodiment, the voltage generating circuit 33 (the charge pump circuit CP and the stabilizing capacitance C6) is formed on the same insulating substrate as that formed with the shift register circuit. Basically, a charge pump circuit is formed of at least two rectifier elements (diode elements) and at least one capacitive element. As the diode elements, the present embodiment uses the diode-connected transistors Q20 and Q21 that have the same structure as those used in the shift register circuit. Also, the capacitive element C5 having the same structure as the pixel capacitances (the capacitors 17 shown in FIG. 1) is used as the capacitive element. The capacitive element C6 is provided to stabilize the output of the charge pump circuit CP, and the capacitive element C6, too, has the same structure as the pixel capacitances. This allows the voltage generating circuit 33 to be fabricated in parallel with the fabrication of the shift register and pixel circuitry, without requiring an increased number of manufacturing process steps and at less manufacturing costs.

As shown in FIG. 15, the transistors Q20 and Q21 as diode elements (hereinafter, referred to respectively as "diode element Q20" and "diode element Q21") are connected in series between the fourth power-supply terminal S4 supplied with the high power-supply potential VDD3 and the voltage output terminal VT outputting the output potential VDD4. The diode elements Q20 and Q21 are both connected such that they have their anodes on the side of the fourth power-supply terminal S4 and their cathodes on the side of the voltage output terminal VT.

Where the connection node between the diode elements Q20 and Q21 is defined as "node N7", the capacitive element C5 is connected between the clock input terminal CKT and the node N7. The capacitive element C5 is provided to perform a charge-pump operation to repeatedly increase the potential at the node N7, and therefore, an arbitrary clock signal can be input to the clock input terminal CKT. The clock signal may be any of the clock signals CLK and /CLK that drive the unit shift register circuits SR. This avoids the necessity of separately providing a clock signal generating circuit for driving the charge pump circuit CP, thus avoiding increased circuit scale. In the present embodiment, it is assumed that the clock signal CLK is input to the clock input terminal CKT of the circuit of FIG. 15. The capacitive element C5 is hereinafter referred to as "charge pump capacitance."

The capacitive element C6 is provided to stabilize the output potential VDD4 when a current flows from the voltage output terminal VT to the load (the node N1 of the unit shift register SR), and the capacitive element C6 is connected between the voltage output terminal VT and the first power-supply terminal S1 that is supplied with the low power-supply potential VSS. The capacitive element C6 is hereinafter referred to as "stabilizing capacitance". One end of the stabilizing capacitance C6 is not necessarily connected to the first power-supply terminal S1, and it can be connected to any low-impedance node that is supplied with a constant voltage.

Hereinafter, the operation of the circuit of FIG. 15 will be described. All of the threshold voltages of the transistors of the voltage generating circuit 33 are assumed to be the same value, Vth.

When the high power-supply potential VDD3 is supplied to the fourth power-supply terminal S4, the diode element Q20 turns on and the potential at the node N7 attains VDD3−Vth. Furthermore, the potential at the node N7 turns on the diode element Q21, and the potential at the voltage output terminal VT attains VDD3−2*Vth.

Thereafter, the clock signal CLK (amplitude VDD) rises, and then the coupling through the charge pump capacitance C5 increases the potential at the node N7. When the parasitic capacitance of the node N7 is ignored, the potential at the node N7 rises to VDD3−Vth+VDD. The potential risen at the node N7 causes the diode element Q21 to turn on, and a current flows from the node N7 to the voltage output terminal VT. This raises the level of the voltage output terminal VT by a certain amount, and in the contrary, the level of the node N7 is lowered by an amount corresponding to the charge flown out.

Then, when the clock signal CLK falls, the potential at the node N7 is pulled down by the coupling through the charge pump capacitance C5. When the potential at the node N7 was increased as mentioned above, a charge flew out from the node N7 to the voltage output terminal VT. Accordingly, after the potential was pulled down, the level of the node N7 is lower than the level VDD3−Vth that it exhibited before the potential at the node N7 was increased (before the rise of the clock signal CLK). However, the lowering of the potential at the node N7 causes the diode element Q20 to turn on, and therefore, the node N7 is soon charged by the power supply terminal S4 and returns to VDD3−Vth.

It should be noted that the potential at the node N7 is lower than that at the voltage output terminal VT, because the potential at the voltage output terminal VT was raised when the potential of the node N7 was increased as mentioned above, but the potential at the voltage output terminal VT is maintained at the raised level because the diode element Q21 blocks current flow in the direction from the voltage output terminal VT to the node N7.

Subsequently, this operation is repeated at each input of the clock signal CLK, and ultimately, the potential VDD4 at the voltage output terminal VT attains VDD3−2*Vth+VDD.

Now, it is assumed that the potentials VDD1 to VDD3 all have an equal value and that value is VDD which is equal to the H level of the clock signals CLK and /CLK. In such case, the final output potential VDD4 of the voltage generating circuit 33 is 2*VDD−2*Vth, which is given as the drain potential of the transistor Q3. Under the same assumption, the drain potential of the transistor Q3 of the unit shift register circuit SR of the first embodiment is, for example, VDD (=VDD1). That is, according to the unit shift register circuit SR of the present embodiment, the voltage generating circuit 33 supplies the drain of the transistor Q3 with the potential VDD4 (=2*VDD−2*Vth) higher than the H level of the clock signals CLK and /CLK even when each of the high power-supply potentials VDD1 to VDD3 is the potential VDD, which equals to the H level of the clock signals CLK and /CLK (in other words, the drain of the transistor Q3 is provided with a voltage larger than the amplitude of clock signals CLK and /CLK).

Therefore, in the present embodiment, the transistor Q3 is capable of charging (pre-charging) the gate of the transistor Q1 (the node N1) to a higher potential than that in the first embodiment. This allows the transistor Q1 to exhibit a smaller on-state resistance when the output signal $G_k$ is output, which allows the output signal $G_k$ to rise and fall more quickly, thus allowing the shift register circuit to operate at higher rate. In other words, the rising and falling rates of the output signal $G_k$ are not lowered even when the channel width of the transistor Q1 is reduced, which allows a reduction of the area required for the shift register circuit.

The effects of the present embodiment will be hereinafter described more specifically. The amplitude (H level potential) of the clock signals CLK and /CLK is assumed to be VDD again. Then, in the unit shift register SR shown in FIG. 14, when the potential at the gate of the transistor Q3 (the node N3) is increased to the same level as that of the first embodiment (VDD+ΔV1 of FIG. 4) during the precharge of the node N1, this level is less than VDD4(=2*VDD−2*Vth). In other words, the potential at the gate of the transistor Q3 (the node N3) attains less than the potential at the drain (the second power supply terminal S2), and the transistor Q3 can charge the node N1 while operating in the saturated region. Therefore, a level Vb [N1] at the pre-charged node N1 is expressed by Expression (2) below.

$$Vb[N1] = VDD + \Delta V1 - Vth \quad (2)$$

As explained in the first embodiment, the potential at the node N3 having been increased, VDD+ΔV1, is configured to be a potential high enough to allow the transistor Q3 to operate in the non-saturated region, i.e., a value larger than VDD+Vth. In other words, ΔV1 is configured to be at least larger than the threshold voltage Vth of the transistor Q3, so that the following Expression (3) is satisfied.

$$\Delta V1 - Vth > 0 \quad (3)$$

The following Expression (4) is obtained from the above Expressions (2) and (3).

$$Vb[N1] > VDD \quad (4)$$

Accordingly, the level (Vb [N1]) at the pre-charged node N1 of the present embodiment is more than the level (VDD) of the pre-charged node N1 of the first embodiment. Therefore, the above-explained effects can be obtained.

The present embodiment has shown an example in which the voltage generating circuit 33 (the charge pump circuit CP and the stabilizing capacitance C6) are formed on the same substrate as that formed with the shift register circuit, but all or part of its components may be formed externally to the substrate and connected thereto. This reduces the required area of the substrate, but the number of terminals is increased because it requires formation of external connection terminals on the substrate to connect the circuitry in the substrate and the voltage generating circuit 33 (or part of it).

For example, the diode elements of the charge pump circuit CP of the voltage generating circuit 33 may be formed on the same substrate as that formed with the shift register circuit, with the capacitive elements (the charge pump capacitance and the stabilizing capacitance) formed as external components. This makes it possible to simplify the manufacturing process by fabricating the diode elements as transistors having the same structure as those of the shift register circuit, and also facilitates provision of capacitive elements with larger capacitances. Furthermore, the parasitic capacitance of the circuit can be reduced by forming the diode elements and the stabilizing capacitance as external components and the charge pump capacitance within the substrate.

[First Modification]

The voltage generating circuit 33 shown in FIG. 15 supplies charge to the voltage output terminal VT through the charge pump capacitance C5 when the clock signal CLK rises, but the supply of charge to the voltage output terminal VT disappears when the clock signal CLK falls. Accordingly, while the clock signal CLK is at the L level, the voltage generating circuit 33 supplies current to the load (the node N1 of the unit shift register circuit SR) with the charge accumulated in the voltage stabilizing capacitance C6. That is, while the clock signal CLK is at the L level, the charge of the stabilizing capacitance C6 is only discharged, and the potential at the voltage output terminal VT (potential VDD4) decreases. In the first modification of the present embodiment, an exemplary configuration of the voltage generating circuit 33 for coping with this issue will be shown.

Figure 16:
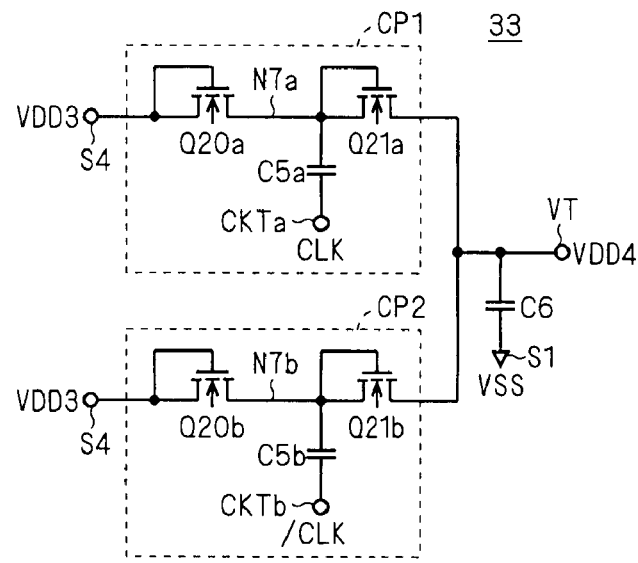
FIG. 16 is a circuit diagram showing a configuration of a voltage generation circuit according to the first modification of the third embodiment.

FIG. 16 is a circuit diagram illustrating the configuration of the voltage generating circuit 33 according to the first modification of the third embodiment. This voltage generating circuit 33 includes parallel-connected, two charge pump circuits CP1 and CP2.

The charge pump circuit CP1 includes diode-connected transistors (diode elements) Q20a and Q21a, and a charge pump capacitance C5a connected between a clock input terminal CKTa and a node N7a between the diode elements Q20a and Q21a. In the same way, the charge pump circuit CP2 includes diode elements Q20b and Q21b, and a charge pump capacitance C5b connected between a clock input terminal CKTb and a node N7b between the diode elements Q20b and Q21b. That is, each of the charge pump circuits CP1 and CP2 shown in FIG. 16 has the same configuration as the charge pump circuit CP shown in FIG. 15.

The respective clock input terminals CKTa and CKTb of the charge pump circuits CP1 and CP2 receive clock signals having different phases. In this modification, the clock signals CLK and /CLK that drive the shift register circuit (the gate line driving circuit 30) are used as the clock signals. That is, as shown in FIG. 16, the clock signal CLK is input to the clock input terminal CKTa, and the clock signal /CLK is inputted to the clock input terminal CKTb.

Therefore, in the voltage generating circuit 33 shown in FIG. 16, the voltage output terminal VT is supplied with charge from the charge pump circuit CP1 when the clock signal CLK rises, and supplied with charge from the charge pump circuit CP2 when the clock signal /CLK rises. That is, the voltage output terminal VT is supplied with charge alternately by the clock signals CLK and /CLK, which solves the problem of potential reduction at the voltage output terminal VT.

This modification has shown an example in which the voltage generating circuit 33 is formed of two charge pump circuits, but the voltage generating circuit 33 may be formed of a single charge pump circuit, when the reduction of level of the voltage output terminal VT is permissible to some extent.

[Second Modification]

The voltage generating circuit 33 for supplying the high power supply potential VDD4 to the drain of the transistor Q3 is not limited to the application to the circuit of FIG. 3, and may be applied to the unit shi register SR shown in any of the embodiments and modifications thereof.

However, when the voltage generating circuit 33 is applied to the unit shift register SR according to the second embodiment (FIG. 12), the following issues should be noted.

For example, when the output, potential VDD4 of the voltage generating circuit 33 is higher than the potential VDD1+Vth (=VDD+Vth), and the potential VDD4 is supplied to the drain of the transistor Q3 in FIG. 12, the level of the node N1 exceeds VDD+Vth while being pre-charged. Then, at that occasion, the transistor Q16 turns on, and the level of the node N3 increased with the capacitive element C2 returns to VDD. Accordingly, the transistor Q3 turns off, and then, the pre-charging of the node N1 finishes. Therefore, the effects of the present embodiment cannot be obtained sufficiently.

Figure 17:
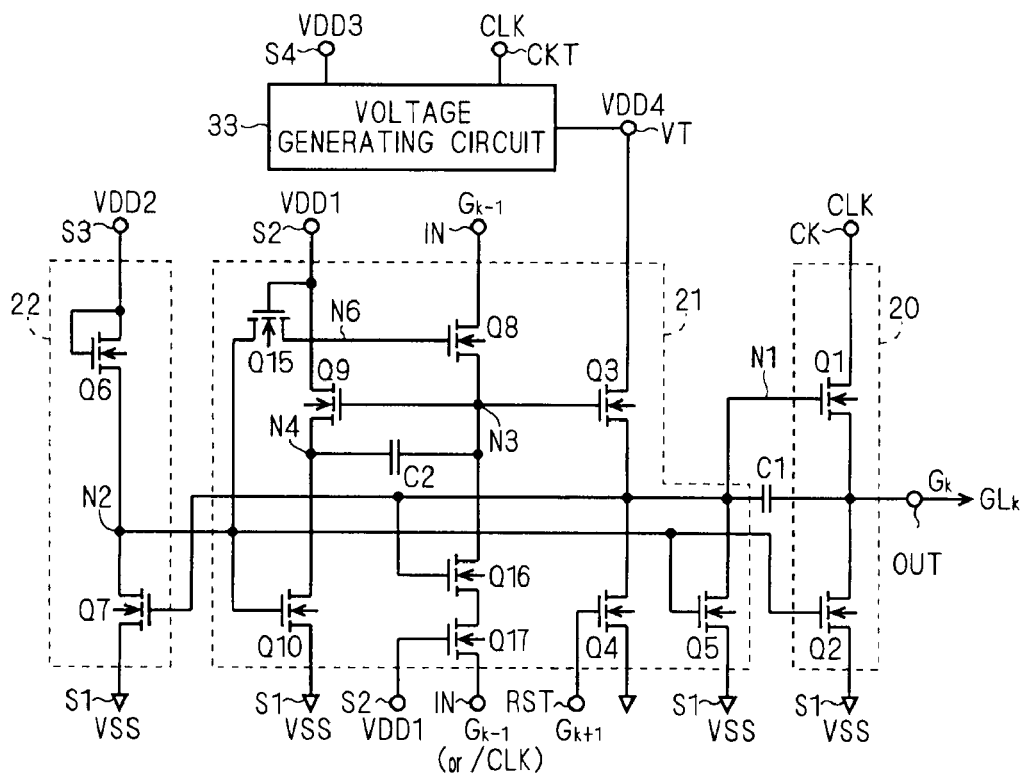
FIG. 17 is a circuit diagram showing a unit shift register according to the second modification of the third embodiment.

To obtain the effects, when the voltage generating circuit 33 is applied to the unit shift register SR according to the second embodiment, the transistor Q17 whose gate is connected to the second power-supply terminal S2 is to be connected in series with the transistor Q16 as shown in FIG. 17. It should be noted that the transistor Q17 may be placed between the source of the transistor Q16 and the input terminal IN as shown in FIG. 17, or may be placed between the drain of the transistor Q16 and the node N3.

In the circuit of FIG. 17, the transistor Q17 is off during a period in which the node N1 is pre-charged (i.e., a period in which the output signal of preceding stage $G_{k-1}$ is at the H level). Therefore, even when the level of the node N1 exceeds VDD+Vth, and the transistor Q16 turns on, the decrease in the level of the node N3 can be prevented. Therefore, the effects of the present embodiment can be sufficiently obtained.

[Third Modification]

Figure 18:
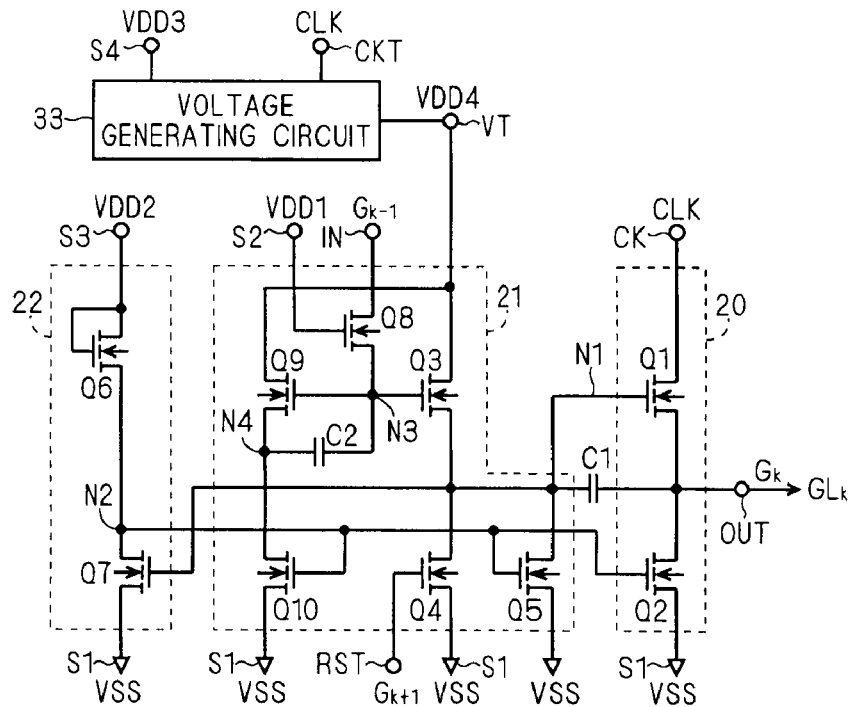
FIG. 18 is a circuit diagram showing a unit shift register according to the third modification of the third embodiment.

FIG. 18 is a circuit diagram showing the unit shift register according to the third modification of the third embodiment. This modification is based on the unit shift register SR (FIG. 3) according to the first embodiment, and is configured such that not only the transistor Q3 but also the drain of the transistor Q9 is supplied with the high power supply potential VDD4 generated by the voltage generating circuit 33.

In the circuit of FIG. 18, from when the node N3 begins to be charged and to when the potential of the capacitive element C2 is increased (between the time $t_1$ and the time tD in FIG. 4), there is a period in which both of the transistors Q9 and Q10 turn on. During that period, a relatively large flow-through current flows from the voltage output terminal VT to the power supply terminal S1. When the output impedance of the voltage generating circuit 33 is high, the output voltage VDD4 greatly decreases when the flow-through current occurs. Therefore, it is necessary to reduce the output impedance by appropriately setting the value of the charge pump capacitance.

For example, when the circuit of FIG. 15 is used as the voltage generating circuit 33 of FIG. 18, the drain potential of the transistor Q9 attains 2*VDD−2*Vth. Where it is assumed that the level of the node N3 has been increased a level high enough to allow the transistor Q9 to operate in the non-saturated region when the node N4 is charged, the node N4 attains the potential of 2*VDD−2*Vth upon the charging with the transistor Q9. In the circuit of FIG. 3, the potential at the node N4 is VDD after the charging. In the circuit of FIG. 15, the potential at the node N4 after the charging is more than that of the circuit of FIG. 3 by (2*VDD−2*Vth)−VDD=VDD−2*Vth.

Therefore, the potential at the node N3 in the circuit of FIG. 15 is increased to a potential higher than the potential at the node N3 of FIG. 3 (VDD+ΔV1) by the above difference. In other words, in the circuit of FIG. 15, the potential at the node N3 having been increased is (VDD+ΔV1)+(VDD−2*Vth)=2*VDD+ΔV1−2*Vth>2*VDD−Vth (derived from Expression (3)).

Therefore, the drain potential of the transistor Q9 is 2*VDD−2*Vth, and the gate potential of the transistor Q9 is a value more than 2*VDD−Vth. This satisfies the condition that the transistor Q9 operates in the non-saturated region, and therefore, does not contradict with the above assumption. In other words, the transistor Q9 operates in the non-saturated region. Since the transistor Q3 has the same drain potential and the gate potential as the transistor Q9, the transistor Q3 also operates in the non-saturated region. Therefore, the potential at the node N1 after the pre-charge is 2*VDD−2*Vth, which is the same as the drain potential of the transistor Q3.

The high power supply potential supplied to the shift register circuit is usually configured to be equal to the potential VDD of the clock signal at the H level. In this case, in the conventional unit shift register (FIG. 7 of Japanese Patent Application Laid-open No. 2004-78172), the potential at the gate (corresponding to the node N1) of the output pull-up transistor, corresponding to the transistor Q1, is VDD−Vth after the pre-charge. An on-state resistance of a transistor is proportional to a voltage between gate and source thereof, and therefore, the on-state resistance value of the transistor Q1 of this modification is (VDD−Vth)/(2*VDD−2*Vth)=½ times larger than, i.e., half of, that of the conventional unit shift register.

As described above, in this modification, even when the output potential VDD4 of the voltage generating circuit 33 (the drain potential of the transistor Q3) is high, the transistor Q3 can operate in the non-saturated region. In other words, the potential at the node N1 having been pre-charged by the transistor Q3 can be increased to the same level as the output potential VDD4 of the voltage generating circuit 33.

This modification can also be applied to the unit shi register SR shown in any of the embodiments and modifications thereof, but when this modification is applied to the unit shift register SR of the second embodiment (FIG. 12), it is necessary to arrange the transistor Q17 in series with the transistor Q16 in the same manner as in FIG. 17. In such case, the gate of the transistor Q15 is not to be connected with the voltage generating circuit 33, but is to be connected to the second power supply terminal S2 as it is. This is because, when the gate potential of the transistor Q15 is configured to be VDD4 higher than VDD, the transistor Q15 turns on when the potential of the node N6 is increased, so that the transistor Q15 does not serve as the blocking element.

Fourth Embodiment

In the fourth embodiment, the present invention is applied to a shift register which can change a shift direction of a signal. The gate line driving circuit 30 configured with such shift register can scan in both directions.

Figure 19:
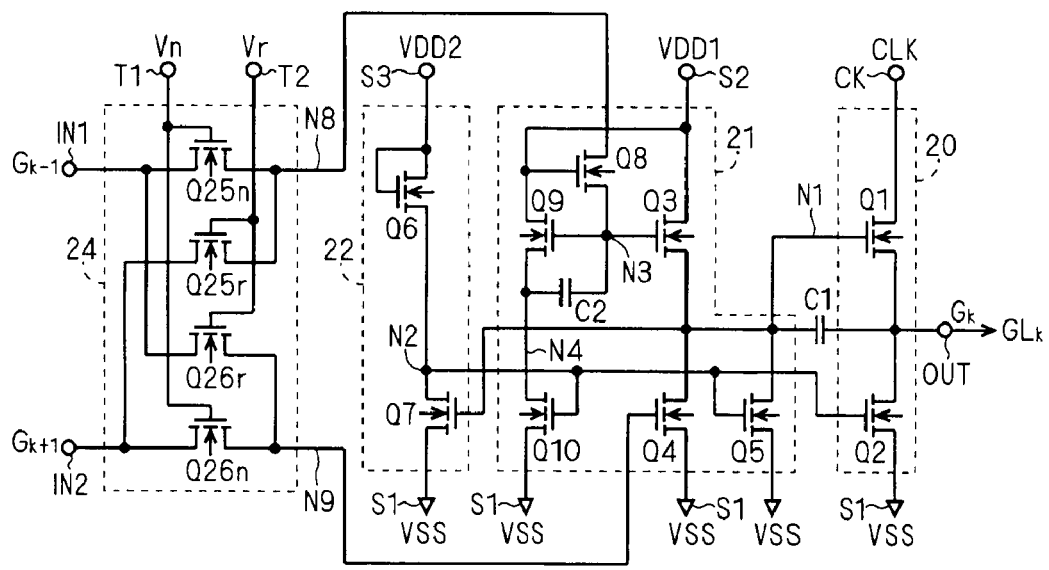
FIG. 19 is a circuit diagram showing a unit shift register according to the fourth embodiment.

FIG. 19 is a circuit diagram showing the unit shift register $SR_k$ according to the fourth embodiment. The unit shift register $SR_k$ is based on the circuit of FIG. 3 but has a switching circuit 24 for switching a shift direction of a signal.

In the circuit of FIG. 3, the output signal of preceding stage $G_{k-1}$ is input to only one of the current electrodes of the transistor Q8 (input terminal IN), and the output signal of subsequent stage $G_{k+1}$ is input to only the gate of the transistor Q4 (reset terminal RST). In contrast, the switching circuit 24 of FIG. 19 can switch the two signals in accordance with the levels of the first and second voltage signals Vn and Vr.

As shown in FIG. 19, the switching circuit 24 includes transistors Q25r, Q25n, Q26r and Q26n. Furthermore, the switching circuit 24 includes first and second input terminals IN1 and IN2 respectively receiving the output signal of preceding stage $G_{k-1}$ and the output signal of subsequent stage $G_{k+1}$ and first and second voltage signal terminals T1 and T2 respectively receiving first and second voltage signals Vn and Vr.

The switching circuit 24 has two output ends, which are defined as "node N8" and "node N9." Herein, one of the current electrodes of the transistor Q8 is connected to the node N8, and the gate of the transistor Q4 is connected to the node N9. The node N8 corresponds to the input terminal IN of the circuit of FIG. 3, and the node N9 corresponds to the reset terminal RST of the circuit of FIG. 3. In other words, the switching circuit 24 switches which of the output signal of preceding stage $G_{k-1}$ and the output signal of subsequent stage $G_{k+1}$ is to be supplied to the input terminal IN (node N8) of FIG. 3 and switches which of them is to be supplied to the reset terminal RST (node N9) of FIG. 3.

As shown in FIG. 19, the transistor Q25n is connected between the first input terminal IN1 and the node N8, and the gate of the transistor Q25n is connected to the first voltage signal terminal T1. The transistor Q25r is connected between the second input terminal IN2 and the node N8, and the gate of the transistor Q25r is connected to the second voltage signal terminal T2. The transistor Q26n is connected between the second input terminal IN2 and the node N9, and the gate of the transistor Q26n is connected to the first voltage signal terminal T1. The transistor Q26r is connected between the second input terminal IN2 and the node N9, and the gate of the transistor Q26r is connected to the second voltage signal terminal T2.

The first and second voltage signals Vn and Vr are control signals for determining the shift direction (scan direction) of the signal. When the unit shift register $SR_k$ is to perform a normal-direction shift operation, the first voltage signal Vn is configured to be at the H level, and the second voltage signal Vr is configured to be at the L level. When the unit shift register $SR_k$ is to perform a reverse-direction shift operation, the first voltage signal Vn is configured to be at the L level, and the second voltage signal Vr is configured to be at the H level.

When the first voltage signal Vn is at the H level and the second voltage signal Vr is at the L level, the transistors Q25n and Q26n are on, and the transistors Q25r and Q26r are off. Therefore, the output signal of preceding stage $G_{k-1}$ input to the first input terminal IN1 is supplied to the node N8, and the output signal of subsequent stage $G_{k+1}$ input to the second input terminal IN2 is supplied to the node N9. In this case, the unit shift register $SR_k$ of FIG. 19 is equivalent to that of FIG. 3. The gate line driving circuit 30 constituted by the plurality of cascade-connected unit shift registers $SR_k$ shown in FIG. 19 can shift signals in a direction from a preceding stage to a subsequent stage (which is defined as "normal direction"), i.e., in the order of the unit shift registers $SR_1$, $SR_2$, $SR_3$, . . . .

On the other hand, when the first voltage signal Vn is at the L level and the second voltage signal Vr is at the H level, the transistors Q25r and Q26r are on, and the transistors Q25n and Q26n are off. Therefore, on the contrary to the normal direction shift, the output signal of preceding stage $G_{k-1}$ is supplied to the node N9, and the output signal of subsequent stage $G_{k+1}$ is supplied to the node N8. In this case, the unit shift register $SR_k$ of FIG. 19 operates such that the unit shift register $SR_k$ attains the set-state in response to activation of the output signal of subsequent stage $G_{k+1}$ and the unit shift register $SR_k$ attains the reset state in response to activation of the output signal of preceding stage $G_{k-1}$. Therefore, the gate line driving circuit 30 constituted by the plurality of cascade-connected unit shift registers $SR_k$ shown in FIG. 19 can shift signals in a direction from a subsequent stage to a preceding stage (which is defined as "reverse direction"), i.e., in the order of the unit shift registers $SR_n$, $SR_{n-1}$, $SR_{n-2}$, . . . .

It should be noted that the operations of the output circuit 20, the pull-up driving circuit 21, and the pull-down driving circuit 22 of FIG. 19 are the same as those of FIG. 3. Therefore, the unit shi register $SR_k$ according to the present embodiment provides the same effects as those of the first embodiment.

However, the output signal of preceding stage $G_{k-1}$ and the output signal of subsequent stage $G_{k+1}$ are supplied via the switching circuit 24 to the pull-up driving circuit 21 of the unit shift register $SR_k$. Therefore, compared with the circuit of FIG. 3, it takes some more time to respond to the output signal of preceding stage $G_{k-1}$ and the output signal of subsequent stage $G_{k+1}$.

Furthermore, for example, when the H level of the first and second voltage signals Vn and Vr has the same potential as the H level of the output signal of preceding stage $G_{k-1}$ and the output signal of subsequent stage $G_{k+1}$ (i.e., the H level of the clock signals CLK and /CLK), the transistors Q25r, Q25n, Q26r and Q26n operate in the saturated region. Therefore, it should be noted that the output signal of preceding stage $G_{k-1}$ and the output signal of subsequent stage $G_{k+1}$ decrease the potential of the H level by the threshold voltage of each transistor, and are transmitted to the nodes NB and N9.

The present embodiment can be applied to the unit shift register $SR_k$ of any of the above embodiments 1 to 3. However, when the unit shift register $SR_k$, as in FIG. 8 to FIG. 10, is configured such that the pull-down driving circuit 22 has an input circuit including the transistors Q12 to Q14, it is necessary to switch, in accordance with the shift direction, signals provided to the gates of the transistors Q12 and Q14. In such case, the gate of the transistor Q12 is connected to the node N8 and the gate of the transistor Q14 is connected to the node N9 so that the output signal of preceding stage $G_{k-1}$ and the output signal of subsequent stage $G_{k+1}$ are also supplied via the switching circuit 24 to the input circuit of the pull-down driving circuit 22.

Furthermore, the unit shift register $SR_k$ of FIG. 11 does not have the transistor Q4. Accordingly, the switching circuit 24 including only the transistors Q25n and Q25r is to be arranged therein.

[First Modification]

FIG. 20 is a circuit diagram showing the unit shift register $SR_k$ according to the first modification of the fourth embodiment. This unit shift register $SR_k$ is based on the circuit of FIG. 19 and is configured such that the transistor Q8 is omitted and that the node N8 and the node N3 are connected.

In the unit shift register $SR_k$ of FIG. 20, the transistors Q25n and Q25r also play the role of the transistor Q8 of FIG. 19. For example, in the normal-direction shift, the first voltage signal Vn is at the H level, and the second voltage signal Vr is at the L level. Therefore, the gate potential of the transistor Q25n is fixed to VDD, and the transistor Q25r attains the off-state. At this moment, the transistor Q25n therefore operates in the same manner as the transistor Q8 of FIG. 19.

On the other hand, in the reverse-direction shift, the first voltage signal Vn is at the L level, and the second voltage signal Vr is at the H level. Therefore, the gate potential of the transistor Q25r is fixed to VDD, and the transistor Q25n attains the off-state. At this moment, the transistor Q25r therefore operates in the same manner as the transistor Q8.

According to this modification, the size of the circuit can be reduced as the transistor Q8 is omitted. However, it should be reminded that the parasitic capacity of the node N3 increases, since more number of transistors are connected to the node N3.

[Second Modification]

As described above, when the H level of the first and second voltage signals Vn and Vr has the same potential as the H level of the output signal of preceding stage $G_{k-1}$ and the output signal of subsequent stage $G_{k+1}$ (i.e., the H level of the clock signals CLK and /CLK), the transistors Q25r, Q25n, Q26r and Q26n of the unit shift registers $SR_k$ of FIG. 19 operate in the saturated region. Therefore, it should be noted that the output signal of preceding stage $G_{k-1}$ and the output signal of subsequent stage $G_{k+1}$ decrease the potential of the H level by the threshold voltage of each transistor, and are transmitted to the nodes N8 and N9. Herein, the modification for coping with the above issue will be shown.

FIG. 21 is a circuit diagram showing the unit shift register $SR_k$ according to the second modification of the fourth embodiment. This unit shift register $SR_k$ is based on the circuit of FIG. 19 and is configured such that a transistor 27n is placed between the gate of the transistor 25n and the first voltage signal terminal T1, and that a transistor Q27r is placed between the gate of the transistor Q25r and the second voltage signal terminal T2. Both of the gates of the transistors 27n and 27r are connected to the second power supply terminal S2 to which the high power supply potential VDD1 is supplied.

Hereinafter, the operation of the switching circuit 24 of the unit shift register SR of FIG. 21 will be explained. Herein, it is assumed that all of the first and second voltage signals Vn and Vr, the output signal of preceding stage $G_{k-1}$, and the output signal of subsequent stage $G_{k+1}$ have the same potential, VDD, at the H level (i.e., the H level of the clock signals CLK and /CLK). The high power supply potentials VDD1 and VDD2 are also assumed to be VDD, which is the same thereas. Furthermore, a node connected with the gate of the transistor Q25n is defined as "node N10", and a node connected with the gate of the transistor Q25r is defined as "node N11."

The operation of the switching circuit 24 in the normal-direction shift will be explained. At this moment, the first voltage signal Vn is at the H level (VDD), and the second voltage signal Vr is at the L level (VSS). Therefore, the transistor Q26n is in the on-state, the transistor Q26r is in the off-state. Furthermore, the gate potential of the transistors Q27n and Q27r is fixed to the H level of VDD, and therefore, both of the transistors Q27n and Q27r are on-state. Where it is assumed that all of the output signal $G_k$ of the unit shift register $SR_k$, the output signal $G_{k-1}$ of the preceding stage, and the output signal $G_{k-1}$ of the subsequent stage are at the L level, the node N10 is at the H level of the potential VDD–Vth, and the node N11 is at the L level of the potential VSS. Therefore, the transistor Q25n is in the on-state, and the transistor Q25r is in the off-state.

Therefore, the output signal of preceding stage $G_{k-1}$ input to the first input terminal IN1 is supplied to the node N8, and the output signal of subsequent stage $G_{k+1}$ input to the second input terminal IN2 is supplied to the node N9. In other words, the unit shift register $SR_k$ of FIG. 21 is equivalent to that of FIG. 3, so that the normal-direction shift can be performed.

In the switching circuit 24 of FIG. 21, when the output signal of preceding stage $G_{k-1}$ rises and the potential at the node N8 rises, the potential at the node N10 is increased with the coupling via the capacitance between the gate and channel of the transistor Q25n. At this moment, the transistor Q27n turns off, and the potential at the node N10 increases to a level high enough to cause the transistor Q25n to operate in the non-saturated region. Therefore, the potential of the node N8 attains VDD, which is the same as the H level of the output signal of preceding stage $G_{k-1}$. In other words, the output signal of preceding stage $G_{k-1}$ is transmitted to the node N8 without any loss corresponding to the threshold voltage of the transistor Q25n.

In the reverse-direction shift, the first voltage signal Vn is at the L level (VSS), and the second voltage signal Vr is at the H level (VDD). Therefore, the transistor Q26n is in the off-state, the transistor Q26r is in the on-state. Furthermore, both of the transistors Q27n and Q27r are on-state, and therefore, where it is assumed that all of the output signal $G_k$ of the unit shift register $SR_k$, the output signal $G_{k-1}$ of the preceding stage, and the output signal $G_{k+1}$ of the subsequent stage are at the L level, the node N10 is at the L level of the potential VSS, and the node N11 is at the H level of the potential VDD–Vth. Therefore, the transistor Q25n is in the off-state, and the transistor Q25r is in the on-state.

Therefore, the output signal of preceding stage $G_{k-1}$ input to the first input terminal IN1 is supplied to the node N9, and the output signal of subsequent stage $G_{k+1}$ input to the second input terminal IN2 is supplied to the node N8. In this case, the unit shift register $SR_k$ of FIG. 21 operates such that the unit shift register $SR_k$ attains the set-state in response to activation of the output signal of subsequent stage $G_{k+1}$ and the unit shift register $SR_k$ attains the reset state in response to activation of the output signal of preceding stage $G_{k-1}$. Therefore, the reverse-direction shift can be performed.

When the output signal of subsequent stage $G_{k+1}$ rises, the potential at the node N11 is increased with the coupling via the capacitance between the gate and channel of the transistor Q25r, and therefore, the transistor Q25r operates in the non-saturated region. Therefore, the output signal of subsequent stage $G_{k+1}$ is transmitted to the node N9 without any loss corresponding to the threshold voltage of the transistor Q25r.

The circuit of FIG. 21 is effective when the H level potential of the first and second voltage signals Vn and Vr is less than VDD+Vth. In other words, it is not necessary to apply this modification when the H level potential of the first and second voltage signals Vn and Vr is more than VDD+Vth and the transistors Q25n and Q25r can operate in the non-saturated region without needing the transistors Q27n and Q27r (i.e., with the circuit of FIG. 19).

Fifth Embodiment

FIG. 22 is a circuit diagram showing the unit shift register $SR_k$ according to the fifth embodiment. This unit shift register $SR_k$ is based on the circuit of FIG. 3 and is configured such that a transistor Q8D and a capacitive element C2D are arranged in parallel with the transistor Q8 and the capacitive element C2, and the gate of the transistor Q3 and the gate of the transistor Q9 are separated by connecting the gate of the transistor Q9 to a connection node arranged between the transistor Q8D and the capacitive element C2D. In the present embodiment, the node connected to the gate of the transistor Q9 is defined as "node N3D."

As shown in FIG. 22, the transistor Q8D is connected between the input terminal IN and the node N3D, and both of the gate of the transistor Q8D and the gate of the transistor Q8 are connected to the second power supply terminal S2. Furthermore, the capacitive element C2D is connected between the node N3D and the node N4.

The circuit including the transistor Q8D and the capacitive element C2D connected in series is connected in parallel with the circuit including the transistor Q8 and the capacitive element C2 connected in series. Both of the gates of the transistors Q8 and Q8D are connected to the input terminal IN, and these two circuits operate in the same manner. In other words, the node N3D changes its level in the same manner as the node N3. Therefore, the unit shift register $SR_k$ of FIG. 22 can operate in the same manner as the circuit of FIG. 3 in which the gates of the transistors Q3 and Q9 are connected with each other.

According to the unit shift register $SR_k$ of FIG. 22, the gate of the transistor Q9 has a smaller parasitic capacitance than that of the circuit of FIG. 3 as the gate of the transistor Q9 is not connected to the node N3. (In other words, the parasitic capacitance of the node connected to the gate of the transistor Q9 is reduced by the gate capacitance of the transistor Q3.)

Therefore, in the unit shift register $SR_k$ of FIG. 22, the gate potentials of the transistors Q3 and Q9 can be increased to a higher level in a shorter time than those of FIG. 3 during the pre-charge of the node N1. As a result, the charging rate of each of the nodes N1 and N4 increases, thus allowing the unit shift register $SR_k$ to operate faster.

[Modification]

The present embodiment is not limited to the application to the circuit of FIG. 3, and may be applied to the unit shift register SR shown in any of the embodiments and modifications thereof. In particular, when the present embodiment is applied to the circuit according to the third embodiment in which the voltage generating circuit 33 supplies a higher voltage VDD4 to the drain of the transistor Q3 or the drains of the transistors Q3 and Q9, the gate potential of the node N3 can be increased, which is very meaningful. Therefore, the present embodiment is especially effective for the third embodiment.

When the present embodiment is applied to the unit shift register SR according to the second embodiment (FIG. 12), both of the gates of the transistors Q8 and Q8D are connected to the transistor Q15 (i.e. connected to the node N6) as shown in FIG. 23. Furthermore, a transistor Q16D whose gate is connected to the node N1 is connected between the node N3D and the input terminal IN so as to correspond to the transistor Q16 for discharging the node N3. In the same manner as the transistor Q16, the source of the transistor Q16D may be supplied with the clock signal /CLK having the same phase as the output signal of subsequent stage $G_{k+1}$. When the voltage generating circuit 33 according to the third embodiment is connected to the circuit of FIG. 23, the unit shift register $SR_k$ most advantageous in the operation rate can be obtained by supplying the potential VDD4 to both of the drains of the transistors Q3 and Q9.

Sixth Embodiment

Figure 24:
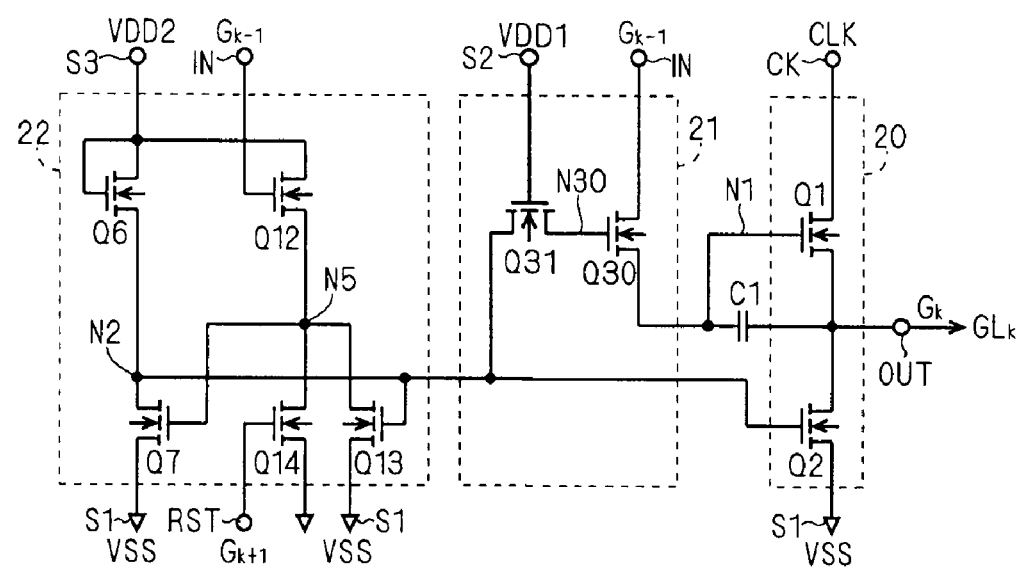
FIG. 24 is a circuit diagram showing a unit shift register according to the sixth embodiment.

FIG. 24 is a circuit diagram showing the unit shift register $SR_k$ according to the sixth embodiment. This unit shift register $SR_k$ includes the output circuit 20, the pull-up driving circuit 21, and the pull-down driving circuit 22 in the same manner as the above embodiments.

The output circuit 20 and the pull-down driving circuit 22 have the same configurations as those of FIG. 8 (the fifth modification of the first embodiment). The output circuit 20 includes the transistor Q1 supplying the clock signal CLK to the output terminal OUT and the transistor Q2 discharging the output terminal OUT in the non-selection period. The pull-down driving circuit 22 includes the inverter constituted by the transistors Q6 and Q7 and the input circuit constituted by the transistors Q12 to Q14.

In the pull-down driving circuit 22 of FIG. 24, both of the drains of the transistors Q6 and Q12 are connected to the third power supply terminal S3. In FIG. 8, the drain of the transistor Q12 is connected to the second power supply terminal S2. However, as described above, the potential VDD1 of the second power supply terminal S2 may the same as the potential VDD2 of the third power supply terminal S3. Therefore, the pull-down driving circuit 22 may configured as shown in FIG. 24 without causing any problem in terms of operation.

As explained in the fifth modification of the first embodiment, the input circuit of the pull-down driving circuit 22 changes the input end of the inverter (node N5) to the H level in response to activation of the output signal of preceding stage $G_{k-1}$, and changes the node N5 to the L level in response to activation of the output signal of subsequent stage $G_{k+1}$. Therefore, the output end (node N2) attains the L level in response to activation of the output signal of preceding stage $G_{k-1}$, and attains the H level in response to activation of the output signal of subsequent stage $G_{k+1}$. The node N2 is the output end of the pull-down driving circuit 22, and is connected to the gate of the transistor Q2 of the output circuit 20.

On the other hand, the pull-up driving circuit 21 includes a transistor Q30 connected between the input terminal IN and the node N1 and a transistor Q31 connected between the gate of the transistor Q30 and the node N2. The gate of the transistor Q31 is connected to the second power supply terminal S2 to which the high power supply potential VDD1 is supplied. The node connected with the gate of the transistor Q30 is defined as "node N30."

Figure 25:
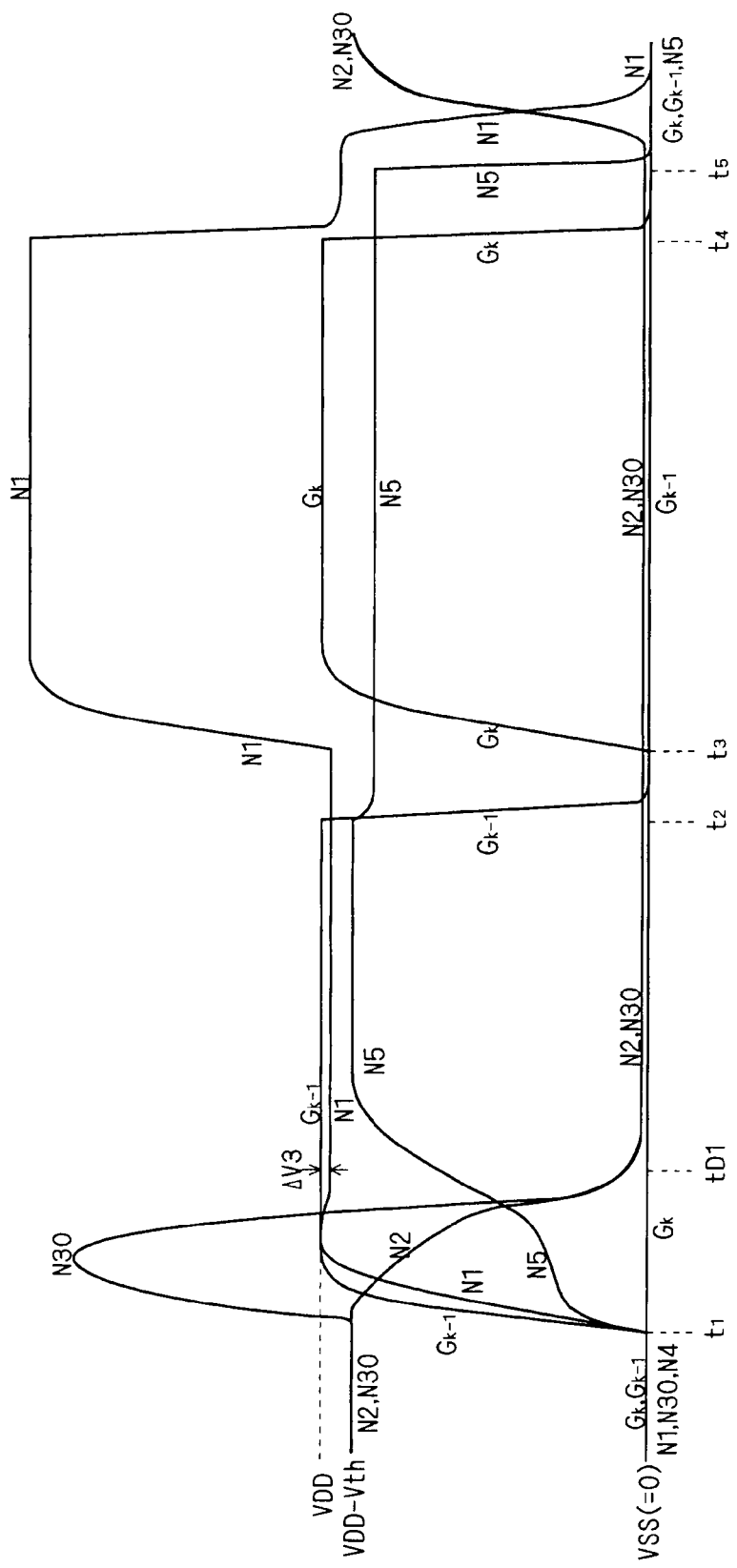
FIG. 25 is a timing chart illustrating operation of the unit shift register according to the sixth embodiment.

FIG. 25 is a timing chart for illustrating the operation of the unit shift register $SR_k$ according to the sixth embodiment. Hereinafter, the operation of the unit shift register $SR_k$ will be described on the basis of FIG. 25. It is also assumed here that the clock signal CLK is input to the clock terminal CK of the unit shift register $SR_k$.

The initial state of the unit shift register $SR_k$ (the state immediately before a time $t_1$) is assumed to be such that the node N1 is at the L level (VSS) and the node N2 is at the H level (VDD−Vth) (reset state). In this state, the transistor Q1 is off, and the transistor Q2 is on, and therefore, the output signal $G_k$ is maintained at the L level regardless of the level of the clock signal CLK.

At the time immediately before the time $t_1$, all of the clock terminal CK (the clock signal CLK) of the unit shift register $SR_k$, the reset terminal RST (the output signal of subsequent stage $G_{k+1}$), and the input terminal IN (the output signal of preceding stage $G_{k-1}$) are assumed to be at the L level. In this case, since the node N2 is at the H level, the node N30 is charged via the transistor Q31, so that the node N30 attains the H level (VDD−Vth). Therefore, the transistor Q30 is in the on-state, and the node N1 is at the L level (VSS).

At the time $t_1$, the clock signal /CLK (not shown) is assumed to change from the above state to the H level, and further, the output signal of preceding stage $G_{k-1}$ (the start pulse SP in a case of the unit shift register $SR_1$ of the 1st stage) is assumed to be activated.

Since the transistor Q30 of the pull-up driving circuit 21 is in the on-state, if the level of the output signal $G_{k-1}$ of the preceding stage increases, charging of the node N1 starts. At this time, the input terminal IN and the node N1, and the node N30 are capacitively-coupled with a parasitic capacitance of the transistor Q30 (such as a capacitance between the gate and channel, an overlap capacitance between the gate and the source/drain) so that the level of the node N30 increases in accordance with the increase in the levels of the input terminal IN and the node N1. When the level of the node N30 increases, the transistor Q31 turns off (the operation of the transistor Q31 will be explained later in detail), and the potential at the node N30 increases to a level high enough to allow the transistor Q30 to operate in the non-saturated region. More specifically, the voltage of the node N30 becomes larger than the amplitude (VDD) of the output signal of preceding stage $G_{k-1}$. At this time, if the voltage of the node N30 becomes more than VDD+Vth, the transistor Q30 operates in the non-saturated region. Therefore, the node N1 is charged (pre-charged) fast, and the node N1 rapidly attains the H level of the potential VDD to follow the output signal of preceding stage $G_{k-1}$. Accordingly, the transistor Q1 turns on.

On the other hand, since the transistor Q12 of the pull-down driving circuit 22 turns on in accordance with the rise in the output signal of preceding stage $G_{k-1}$. At this moment, the transistor Q13 is on, but the transistor Q12 is configured to have a sufficiently smaller on-resistance than the transistor Q13, and therefore, the level in the node N5 increases. Accordingly, the transistor Q7 turns on, and the level of the node N2 begins to decrease. When the level of the node N2 decreases, the transistor Q31 turns on, and a current flows in the direction from the node N30 to the node N2. There, the level of the node N30 decreases in accordance with the decrease in the level of the node N2.

At a time tD1 which is later than the time $t_1$ by a predetermined period of time, the levels of the node N2 and N30 attain the L level, and then, the transistor Q2 turns off. In other words, the unit shift register $SR_k$ attains the set-state in which the transistor Q1 is on and the transistor Q2 is off, but at this moment, the clock signal CLK is at the L level. Therefore, the output terminal OUT (output signal Gk) is maintained at the L level in low impedance. At the time tD1, the transistor Q30 turns off, and the node N1 is maintained at the H level in floating state.

On the other hand, in the pull-down driving circuit 22, when the node N2 attains the L level, the transistor Q1 turns off. As a result, the node N5 attains the H level of the potential VDD−Vth.

Herein, attention is given to the operation of the transistor Q31 during the pre-charge of the node N1. Before the node N1 is pre-charged, the node N2 is at the H level (VDD−Vth), and the gate voltage of the transistor Q31 is fixed to VDD (=VDD1). Therefore, the transistor Q31 flows a current from the node N2 to the node N30 so as to charge the node N30 to the H level (VDD−Vth).

When the output signal of preceding stage $G_{k-1}$ rises, and the transistor Q30 begins to pre-charge the node N1, the potential at the node N30 is increased. Therefore, a terminal of the transistor Q31 connected to the node N2 becomes the source due to the relationship between potentials. At this moment, the potential at the node N2 is VDD−Vth, and therefore, a voltage between the gate (the second power supply terminal S2) and the source (the node N2) of the transistor Q31 is Vth, and the transistor Q31 is in a boundary state between on and off. At this moment, a sub-threshold current flows in the transistor Q31 from the node N30 to the node N2. But this is a minute current, and therefore, the charge released from the node N30, in a short period of time in which the potential at the node N30 is being increased (approximately equal to $tD1-t_1$), is so little that it can almost be ignored.

At the time tD1 at which the node N1 has been pre-charged to the H level (VDD), the transistor Q31 turns on when the node N2 attains the L level, so that a current flows from the node N30 to the node N2, and the node N30 attains the L level (VSS). Thereafter, while the node N2 is at the L level, the transistor Q31 stays in the on-state, and the node N30 is maintained at the L level.

As described above, when the node N2 is at the H level before the pre-charge of the node N1, the transistor Q31 serves as a resistive element for transmitting the charge in the node N2 to the node N30. When the potential at the node N30 is increased upon the start of the pre-charge of the node N1, the transistor Q31 serves as a blocking element for blocking between the node N30 and the node N2. When the node N1 has been pre-charged and the level of the node N2 decreases, and the node N2 is thereafter maintained at the L level, the transistor Q31 serves as a resistive element for discharging the charge in the node N30 to the node N2. Therefore, the transistor Q31 serves as a charging and discharging circuit for charging the node N30 before the output signal of preceding stage $G_{k-1}$ is activated, and discharging the node N30 before the output signal of preceding stage is deactivated.

It should be noted that when the node N30 decreases to the L level, the level of the node N1 slightly decreases (ΔV3 of FIG. 25) with the coupling via the overlap capacitance between the gate and source of the transistor Q30. This decrease of the level of the node N1 is substantially the same as the decrease (ΔV2 of FIG. 4) that occurs in the unit shift register $SR_k$ according to the first embodiment at the fall of the output signal of preceding stage $G_{k-1}$, and even after the level of the node N1 slightly decreases by ΔV3, the level of the node N1 is higher than that of the conventional unit shift register (the circuit of FIG. 7 of Japanese Patent Application Laid-open No. 2004-78172).

When the clock signal /CLK falls at the time $t_2$, the output signal of preceding stage $G_{k-1}$ changes to the L level. Since the transistor Q30 attained the off-state at the time tD1, the level of the node N1 does not change.

In accordance with the fall of the output signal of preceding stage $G_{k-1}$, the transistor Q12 of the pull-down driving circuit 22 turns off. At this moment, the level at the node N5 slightly decreases with the coupling via the overlap capacitance between the gate and source of the transistor Q12, but the decrease is to such an extent that the operation of the unit shift register SR is not affected.

Then, when the clock signal CLK rises at the time $t_3$, the change in the level thereof is transmitted to the output terminal OUT via the transistor Q1 in the on-state, and the level of the output signal $G_k$ is increased. At this moment, the potential at the node N1 is increased with the coupling via the capacitive element C1, and the transistor Q1 operates in the non-saturated region. Therefore, the output signal $G_k$ attains the H level of the potential VDD, which is the same as the H level of the clock signal CLK.

Where the parasitic capacitance of the node N1 is sufficiently small, the potential of the node N1 is increased to about the same level as the level of the output signal $G_k$. Therefore, the level Va[N1] of the node N1 having been increased is expressed by the above Expression (1) in the same manner as that of the first embodiment.

When the clock signal CLK falls at the time $t_4$, a current flows from the output terminal OUT to the clock terminal CK via the transistor Q1 in the on-state, and the output terminal OUT is discharged. As a result, the output signal $G_k$ attains the L level. At this moment, with the coupling via the capacitive element C1, the node N1 returns back to the level (VDD−ΔV3) before the potential at the node N1 is increased.

Herein, the output signal $G_k$ is also input to the input terminal IN of the unit shift register of subsequent stage $SR_{k+1}$, and therefore, when the output signal $G_k$ attains the H level at the above time $t_3$, the unit shift register $SR_{k+1}$ attains the set-state.

Accordingly, when the clock signal /CLK rises at the time $t_5$, the output signal of subsequent stage $G_{k+1}$ (not shown) attains the H level. Therefore, in the unit shift register $SR_k$, the transistor Q14 turns on, and the node N5 attains the L level. Accordingly, since the transistor Q7 turns off, the transistor Q6 charges the node N2, so that the node N2 attains the H level.

When the node N2 attains the H level, a current flows from the node N2 to the node N30 via the transistor Q31 in the on-state, and the node N30 attains the H level of the potential VDD−Vth. As a result, the transistor Q30 turns on, and the node N1 is discharged to be the L level in low impedance. As a result, the unit shift register $SR_k$ returns back to the reset state in which the transistor Q1 is off and the transistor Q2 is on.

Thereafter, the output signal of subsequent stage $G_{k+1}$ returns back to the L level, but the unit shift register $SR_k$ is maintained at the reset state until the output signal of preceding stage $G_{k-1}$ is activated in the subsequent frame period. This is because the half latch circuit including the transistors Q6, Q7 and Q13 maintains the levels of the nodes N2 and N5. Furthermore, during that period, the transistor Q2 is on, and therefore, the output terminal OUT is maintained at the L level in low impedance.

As can be understood from the above operation, the transistor Q30 not only charges (pre-charge) the node N1 to render the unit shift register $SR_k$ in the set-state but also discharges the node N1 to render the unit shift register $SR_k$ in the reset state.

In the unit shift register SR according to the present embodiment, the capacitance between the gate and channel of the transistor Q30 serves as boosting unit of the node N30, and the boosting unit increases the gate potential (boosts the gate potential) of the transistor Q30 during the pre-charge of the node N1. Accordingly, the transistor Q30 operates in the non-saturated region, and therefore, the rising rate of the level of the node N1 is faster than that of the conventional unit shift register. Therefore, even when the frequency of the clock signal increases, and the pulse width of the signal input to the input terminal IN decreases, the node N1 can be pre-charged sufficiently. Therefore, the effect of preventing the decrease of the driving capability of the transistor Q1 can be obtained in the same manner as the first embodiment.

[First Modification]

In the unit shift register $SR_k$ of FIG. 24, the load element for the inverter (the transistor Q6) of the pull-down driving circuit 22 may be any element as long as the load element can maintain the node N2 at the H level during the non-selection period of the gate line $GL_k$, as is the case with the circuit of FIG. 3. Therefore, for example, a current-driving element such as a constant-current element and a resistive element may be used instead of the transistor Q6.

Furthermore, in FIG. 24, the constant high power supply potential VDD2 is supplied to the gate of the transistor Q6, but instead of VDD2, the clock signal /CLK having the same phase as the output signal of subsequent stage $G_{k+1}$ may be supplied thereto. When the unit shift register $SR_k$ activates the output signal $G_k$, the transistor Q7 turns on for two horizontal periods (the time $t_1$ to the time $t_5$ in FIG. 25). In the circuit of FIG. 24, a flow-through current flows through the transistors Q6 and Q7 throughout the two horizontal period, but when the clock signal /CLK is supplied to the gate of the transistor Q7, the transistor Q6 is off during half of the period, so that the flow-through current can be made half. Alternatively, the clock signal /CLK may be supplied to both of the gate and drain of the transistor Q6.

This modification can also be applied to any of embodiments and modifications below described.

[Second Modification]

The source of the transistor Q13 in the pull-down driving circuit 22 of FIG. 24 may be connected to the input terminal IN in the same manner as the modification shown in FIG. 10 in the first embodiment. In such case, when the output signal of preceding stage $G_{k-1}$ is activated, the transistor Q13 turns off because the source potential thereof increases. In other words, the transistor Q13 turns off at substantially the same time as the transistor Q3 turns on, in which state the node N5 is charged. Therefore, the node N5 can be charged regardless of the on-state resistance values of the transistors Q12 and Q13, and the circuit can be easily designed.

Third Embodiment

When the output signal of preceding stage $G_{k-1}$ is supplied to the source of the transistor Q13 in the same manner as in the above second modification, the rising rate of the level of the node N5 is faster than that in the case of FIG. 24. Accordingly, a time tD1 at which the nodes N2 and N30 change to the L level becomes earlier, and the transistor Q30 is considered to turn off before the level of the node N1 sufficiently increases. Then, the on-resistance of the transistor Q1 decreases while the output signal $G_k$ is activated, and the effects of the present invention cannot be obtained. Herein, the modification for coping with the above issue will be shown.

Figure 26:
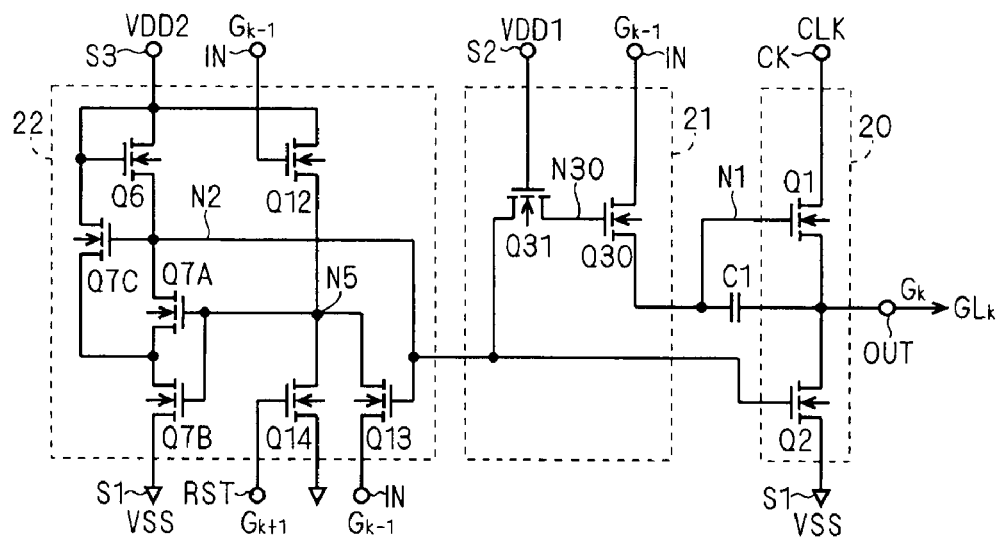
FIG. 26 is a circuit diagram showing a unit shift register according to the third modification of the sixth embodiment.

FIG. 26 is a circuit diagram showing the unit shift register $SR_k$ according to the third modification of the sixth embodiment. This unit shift register $SR_k$ is based on the circuit of FIG. 24, and is configured such that the output signal of preceding stage $G_{k-1}$ is supplied to the source of the transistor Q13, and that a Schmitt trigger inverter constituted by transistors Q6, Q7A, Q7B and Q7C is used as an inverter in the pull-down driving circuit 22 in the same manner as the fourth modification of the first embodiment (FIG. 7). This Schmitt trigger inverter is configured such that the node N5 is the input terminal and the node N2 is the output terminal, in the same manner as the inverter (the transistors Q6 and Q7) in the pull-down driving circuit 22 of FIG. 24.

The Schmitt trigger inverter has a higher threshold voltage than an ordinary ratio-type inverter. Therefore, the level of the node N2 decreases at a time delayed by the increase in the level of the node N5. Therefore, even when the output signal of preceding stage $G_{k-1}$ is supplied to the source of the transistor Q13, and the rising rate of the level of the node N5 increases, a time at which the nodes N2 and N30 attain the L level (time tD1) is delayed by a certain period of time. Therefore, it is possible to prevent the transistor Q30 from turning off before the level of the node N1 sufficiently increases.

[Fourth Modification]

Figure 27:
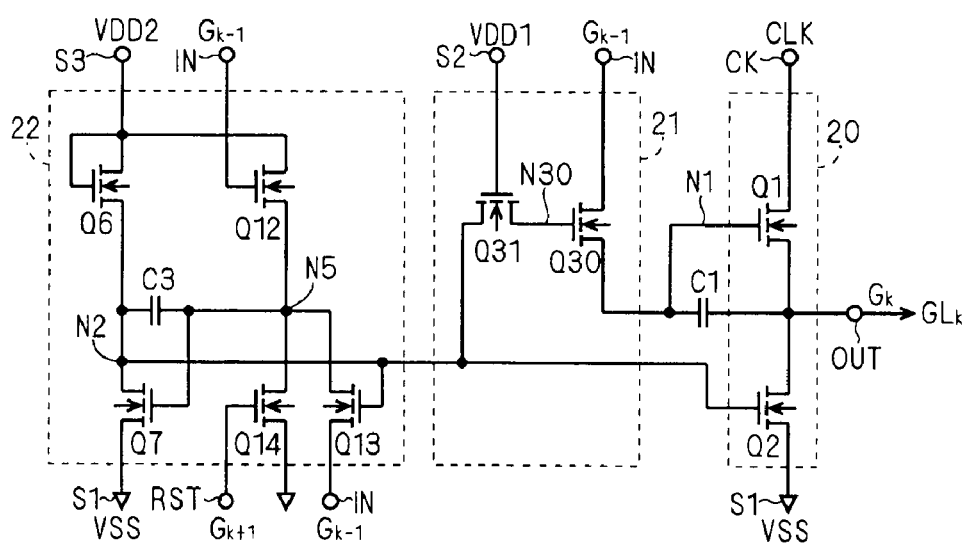
FIG. 27 is a circuit diagram showing a unit shift register according to the fourth modification of the sixth embodiment.

FIG. 27 is a circuit diagram showing the unit shift register $SR_k$ according to the fourth modification of the sixth embodiment. This unit shift register $SR_k$ is based on the circuit of FIG. 24, and is configured such that the output signal of preceding stage $G_{k-1}$ is supplied to the source of the transistor Q13, and that a capacitive element, C3 is connected between the node N2 and the node N5.

The capacitive element C3 delays a time at which the node N5 rises. Therefore, even where the output signal of preceding stage $G_{k-1}$ is supplied to the source of the transistor Q13, the time at which the level of the node N5 increases is delayed, and accordingly, the time (time tD1) at which the nodes N2 and N30 attain the L level is also delayed by a certain period of time. Therefore, the same effects as those of the third modification can be obtained.

[Fifth Modification]

There is a relatively large parasitic capacitance between the gate line GL and the data line in the image display apparatus. When the signal level of the data line changes, this change causes the potential of the gate line GL to change, which generates a noise in the gate line GL. In the unit shift register $SR_k$ of FIG. 24, the transistor Q30 of the pull-up driving circuit 21 is in the on-state during the non-selection period of the gate line $GL_k$. When a noise arises in a previous gate line $GL_{k-1}$ at that moment, the noise is applied to the node N1 of the unit shift register $SR_k$.

Therefore, a noise having a larger amplitude than the threshold value of the transistor Q1 arises in the gate line $GL_{k-1}$, the transistor Q1 turns on. If the level of the clock signal CLK rises at that time, a problem arises in that a false output signal $G_k$ occurs, and the gate line $GL_k$ is activated even though activation is unnecessary, so that a malfunction of display occurs. Herein, the modification for coping with the above issue will be shown.

FIG. 28 is a circuit diagram showing a unit shift register according to the fifth modification of the sixth embodiment. This unit shift register $SR_k$ can generate an output signal $GD_k$ (hereinafter referred to as "carry signal") which is to be supplied to the unit shift register of preceding stage $SR_{k-1}$ and the unit shift register of subsequent stage $SR_{k+1}$, in addition to the output signal $G_k$ supplied to the gate line $GL_k$. In other words, in the unit, shift register $SR_k$ according to the present embodiment, the output signal $G_k$ is supplied to only the gate line $GL_k$. Furthermore, the carry signal of preceding stage $GD_{k-1}$ is supplied to the input terminal IN of the unit shift register $SR_k$, and the carry signal of subsequent stage $GD_{k+1}$ is supplied to the reset terminal RST.

The unit shift register $SR_k$ of FIG. 28 is based on the circuit of FIG. 24, and is configured such that a generation circuit including transistors Q1D and Q2D for generating a carry signal $GD_k$ is arranged in the output circuit 20. The transistor Q1D is connected between the clock terminal CK and an output terminal OUTD for the carry signal $GD_k$ (hereinafter "carry signal output terminal"), and the gate of the transistor Q1D is connected to the node N1. The transistor Q2D is connected between the first power supply terminal S1 and the carry signal output terminal OUTD, and the gate of the transistor Q2D is connected to the node N2.

As can be seen from FIG. 28, in the unit shift register $SR_k$ according to this modification, the transistors Q1 and Q2 connected to the output terminal OUT are in parallel with the transistors Q1D and Q2D connected to the carry signal output terminal OUTD. Furthermore, the gate of the transistor Q1D is connected to the node N1 in the same manner as the gate of the transistor Q1, and the gate of the transistor Q2D is connected to the node N2 in the same manner as the gate of the transistor Q2.

The transistors Q1 and Q1D operate in the same manner as each other, and the transistors Q2 and Q2D operate in the same manner as each other. Therefore, the output signal $G_k$ and the carry signal $GD_k$ have substantially the same waveform. Therefore, the unit shift register $SR_k$ of FIG. 28 can operate in the same manner as the circuit of FIG. 24.

In the unit shift register $SR_k$ according to this modification, the output signal $G_k$ supplied to the gate line $GL_k$ is separated from the carry signal $GD_k$ supplied to the unit shift register of subsequent stage $SR_{k+1}$. Since the carry signal output terminal OUTD is not connected to the gate line $GL_k$, the carry signal $GD_k$ is not affected by the noise of the gate line $GL_k$.

The carry signal of preceding stage $GD_{k-1}$ is input to the input terminal IN of the unit shift register $SR_k$, and therefore, the noise arising in the gate line $GL_{k-1}$ is not applied to the node N1 via the transistor Q30 of the unit shift register $SR_k$. In other words, in this modification, the unit shift register $SR_k$ is not affected by the noise of the gate line $GL_{k-1}$, and a false signal does not arise from the noise in the output signal $G_k$.

In the pull-down driving circuit 22 of FIG. 24, the carry signal of preceding stage $GD_{k-1}$ is supplied to the gate (input terminal IN) of the transistor Q12, and the output signal of subsequent stage $GD_{k+1}$ is supplied to the gate (reset terminal RST) of the transistor Q14. This is preferable because the pull-down driving circuit 22 is not affected by the noise of the gate lines $GD_{k-1}$ and $GD_{k+1}$.

The malfunction of the pull-down driving circuit 22 may temporarily cause the transistor Q2 to turn off and increase the impedance of the output terminal OUT during the non-selection period of the gate line $GL_k$, but does not actively produce any false output signal $G_k$. Therefore, the gate of the transistors Q12 and Q14 may be supplied with the output signal of preceding stage $G_{k-1}$, the output signal of subsequent stage $G_{k+1}$ in the same manner as in FIG. 24.

[Sixth Modification]

In FIG. 24, since the transistors Q6 and Q7 constitute a ratio-type inverter, a flow-through current flows from the third power supply terminal S3 to the first power supply terminal S1 through the transistors Q6 and Q7 throughout the period in which the node N5 is at the H level. In order to reduce this flow-through current, the transistor Q6 is configured to have a high on-resistance. However, if the transistor Q6 has a high on-resistance, the rising rate of the node N2 decreases when the selection period of the gate line $GL_k$ is finished.

When the rising rate of the node N2 decreases, the level of the gate (the node N30) of the transistor Q30 increases slowly. Therefore, the discharging rate of the node N1 decreases. In other words, delay occurs in the time at which the transistor Q1 turns off. With the delayed turn-off of the transistor Q1, when the frequency of the clock signals CLK and /CLK is high, a false signal of the output signal $G_k$ occurs, which hinders a high speed operation.

FIG. 29 is a circuit diagram showing the unit shift register $SR_k$ according to the sixth modification of the sixth embodiment. This unit shift register $SR_k$ is based on the circuit of FIG. 24, and is configured such that a transistor Q4 whose gate is connected to the reset terminal RST is arranged between the node N1 and the first power supply terminal S1.

According to the unit shift register $SR_k$ of FIG. 29, in accordance with activation of the output signal of subsequent stage $G_{k+1}$, the transistor Q4 discharges the node N1 and causes the transistor Q1 to swiftly turn off. Therefore, even when the frequency of the clock signals CLK and /CLK is high, no false output signal $G_k$ occurs, and the unit shift register $SR_k$ can operate faster. Furthermore, low power consumption can be achieved because the flow-through current can be reduced by increasing the on-resistance of the transistor Q6.

[Seventh Modification]

As explained in the sixth modification, when the transistor Q6 is configured to have a high on-resistance in order to suppress the flow-through current flowing through the transistors Q6 and Q7 in FIG. 24, the rising rate at the node N2 decreases when the selection period of the gate line GL is finished. This delays not only the time at which the transistor Q1 turns off but also the time at which the transistor Q2 turns on, and accordingly, the time at which the output terminal OUT is fixed to the L level in low impedance is delayed. This may also cause a false output signal $G_k$, and is therefore not preferable.

Figure 30:
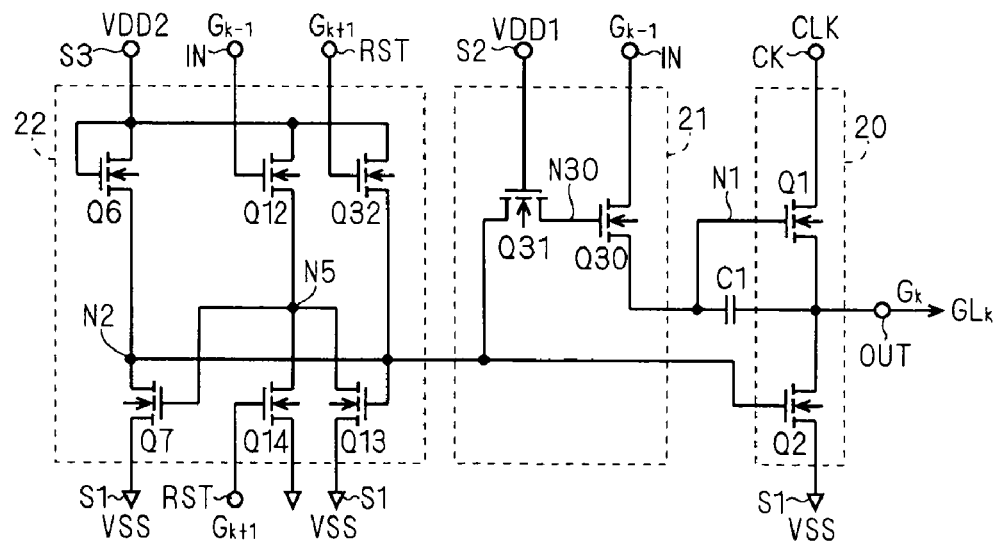
FIG. 30 is a circuit diagram showing a unit shift register according to the seventh modification of the sixth embodiment.

FIG. 30 is a circuit diagram showing the unit shift register $SR_k$ according to the seventh modification of the sixth embodiment. This unit shift register $SR_k$ is based on the circuit of FIG. 24, and is configured such that a transistor Q32 whose gate is connected to the reset terminal RST is arranged between the node N2 and the third power supply terminal S3.

According to the unit shift register $SR_k$ of FIG. 30, in accordance with activation of the output signal of subsequent stage $G_{k+1}$, the node N2 is changed to the H level by the transistor Q32. Therefore, the transistor Q1 can swiftly turn off, and the transistor Q2 can swiftly turn on. Therefore, even when the frequency of the clock signals CLK and /CLK is high, no false output signal $G_k$ occurs, and the unit shift register $SR_k$ can operate faster.

While the transistor Q32 is on, the transistor Q14 is also on, and the node N5 attains the L level. Accordingly, the transistor Q7 attains the off-state. Therefore, no flow-through current occurs through the transistors Q32 and Q7. Therefore, the transistor Q32 may be configured to have a small on-resistance.

The drain of the transistor Q32 may not be connected to the third power supply terminal S3, but may be connected to the reset terminal RST. In other words, the transistor Q32 may be diode-connected between the reset terminal RST and the node N2.

The transistor Q32 for charging the node N2 in accordance with the output signal of subsequent stage $G_{k+1}$ (reset signal) may be used to charge the node N2 in the unit shift register $SR_k$ shown in the first to the fifth embodiments (except the sixth modification of the first embodiment (FIG. 11)).

[Eighth Modification]

A modification will be hereinafter shown, wherein the unit shift register can transit from the set-state to the reset state without receiving the output signal of subsequent stage $G_{k+1}$ in the same manner as the circuit of FIG. 11 (the sixth modification of the first embodiment).

Figure 31:
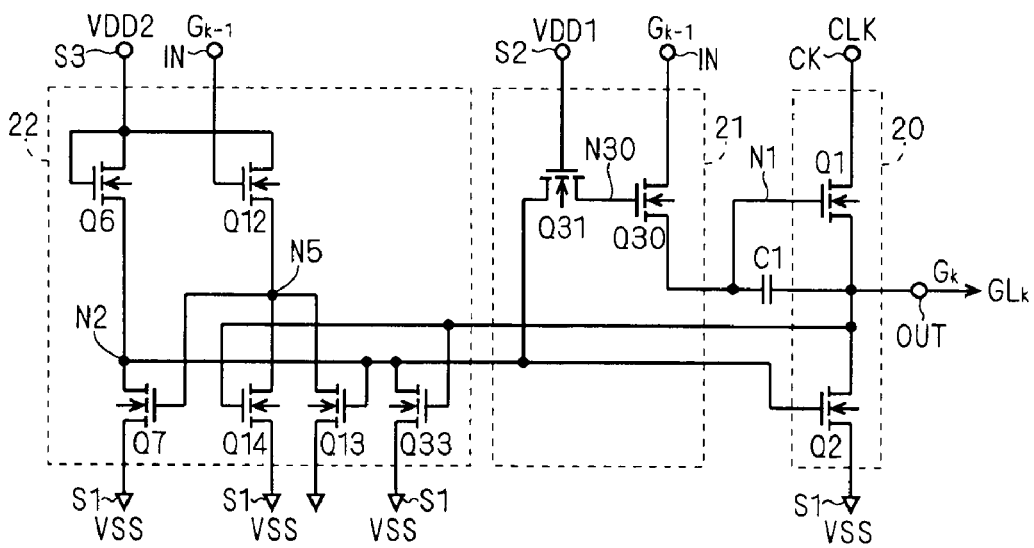
FIG. 31 is a circuit diagram showing a unit shift register according to the eighth modification of the sixth embodiment.

FIG. 31 is a circuit diagram showing the unit shift register $SR_k$ according to the eighth modification of the sixth embodiment. This unit shift register $SR_k$ is based on the circuit of FIG. 24, and is configured such that the gate of the transistor Q14 is connected to the output terminal OUT, and that a transistor Q33 whose gate is connected to the output terminal OUT is arranged between the node N2 and the first power supply terminal S1. The transistor Q33 is configured to have a sufficiently smaller on-resistance than the transistor Q6.

Operation of the unit shift register $SR_k$ of FIG. 31 will be explained. The unit shift register $SR_k$ operates in the same manner as the circuit of FIG. 24 when the output signal of preceding stage $G_{k-1}$ is activated.

That is, when the output signal of preceding stage $G_{k-1}$ attains the H level (VDD), the potential at the node N30 in the pull-up driving circuit 21 is increased to cause the transistor Q30 to operate in the non-saturated region, and the node N1 swiftly attains the H level of the potential VDD. At this moment, in the pull-down driving circuit 22, the transistor Q12 turns on, and the node N5 attains the H level. Accordingly, since the transistor Q7 turns on, the nodes N2 and N30 attain the L level. As a result, the unit shift register SR attains the set-state in which the transistor Q1 is on and the transistor Q2 is off.

When the node N30 attains the L level, the transistor Q30 turns off. Therefore, even when the output signal of preceding stage $G_{k-1}$ returns back to the L level, the node N1 is maintained at the H level. In other words, the unit shift register $SR_k$ is maintained at the set state.

Next, when the clock signal CLK changes to the H level, the output signal $G_k$ attains the H level (VDD). Then, the transistor Q14 turns on, the node N5 attains the L level, and the transistor Q7 turns off. However, the transistor Q33 turns on at this moment, and therefore, the node N2 is maintained at the L level in low impedance, and the transistor Q2 is maintained in the off-state.

When the clock signal CLK attains the L level, the level of the output signal $G_k$ decreases to follow the clock signal CLX. When the level of the output signal $G_k$ sufficiently decreases, the transistor Q33 turns off, and the transistor Q6 charges the node N2 to the H level. Accordingly, the node N30 attains the H level, and the transistor Q30 turns on, so that the node N1 attains the L level. As a result, the unit shift register SR attains the set-state in which the transistor Q1 is off and the transistor Q2 is on.

When the node N2 attains the L level, the transistor Q14 turns off. However, since the transistor Q13 turns on, the node N5 is maintained at the L level.

As described above, the unit shift register $SR_k$ of FIG. 31 can transit from the set-state to the reset state without receiving the output signal of subsequent stage $G_{k+1}$. Therefore, the layout of the gate line driving circuit 30 can be easily designed.

In the unit shift register $SR_k$ of FIG. 31, when the output signal $G_k$ falls, the node N2 changes to the H level after the level of the output signal $G_k$ has sufficiently decreased, in the same manner as the circuit of FIG. 11. Furthermore, when both of the node N2 and the node N30 attain the H level to cause the transistor Q30 to turn on, the node N1 is discharged. Therefore, the time at which the transistor Q1 turns on is always after the level of the output signal Gk has sufficiently decreased. Therefore, even when the interval between activated periods of the clock signals CLK and /CLK (Δt of FIG. 37) is extremely small, the falling rate of the output signal $G_k$ does not decrease. Therefore, the transistor Q2 does not need to have a small on-resistance (wide gate width), and therefore, the circuit area does not increase.

[Ninth Modification]

In the circuit of FIG. 31, when a noise having a large amplitude arises in the gate line $GL_k$ during the non-selection period of the gate line $GL_k$, the transistor Q33 of the pull-down driving circuit 22 turns on. Then, the node N2 attains the L level, and the transistor Q2 turns off, so that the gate line $GL_k$ attains high impedance state. As a result, a noise in the gate line $GL_k$ may increase, so that a malfunction may occur in a display.

Herein, in order to solve this problem, an example will be shown in which the technique of the above fifth modification (FIG. 28) is applied to the circuit of the eighth modification.

FIG. 32 is a circuit diagram showing the unit shift register according to the ninth modification of the sixth embodiment. This unit shift register $SR_k$ is based on the circuit of FIG. 31, and is configured such that a circuit constituted by transistors Q1DA and Q2DA is arranged in the output circuit 20, and that the gates of the transistors Q14 and Q33 of the pull-down driving circuit 22 are connected to a connection node between the transistors Q1DA and Q2DA.

The transistors Q1DA and Q2DA are arranged in the same manner as the transistors Q1D and Q2D, respectively, of FIG. 28. Specifically, where the connection node between the transistors Q1DA and Q2DA is defined as "node N31", the transistor Q1DA is connected between the node N31 and the clock terminal CK, and the gate of the transistor Q1DA is connected to the node N1. The transistor Q2DA is connected between the node N31 and the first power supply terminal S1, and the gate of the transistor Q2DA is connected to the node N2.

Therefore, the transistors Q1 and Q1DA operate in the same manner as each other, and the transistors Q2 and Q2DA operate in the same manner as each other. Accordingly, a signal having substantially the same waveform as the output signal $G_k$ appears at the node N31. Therefore, the unit shift register $SR_k$ of FIG. 32 can operate in the same manner as the circuit of FIG. 31.

In the unit shift register $SR_k$ according to this modification, the node N31 is not connected to the gate line $GL_k$, and therefore, the signal of the node N31 is not affected by the noise of the gate line $GL_k$. Since the transistor Q33 is controlled by the signal of the node N31, the transistor Q33 is prevented from turning on in response to the noise in the gate line $GL_k$, thus solving the above problem.

However, it should be noted that, in the circuit of FIG. 32, the decrease of the falling rate of the output signal $G_k$ cannot be prevented, as is the case with FIG. 31, unless the falling time of the node N31 and the falling time of the output terminal OUT are configured to be the same.

In FIG. 32, the gate of the transistor Q14 is also connected to the node N31, but may be connected to the output terminal OUT in the same manner as the circuit of FIG. 31. This is because the transistor Q13 causes the node N5 to be at the L level during the non-selection period of the gate line $GL_k$. Therefore, the level of the node N5 does not change even when the transistor Q14 turns on due to the noise, and the unit shift register $SR_k$ does not malfunction.

When the signal of the node N31 of the unit shift register $SR_k$ is supplied to the input terminal IN of the subsequent stage, the level of the node N1 of the subsequent stage does not increase due to the noise of the gate line $GL_k$. It is clear that the same effects as the above fifth modification (FIG. 28) can be obtained.

[Tenth Modification]

FIG. 33 is a circuit diagram showing the unit shift register according to the tenth modification of the sixth embodiment. In this unit shift register $SR_k$, the technique of the fifth modification (FIG. 28) is further applied to the circuit of the above ninth modification (FIG. 32). In other words, the generation circuit including the transistors Q1D and Q2D for generating the carry signal $GD_k$ is arranged in the circuit of FIG. 32.

The output signal $G_k$ output from the output terminal OUT is supplied to the gate line $GL_k$. The carry signal $GD_k$ output from the carry signal output terminal OUTD is supplied to the input terminal IN of the subsequent stage. The signal of the node N31 is supplied to the gates of the transistors Q14 and Q33 of the pull-down driving circuit 22.

According to this modification, not only the effects obtained from the above fifth modification (FIG. 28) but also the effects obtained from the circuit of the ninth modification (FIG. 32) can be obtained.

As explained in the ninth modification, the falling time of the signal of the node N31 and the falling time of the output signal $G_k$ are preferably configured to be the same. Since the rise of the output signal $G_k$ for driving a large load, i.e., the gate line $GL_k$, tends to slightly delay, the drive capability of the transistor Q1DA is configured to be low so as to suppress the falling rate of the signal of the node N31 in accordance with the delay of the rise of the output signal $G_k$.

On the other hand, the carry signal $GD_k$ is preferably able to charge rapidly the node N1 of the subsequent stage, and therefore, the drive capability of the transistor Q1D is configured to be high. In other words, in this modification, the on-resistance of the transistor Q1D is configured to be less than the on-resistance of the transistor Q1DA.

[Eleventh Modification]

As described above, in the unit shift register $SR_k$ of FIG. 24, the transistor Q30 of the pull-up driving circuit 21 is in the on-state during the non-selection period of the gate line $GL_k$, and therefore, a noise arising in the gate line $GL_{k-1}$ of the previous line is applied to the node N1 of the unit shift register $SR_k$. Consequently, when the level at the node N1 increases to cause the transistor Q1 to turn on, a problem arises in that a false output signal $G_k$ occur. The measure for taking care of this problem has been shown in the fifth modification, and another modification capable of solving this problem will be hereinafter shown.

Figure 38:
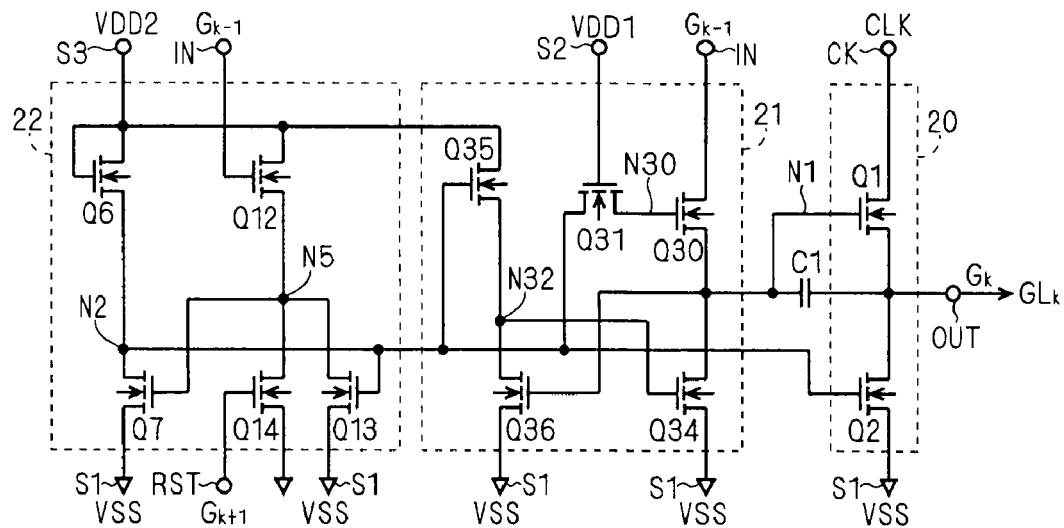
FIG. 38 is a circuit diagram showing a unit shift register according to the eleventh modification of the sixth embodiment.

FIG. 38 is a circuit diagram of the unit shift register according to the eleventh modification of the sixth embodiment. This unit shift register $SR_k$ is based on the circuit of FIG. 24, and is arranged with transistors Q34 to Q36 explained below. The transistor Q34 is connected between the node N1 and the first power supply terminal S1. Where a node connected to the gate of the transistor Q34 is defined as "node N32", the transistor Q35 is connected between the third power supply terminal S3 and the node N32, and the gate of the transistor Q35 is connected to the node N2. The transistor Q36 is connected between the node N32 and the first power supply terminal S1, and the gate of the transistor Q36 is connected to the node N1. The transistor Q35 may be connected between the second power supply terminal S2 and the node N32.

As can be seen from the signal waveform diagram of FIG. 25, the signal of the node N1 and the signal of the node N2 have waveforms substantially complementary to each other, and therefore, the circuit including the transistors Q35 and Q36 is adapted to provide a signal obtained by inverting the signal of the node N1 to the gate of the transistor Q34 (node N32).

When the unit shift register $SR_k$ is in the reset state (in which the node N1 is at the L level and the node N2 is at the H level), the transistor Q35 is on, the transistor Q36 is off, and the node N32 is at the H level. Accordingly, the transistor Q34 turns on, and the node N1 attains the L level in low impedance. Therefore, even when a noise in the gate line $GL_{k-1}$ is applied to the node N1, the level at the node N1 does not increase, and no false output signal $G_k$ occurs.

When the unit shift register $SR_k$ is in the set-state (in which the node N1 is at the H level and the node N2 is at the L level), the transistor Q35 is off, the transistor Q36 is on, and the node N32 is at the L level. Accordingly, the transistor Q34 turns off, and the node N1 attains the H level in high impedance (floating state). Therefore, in the same manner as the circuit of FIG.

24, the potential at the node N1 is increased at the rise of the output signal $G_k$, so that the transistor Q1 can operate in the non-saturated region.

In the circuit of FIG. 38, the transistor Q30 is configured to have a sufficiently larger drive capability than the transistor Q34 so that the node N1 attains the H level when the output signal of preceding stage $G_{k-1}$ attains the H level. Furthermore, the sizes of the transistors Q35 and Q36 are appropriately determined so that the transistor Q36 can cause the node N32 to be at the L level substantially at the same time as the rise in the level of the output signal of preceding stage $G_{k-1}$.

The gate of the transistor Q2 may be connected to the node N32. In such case, it should be noted that the layout can be easily designed but the transition of the level of the node N32 is slow as the parasitic capacitance of the node N32 is large.

Furthermore, the gate of the transistor Q35 may be connected to the second power supply terminal S2 or the third power supply terminal. Compared with the case of FIG. 38, the potential of the node N32 at the H level increases by Vth, and the on-resistance of the transistor Q34 can be reduced. However, since the transistors Q35 and Q36 are ratio-type invertors, a flow-through current flows through the transistors Q35 and Q36 when the unit shift register $SR_k$ is in the set-state, and the power consumption slightly increases.

Seventh Embodiment

The seventh embodiment shows an example in which the sixth embodiment is applied to a shift register capable of changing a shift direction.

FIG. 34 is a circuit diagram showing the unit shift register $SR_k$ according to the seventh embodiment. This unit shift register $SR_k$ is based on the circuit of FIG. 24, and is arranged with the switching circuit 24 for switching the shift direction of the signal. In FIG. 34, the switching circuit 24 having the same configuration as that shown in FIG. 21 (second modification of the fourth embodiment) is used.

In FIG. 24, the gate of the transistor Q12 and the current electrode of the transistor Q30 are connected to the input terminal IN, but in this modification, the gate of the transistor Q12 and the current electrode of the transistor Q30 are connected to the node N8, i.e., one of the output, ends of the switching circuit 24. In FIG. 24, the gate of the transistor Q14 is connected to the reset terminal RST, but in this modification, the gate of the transistor Q14 is connected to the node N9, i.e., the other of the input ends of the switching circuit 24.

As explained in the second modification of the fourth embodiment, during the normal-direction shift (in which the first voltage signal Vn is at the H level, and the second voltage signal Vr is at the L level), this switching circuit 24 supplies to the node N8 the output signal of preceding stage $G_{k-1}$ input to the first input terminal IN1, and supplies to the node N9 the output signal of subsequent stage $G_{k+1}$ input to the second input terminal IN2. Therefore, the unit shift register $SR_k$ of FIG. 34 is equivalent to that of FIG. 24, and can perform the normal-direction shift.

During the reverse-direction shift (in which the first voltage signal Vn is at the L level, and the second voltage signal Vr is at the H level), the switching circuit 24 supplies to the node N9 the output signal of preceding stage $G_{k-1}$ input to the first input terminal IN1, and supplies to the node N8 the output signal of subsequent stage $G_{k+1}$ input to the second input terminal IN2. In this case, the unit shift register $SR_k$ of FIG. 34 attains the set-state in accordance with activation of the output signal of subsequent stage $G_{k+1}$, and attains the reset state in accordance with activation of the output signal of preceding stage $G_{k-1}$, and therefore can perform the reverse-direction shift.

The switching circuit 24 of FIG. 34 is characterized in that even where the H level potential of the first voltage signal Vn and the second voltage signal Vr is less than VDD+Vth, the switching circuit 24 allows the transistors Q27n and Q27r to operate in the non-saturated region. Therefore, the switching circuit 24 shown in FIG. 19 may be used when the H level potential of the first and second voltage signals Vn and Vr is more than VDD+Vth or the transistors Q27n and Q27r can operate in the saturated region.

In FIG. 34, the example has been shown in which the switching circuit 24 is applied to the circuit of FIG. 24, but it is to be understood that the switching circuit 24 can also be applied to the circuit according to the first to eleventh modification of the sixth embodiment.

[First Modification]

FIG. 35 is a circuit diagram showing the unit shift register $SR_k$ according to the first modification of the seventh embodiment. This unit shift register $SR_k$ is based on the circuit of FIG. 34, and is configured such that the transistor Q27n of the switching circuit 24 is replaced with transistors Q28n and Q29n, and that the transistor Q27r is replaced with transistors Q28r and Q29r.

As shown in FIG. 35, the transistor 28n has a gate connected to the first voltage signal terminal T1, and is connected between the node N10 (the gate of the transistor Q25n) and the second power supply terminal S2. The transistor 29n has a gate connected to the second voltage signal terminal T2, and is connected between the node N10 and the first power supply terminal S1.

The transistor Q28r has a gate connected to the first voltage signal terminal T1, and is connected between the node N11 (the gate of the transistor Q25r) and the second power supply terminal S2. The transistor Q29r has a gate connected to the second voltage signal terminal T2, and is connected between the node N11 and the first power supply terminal S1.

The operation of the switching circuit 24 of FIG. 35 will be hereinafter described. During the normal-direction shift (in which the first voltage signal Vn is at the H level, and the second voltage signal Vr is at the L level), the transistor Q28n charges the node N10 to the H level, and the transistor Q29r discharges the node N11 to the L level, so that the transistor Q25n attains the on-state, and the transistor Q25r attains the off-state. Furthermore, the transistor Q26n attains the on-state, and the transistor Q26r attains the off-state. Therefore, the output signal of preceding stage $G_{k-1}$ input to the first input terminal IN1 is supplied to the node N8, and the output signal of subsequent stage $G_{k+1}$ input to the second input terminal IN2 is supplied to the node N9. Therefore, the unit shift register $SR_k$ of FIG. 35 is equivalent to that of FIG. 24, and can perform the normal-direction shift.

When the output signal of preceding stage $G_{k-1}$ rises, the potential of the node N10 is increased with the coupling via the capacitance between the gate and channel of the transistor Q25n. At this moment, the transistor Q28n is off, and therefore, the level of the node N10 increases to a level high enough to allow the transistor Q25n to operate in the non-saturated region.

During the reverse-direction shift (in which the first voltage signal Vn is at the L level, and the second voltage signal Vr is at the H level), the transistor Q29n discharges the node N10 to the L level, and the transistor Q28r charges the node N11 to the H level, so that the transistor Q25n attains the off-state, and the transistor Q25r attains the on-state. Furthermore, the transistor Q26n attains the off-state, and the transistor Q26r attains the on-state. Therefore, the output signal of preceding stage $G_{k-1}$ input to the first input terminal IN1 is supplied to the node N9, and the output signal of subsequent stage $G_{k+1}$ input to the second input terminal IN2 is supplied to the node N8. As a result, the unit shift register $SR_k$ can perform the reverse-direction shift.

When the output signal of subsequent stage $G_{k+1}$ rises, the potential of the node N11 is increased with the coupling via the capacitance between the gate and channel of the transistor Q25r. At this moment, the transistor Q29r is off, and therefore, the level of the node N11 increases to a level high enough to allow the transistor Q25r to operate in the saturated region.

As described above, the switching circuit 24 of FIG. 35 is characterized in that, even where the H level potential of the first voltage signal Vn and the second voltage signal Vr is less than VDD+Vth, the switching circuit 24 allows the transistors Q25n and Q25r to operate in the non-saturated region, in the same manner as that of FIG. 21.

The switching circuit 24 according to this modification can also be used as the switching circuit 24 in the fourth embodiment

[Second Modification]

Figure 36:
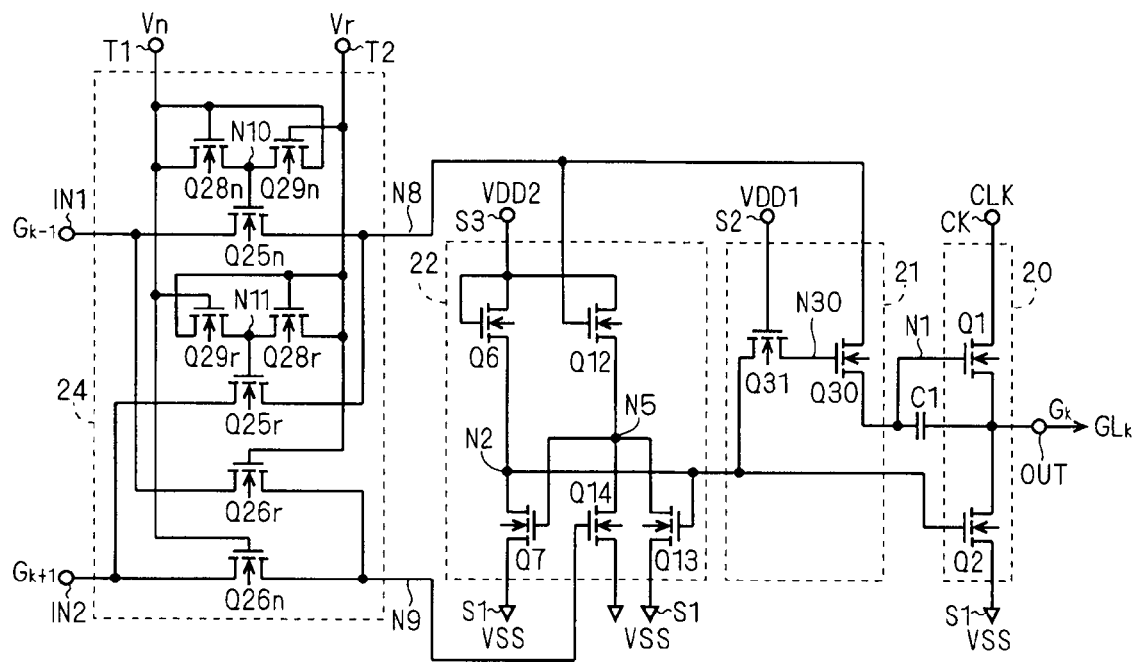
FIG. 36 is a circuit diagram showing a unit shift register according to the second modification of the seventh embodiment.

FIG. 36 is a circuit diagram showing the unit shift register $SR_k$ according to the second modification of the seventh embodiment. This unit shift register $SR_k$ is based on the circuit of FIG. 35, and is different in the configuration of connections among the transistors Q28n, Q28r, Q29n and Q29r.

As shown in FIG. 36, in this modification, the drain of the transistor Q28n and the source of the transistor Q29n are connected to the first voltage signal terminal T1. The drain of the transistor Q28r and the source of the transistor Q29r are connected to the second voltage signal terminal T2.

The switching circuit 24 configured as described above can operate in the same manner as the circuit of FIG. 35. Furthermore, this switching circuit 24 does not need to be supplied with the high power supply potential VDD1 and the low power supply potential VDD2, and therefore, has an advantage in that the layout can be easily designed.

Eighth Embodiment

In the unit shift register $SR_k$ according to the seventh embodiment (FIG. 34 to FIG. 36), the node N1 is charged by the series circuit of the transistors Q25n and Q30 (during normal-direction shift) or the series circuit of the transistors Q25r and Q30 (during reverse-direction shift), and therefore, the charging rate is less than that of the unit shift register $SR_k$ of FIG. 24. The unit shift register according to the seventh embodiment needs to have a wider gate width (approximately twice as wide as that in FIG. 24) of each of the transistors Q25n, Q25r and Q30 in order to obtain the same charging rate of the node N1 as the circuit of FIG. 24, but the wider gate width increases the size of the circuit. The eighth embodiment suggests the unit shift register $SR_k$ capable of changing the shift direction, suppressing the increase of the circuit size, and suppressing the decrease of the charging rate of the node N1.

Figure 39:
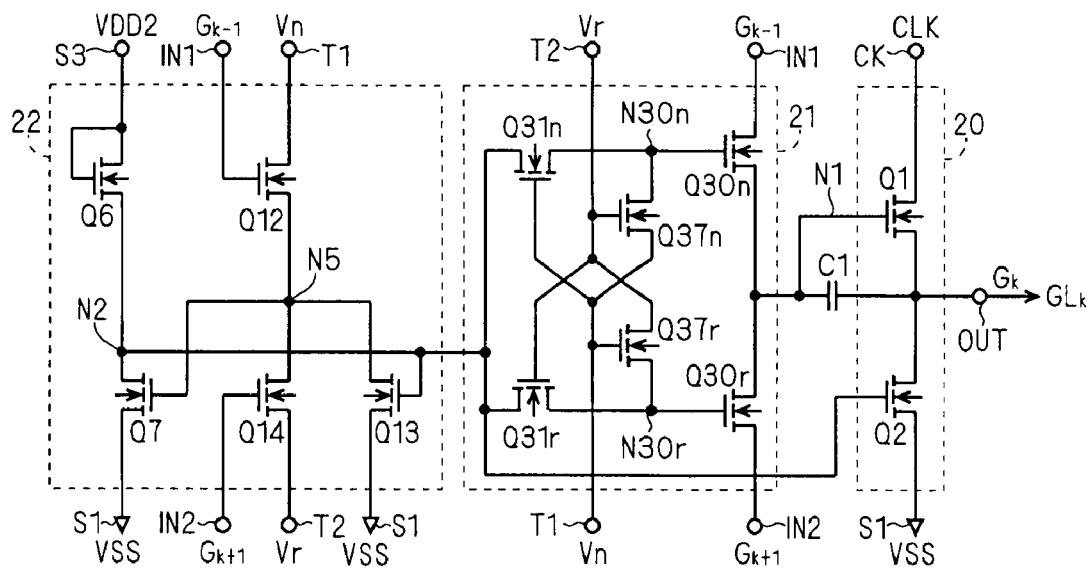
FIG. 39 is a circuit diagram showing a unit shift register according to the eighth embodiment.

FIG. 39 is a circuit diagram showing the unit shift register $SR_k$ according to the eighth embodiment. The unit shift register $SR_k$ includes the first and second input terminals IN1 and IN2 respectively receiving the output signal of preceding stage $G_{k-1}$ and the output signal of subsequent stage $G_{k+1}$ and the first and second voltage signal terminals T1 and T2 respectively receiving the first and second voltage signals Vn and Vr which control the shift direction.

In the unit shift register $SR_k$ of FIG. 39, the output circuit 20 has the same configuration as FIG. 24. Specifically, the output circuit 20 has a transistor Q1 for supplying the clock signal CLK to the output terminal OUT and a transistor Q2 for discharging the output terminal OUT in the non-selection period.

In the same manner as in FIG. 24, the pull-down driving circuit 22 includes the inverter constituted by the transistors Q6 and Q7 and the input circuit having the transistors Q12 to Q14 for supplying appropriate signals to the input end of the inverter (node N5), but the configuration of the input circuit is different from that of FIG. 24. Specifically, in the unit shift register $SR_k$ of FIG. 39, the transistor Q12 is connected between the first voltage signal terminal T1 and the node N5, and the gate of the transistor Q12 is connected to the first input terminal IN1. The transistor Q14 is connected between the second voltage signal terminal T2 and the node N5, and the gate of the transistor Q14 is connected to the second input terminal IN2. In the same manner as in FIG. 24, the transistor Q13 is connected between the node N5 and the first power supply terminal S1, and the gate of the transistor Q13 is connected to the node N2. The transistors Q12 and Q14 are configured to have sufficiently smaller on-resistances than the transistor Q13.

Therefore, during the normal-direction shift (in which the first voltage signal Vn is at the H level, and the second voltage signal Vr is at the L level), this input circuit changes the node N5 to the H level in accordance with activation of the output signal of preceding stage $G_{k-1}$, and changes the node N5 to the L level in accordance with activation of the output signal of subsequent stage $G_{k+1}$. During the reverse-direction shift (in which the first voltage signal Vn is at the L level, and the second voltage signal Vr is at the H level), the input circuit changes the node N5 to the H level in accordance with activation of the output signal of subsequent stage $G_{k+1}$, and changes the node N5 to the L level in accordance with activation of the output signal of preceding stage $G_{k-1}$.

In the same manner as in FIG. 24, the gate of the transistor Q2 of the output circuit 20 is connected to the node N2, i.e., the output end of the inverter constituted by the transistors Q6 and Q7 (the output end of the pull-down driving circuit 22).

On the other hand, the pull-up driving circuit 21 includes transistors Q30n, Q30r, Q31n, Q31r, Q37n and Q37r. The transistor Q30n is connected between the first input terminal IN1 and the gate of the transistor Q1 (node N1). Where a node connected to the gate of the transistor Q30n is defined as "node N30n", the transistor Q31n is connected between the node N30n and the node N2, and the gate of the transistor Q31n is connected to the first voltage signal terminal T1. The transistor Q37n is connected between the node N30n and the first voltage signal terminal T1, and the gate of the transistor Q37n is connected to the second voltage signal terminal T2.

The transistor Q30r is connected between the second input terminal IN2 and the node N1. Where a node connected to the gate of the transistor Q30r is defined as "node N30r", the transistor Q31r is connected between the node N30r and the node N2, and the gate of the transistor Q31r is connected to the second voltage signal terminal T2. The transistor Q37r is connected between the node N30r and the second voltage signal terminal T2, and the gate of the transistor Q37r is connected to the first voltage signal terminal T1

During the normal-direction shift, the first voltage signal Vn is at the H level (VDD), and the second voltage signal Vr is at the L level (VSS). Therefore, in the pull-up driving circuit 21, the transistor Q31n is in the on-state, the transistor Q31r is in the off-state, the transistor Q37n is in the off-state, and the transistor Q37r is in the on-state. Since the transistor Q31n charges the node N30n to the H level (VDD−Vth), the transistor Q30n turns on. Furthermore, the node N30r is maintained at the L level (VSS) by the transistor Q37r in the on-state, and therefore, the transistor Q30r is maintained in the off-state.

In the pull-down driving circuit 22, the potential at the drain of the transistor Q12 (first voltage signal terminal T1) is VDD, and the potential at the source of the transistor Q14 (second voltage signal terminal T2) is VSS.

In this state, the unit shift register $SR_k$ of FIG. 39 is equivalent to the circuit of FIG. 24 (while the normal-direction shift is performed, the transistor Q30r is maintained in the off-state). Specifically, the transistors Q30n and Q31n respectively perform the same operations as the transistors Q30 and Q31 of FIG. 24, and the transistors Q30r and Q31r are maintained in the off-state. Therefore, the transistor Q30n serves as a first charging circuit for charging the node N1 in accordance with activation of the output signal of preceding stage $G_{k-1}$. Furthermore, the transistor Q31n serves as a first charging and discharging circuit for charging the node N30n before activation of the output signal of preceding stage $G_{k-1}$ and discharging the node N30n before deactivation of the output signal of preceding stage $G_{k-1}$.

Therefore, during the normal-direction shift, the unit shift register $SR_k$ attains the set-state (in which the transistor Q1 is in the on-state and the transistor Q2 is in the off-state) in accordance with activation of the output signal of preceding stage $G_{k-1}$ input to the first input terminal IN1, and attains the reset state (in which the transistor Q1 is in the off-state and the transistor Q2 is in the on-state) in accordance with activation of the output signal of subsequent stage $G_{k+1}$ input to the second input terminal IN2. Therefore, the unit shift register $SR_k$ serves as a unit shift register for performing the normal-direction shift.

During the reverse-direction shift, the first voltage signal Vn is at the L level (VSS), and the second voltage signal Vr is at the H level (VDD). Therefore, in the pull-up driving circuit 21, the transistor Q31n is in the off-state, the transistor Q31r is in the on-state, the transistor Q37n is in the on-state, and the transistor Q37r is in the off-state. Since the transistor Q31r charges the node N30r to the H level (VDD−Vth), the transistor Q30r turns on. Furthermore, the node N30n is maintained at the L level (VSS) by the transistor Q37n in the on-state, and therefore, the transistor Q30n is maintained in the off-state.

In the pull-down driving circuit 22, the potential at the drain of the transistor Q12 (first voltage signal terminal T1) is VSS, and the potential at the source of the transistor Q14 (second voltage signal terminal T2) is VDD.

In contrast to the normal-direction shift, the unit shift register $SR_k$ in this state causes the transistors Q30r and Q31r respectively perform the same operations as the transistors Q30 and Q31 of FIG. 24, and the transistors Q30n and Q31n are maintained in the off-state. In other words, the transistor Q30r serves as a second charging circuit for charging the node N1 in accordance with activation of the output signal of subsequent stage $G_{k+1}$. Furthermore, the transistor Q31r serves as a second charging and discharging circuit for charging the node N30r before activation of the output signal of subsequent stage $G_{k+1}$ and discharging the node N30r before deactivation of the output signal of subsequent stage $G_{k+1}$.

Therefore, during the reverse-direction shift, the unit shift register $SR_k$ attains the set-state (in which the transistor Q1 is in the on-state and the transistor Q2 is in the off-state) in accordance with activation of the output signal of subsequent stage $G_{k+1}$ input to the second input terminal IN2, and attains the reset state (in which the transistor Q1 is in the off-state and the transistor Q2 is in the on-state) in accordance with activation of the output signal of preceding stage $G_{k-1}$ input to the first input terminal IN1. Therefore, the unit shift register $SR_k$ serves as a unit shift register for performing the reverse-direction shift.

According to the unit shift register $SR_k$ according to the present embodiment, the node N1 is charged by a single transistor, i.e., the transistor Q30n (during the normal-direction shift) or the transistor Q30r (during the reverse-direction shift). Therefore, the charging rate thereof is faster than (i.e., is the same as that of the circuit of FIG. 24) the unit shift register $SR_k$ according to the seventh embodiment (FIG. 34 to FIG. 36).

The unit shift register $SR_k$ shifting in both directions can be made with fewer transistors than in the seventh embodiment. For example, the circuit of FIG. 34 (seventh embodiment) is made by adding the six transistors to the circuit of FIG. 24, but the circuit of FIG. 39 according to the present embodiment is made by adding only the three transistors to the circuit of FIG. 24. Furthermore, the charging rate of the node N1 does not decrease, and therefore, the transistors Q30n and Q30r do not need to have a wide gate width (i.e., may have the same gate width as the transistor Q30 of FIG. 24). Therefore, the size of the circuit does not increase.

[Modification]

FIG. 40 is a circuit diagram showing the unit shift register $SR_k$ according to the modification of the eighth embodiment. This unit shift register $SR_k$ is based on the circuit of FIG. 39, and is configured such that the sources of the transistors Q37n and Q37r are connected to the first power supply terminal S1 (low power supply potential VSS).

This configuration allows this unit shift register $SR_k$ to operate in the same manner as the circuit of FIG. 39. However, a connection wiring to the first power supply terminal S1 needs to be arranged in the pull-up driving circuit 21.

While the invention has been shown and described in detail, the foregoing description is in all aspects illustrative and not restrictive. It is therefore understood that numerous modifications and variations can be devised without departing from the scope of the invention.

What is claimed is:

1. A shift register circuit, comprising:
an input terminal;
an output terminal;
a clock terminal;
a first transistor for supplying to said output terminal a clock signal input to said clock terminal;
a second transistor for discharging said output terminal;
a pull-up driving circuit for driving said first transistor by charging and discharging a first node connected to a control electrode of said first transistor; and
a pull-down driving circuit for driving said second transistor by charging and discharging a second node connected to a control electrode of said second transistor,
wherein said pull-up driving circuit includes:
a third transistor for charging said first node in accordance with activation of an input signal input to said input terminal; and
a boosting unit for boosting, in accordance with the activation of said input signal, a third node being connected to a control electrode of said third transistor, so that a voltage of said third node becomes larger than an amplitude of said input signal, wherein said boosting unit includes:

a charging and discharging circuit for charging said third node before activation of said input signal and discharges said third node before deactivation of said input signal, and wherein the level of said third node is increased with a parasitic capacitance of said third transistor.

2. The shift register circuit according to claim 1, wherein the level of said third node is increased after a predetermined period of time passes since said charging and discharging circuit began to charge said third node.

3. The shift register circuit according to claim 1, wherein said third transistor is connected between said input terminal and said first node.

4. The shift register circuit according to claim 3, wherein said charging and discharging circuit is a fourth transistor connected between said third node and said second node, said fourth transistor having a control electrode connected to a predetermined power supply terminal.

5. The shift register circuit according to claim 4, wherein said pull-down driving circuit causes said second node to attain a deactivated level after a predetermined period of time passes since said input signal is activated.

6. The shift register circuit according to claim 3, wherein said pull-down driving circuit discharges said second node in accordance with activation of said input signal, and charges said second node in accordance with a reset signal input to a predetermined reset terminal.

* * * * *